US008841166B2

(12) United States Patent
Takahashi

(10) Patent No.: US 8,841,166 B2
(45) Date of Patent: Sep. 23, 2014

(54) MANUFACTURING METHOD OF SEMICONDUCTOR DEVICE, AND SEMICONDUCTOR DEVICE

(71) Applicant: Renesas Electronics Corporation, Kanagawa (JP)

(72) Inventor: Noriyuki Takahashi, Nanae (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/777,219

(22) Filed: Feb. 26, 2013

(65) Prior Publication Data

US 2013/0228908 A1 Sep. 5, 2013

(30) Foreign Application Priority Data

Mar. 2, 2012 (JP) ................................ 2012-046329

(51) Int. Cl.

*H01L 21/44* (2006.01)
*H01L 21/48* (2006.01)
*H01L 21/50* (2006.01)
*H01L 23/00* (2006.01)
*H01L 23/495* (2006.01)

(52) U.S. Cl.

CPC ..... *H01L 23/495* (2013.01); *H01L 2224/32245* (2013.01); *H01L 2224/73265* (2013.01); *H01L 2224/48091* (2013.01); *H01L 24/06* (2013.01); *H01L 24/01* (2013.01); *H01L 2224/48145* (2013.01); *H01L 2224/32145* (2013.01); *H01L 2224/49171* (2013.01); *H01L 2224/92247* (2013.01)

USPC .................... 438/106; 438/112; 257/E21.499

(58) Field of Classification Search

USPC ........................ 438/106, 111, 112, 123, 124; 257/E21.499

See application file for complete search history.

(56) References Cited

U.S. PATENT DOCUMENTS 6,963,125 B2 * 11/2005 Featherby et al. ............ 257/680

FOREIGN PATENT DOCUMENTS

JP 04-157757 A 5/1992
JP 2010-080931 A 4/2010

* cited by examiner

*Primary Examiner* — Hoai V Pham
(74) *Attorney, Agent, or Firm* — Mattingly & Malur, PC

(57) ABSTRACT

Provided is a resin sealed semiconductor device with improved reliability. After positioning a cap (lid) so as to cover semiconductor chips and wires, resin is supplied into a space formed by the cap, so that a sealing body is formed to cover the semiconductor chips and the wires. In the step of forming the sealing body, the resin is supplied from an opening formed at a corner of the cap in the planar view. The sealing body is exposed at the corner of the cap, so that the exposed part of the sealing body can be kept away from the wires.

12 Claims, 47 Drawing Sheets

MANUFACTURING METHOD OF SEMICONDUCTOR DEVICE, AND SEMICONDUCTOR DEVICE

CROSS-REFERENCE TO RELATED APPLICATIONS

The disclosure of Japanese Patent Application No. 2012-046329 filed on Mar. 2, 2012 including the specification, drawings and abstract is incorporated herein by reference in its entirety.

BACKGROUND

The present invention relates to semiconductor devices, and manufacturing techniques therefor, and more specifically, to a technique effectively applied to a semiconductor device with a semiconductor chip covered with a sealing body made of rubber.

Japanese Unexamined Patent Publication No. Hei4(1992)-157757 (Patent Document 1) discloses that a semiconductor chip mounted over a printed board is covered with an aluminum cap, and that resin is then charged from the center of the cap.

Japanese Unexamined Patent Publication No. 2010-80931 (Patent Document 2) discloses that electronic components are arranged in an internal space formed by a heatsink and a lid, and that resin is then filled into the internal space.

RELATED ART DOCUMENTS

Patent Documents

[Patent Document 1]

Japanese Unexamined Patent Publication No. Hei 4 (1992)-157757

[Patent Document 2]

Japanese Unexamined Patent Publication No. 2010-80931

SUMMARY

The inventors of the present application have studied about the so-called resin sealed semiconductor device (semiconductor package) which includes a semiconductor chip sealed with resin, and found the following problems. That is, when the resin sealed semiconductor device is exposed to high-temperature atmosphere (for example, at a temperature of about 175 to 250° C.), a resin sealing body made of resin has its surface degraded, which reduces the reliability of the semiconductor device.

Preferred embodiments of the invention disclosed in the present application have been made in view of the forgoing problems, and it is an object of the invention to provide a technique for improving the reliability of the semiconductor device.

Other problems to be solved by the present invention, and new features of the present invention will become apparent from the description and accompanying drawings of the present specification.

The outline of representative embodiments of the invention disclosed in the present application will be briefly described below.

That is, in a manufacturing method of a semiconductor device according to one aspect of the present application, after positioning a lid so as to cover semiconductor chips and wires, resin is supplied into a space formed by the lid, so that a sealing body is formed to cover the semiconductor chips and the wires. In the step of forming the sealing body, the resin is supplied from a corner of the lid in the planar view.

In a manufacturing method of a semiconductor device according to another aspect of the present application, after forming a sealing body for sealing semiconductor chips and wires, a lid is arranged to cover the sealing body. The lid includes a first lid portion, and a second lid portion for forming a space for accommodating therein the sealing body by being superimposed over the first lid portion. A bonding portion arranged at the peripheries of the first lid portion and second lid portion is sealed over its entire periphery in the planar view.

The effects made by the representative embodiments of the invention disclosed in the present application will be briefly described as follows.

The representative embodiments of the invention disclosed in the present application can improve the reliability of the semiconductor device.

Figure 1:
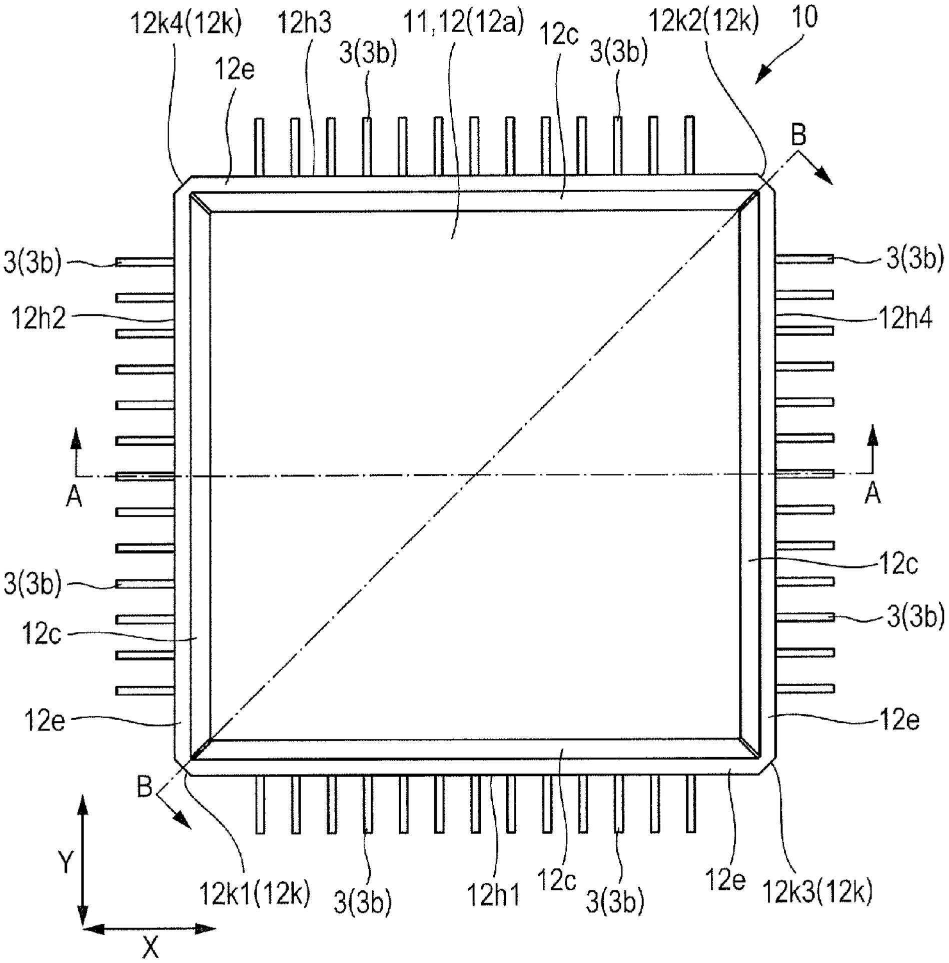
FIG. 1 is a plan view showing an upper surface of a semiconductor device according to one embodiment of the invention.

DETAILED DESCRIPTION (Explanation of Description Format, Basic Terms, and Usage in Present Application)

In the present application, the following preferred embodiments may be described below by being divided into a plurality of sections or the like for convenience, if necessary, which are not independent from each other unless otherwise specified. Regardless of the order of the description of these sections, the sections indicate respective parts in a single example. Alternatively, one of the sections may be the details of apart of the other, or a modified example of a part or all of the other. In principle, parts having the same function will not be described repeatedly. Respective components of the preferred embodiments are not essential unless otherwise specified, except when limiting the number of the components in theory, and except when considered not to be definitely so from the context thereof.

Similarly, in the description of the embodiments, the term "X formed of A" or the like as to material, composition, and the like does not exclude elements other than the element "A", unless otherwise specified and except when considered not to be definitely so from the context. For example, as to the component, the above term means "X containing A as a principal component". For example, the term "silicon member" is not limited to pure silicon, and may obviously include a SiGe (silicon-germanium) alloy, or a multi-component alloy containing silicon as a principal component, and another additive. The term "gold plating", "Cu layer", or "nickel plating" is not limited to pure one, but include a member containing gold, Cu, or nickel as a principal component unless otherwise specified.

Even when referring to a specific numeral value or amount, the number of elements or the like may be greater than, or less than the specific numeral number, unless otherwise specified, except when limited to the specific number in theory, and except when considered not to be definitely so from the context.

In each drawing of the embodiments, the same or like parts are indicated by the same or similar reference character or number, and its description will not be repeated in principle.

In the accompanying drawings, even a cross-sectional view may omit hatching in some cases if the hatching possibly makes the sectional view complicated, or when a cavity or hole is easy to discriminate. In this context, the outline of a hole closed in a planar manner with respect to the background may be omitted when clearly seen from the description or the like. Further, in order to represent a part which is not a cavity or hole, or in order to clearly represent a boundary between regions, a hatching or dot pattern is sometimes given even when the figure is not a cross-sectional view.

First Embodiment

<Structure of Semiconductor Device>

Figure 2:
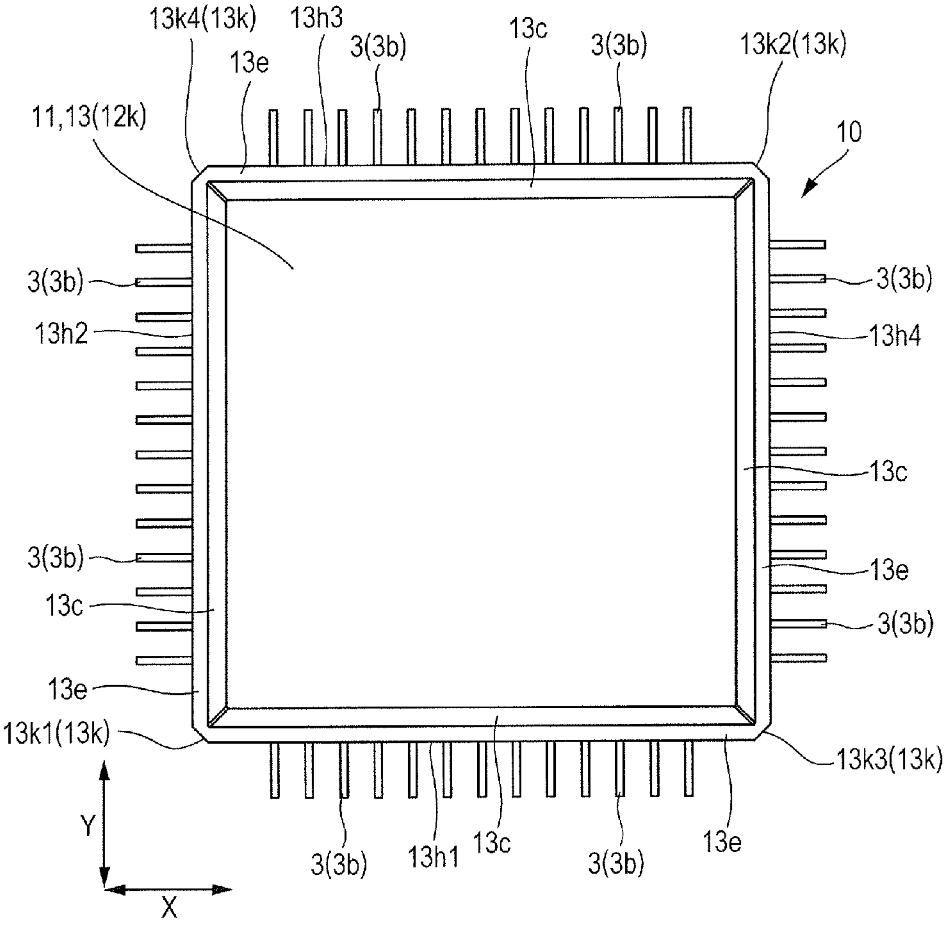
FIG. 2 is a plan view showing a lower surface of the semiconductor device shown in FIG. 1.
Figure 3:
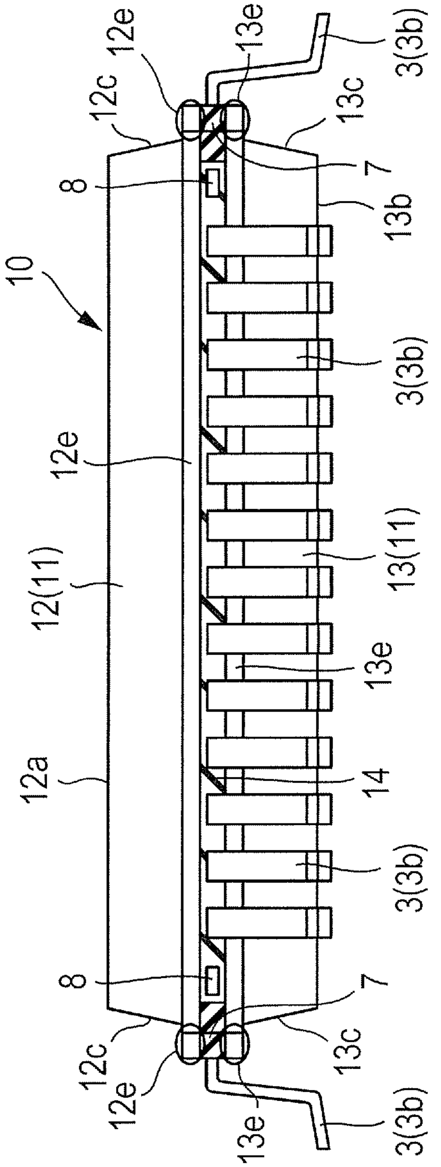
FIG. 3 is a side view of the semiconductor device shown in FIG. 1.
Figure 4:
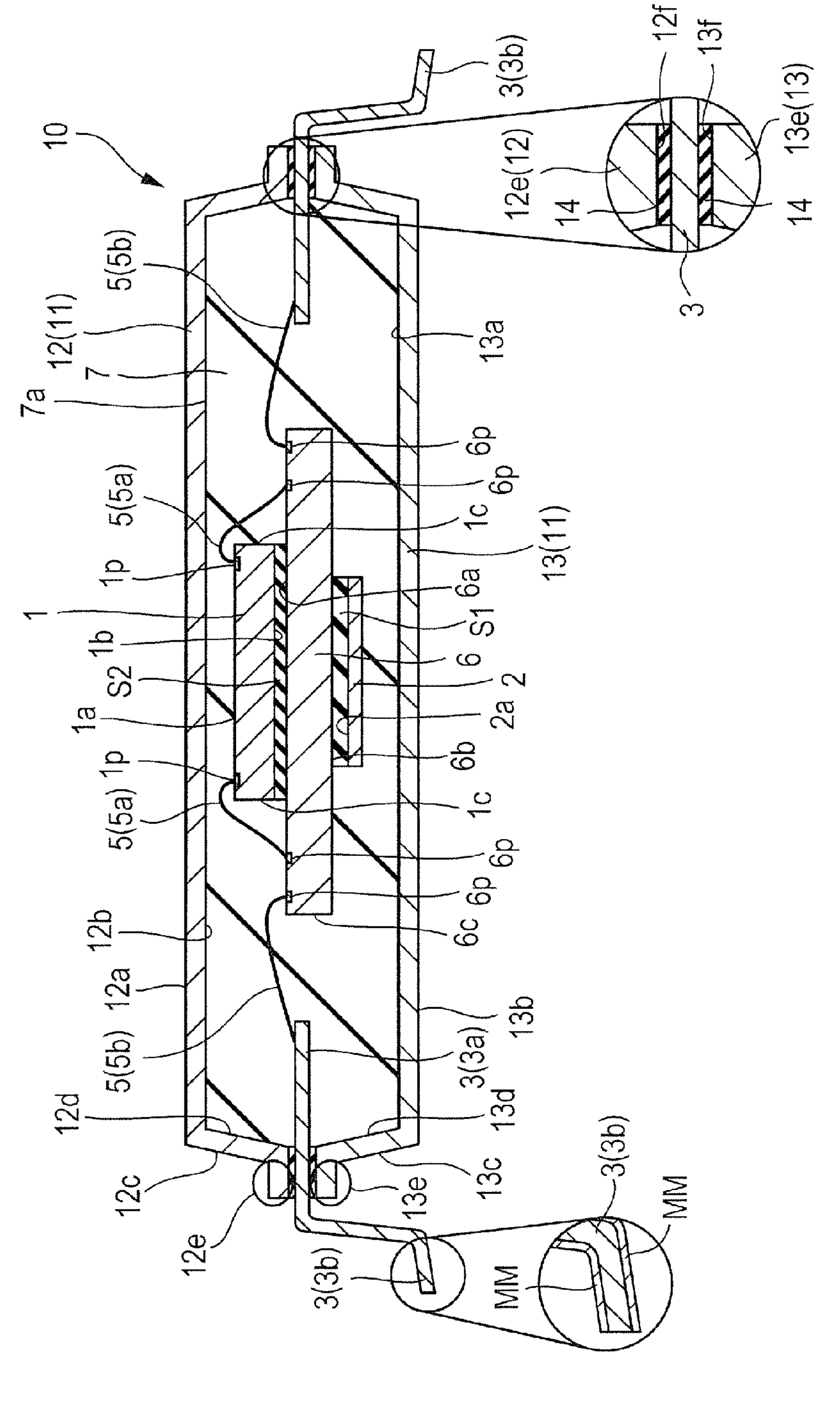
FIG. 4 is a cross-sectional view taken along the line A-A of FIG. 1.
Figure 5:
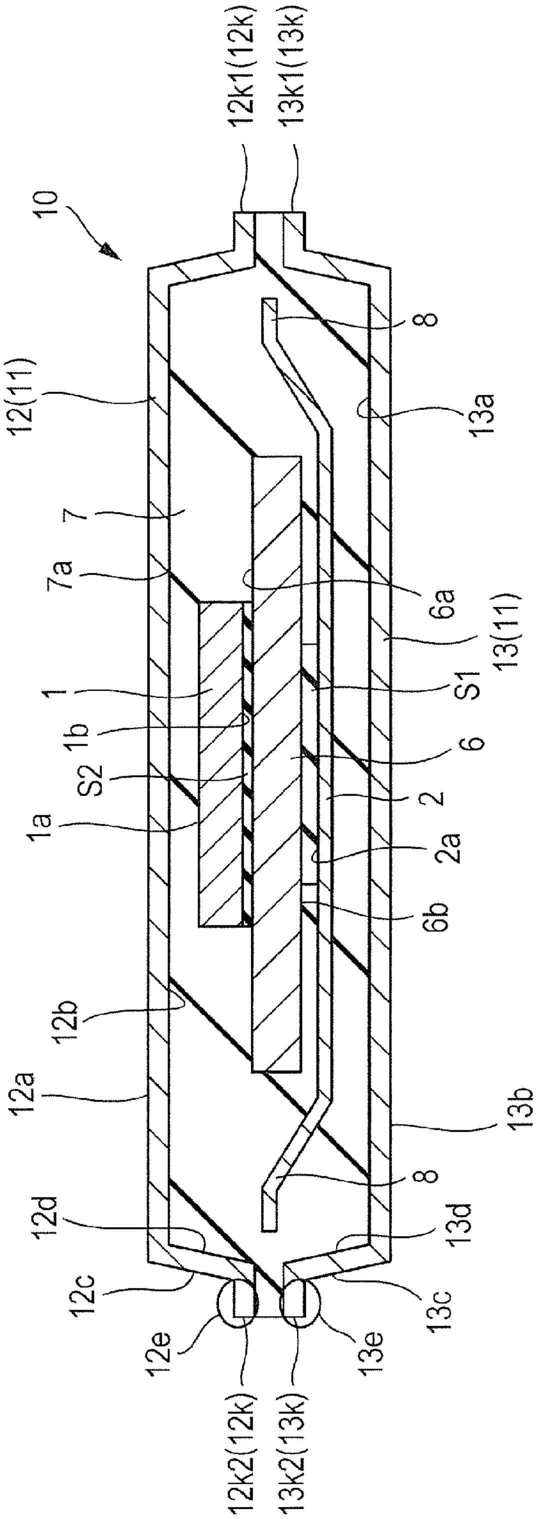
FIG. 5 is a cross-sectional view taken along the line B-B of FIG. 1.
Figure 6:
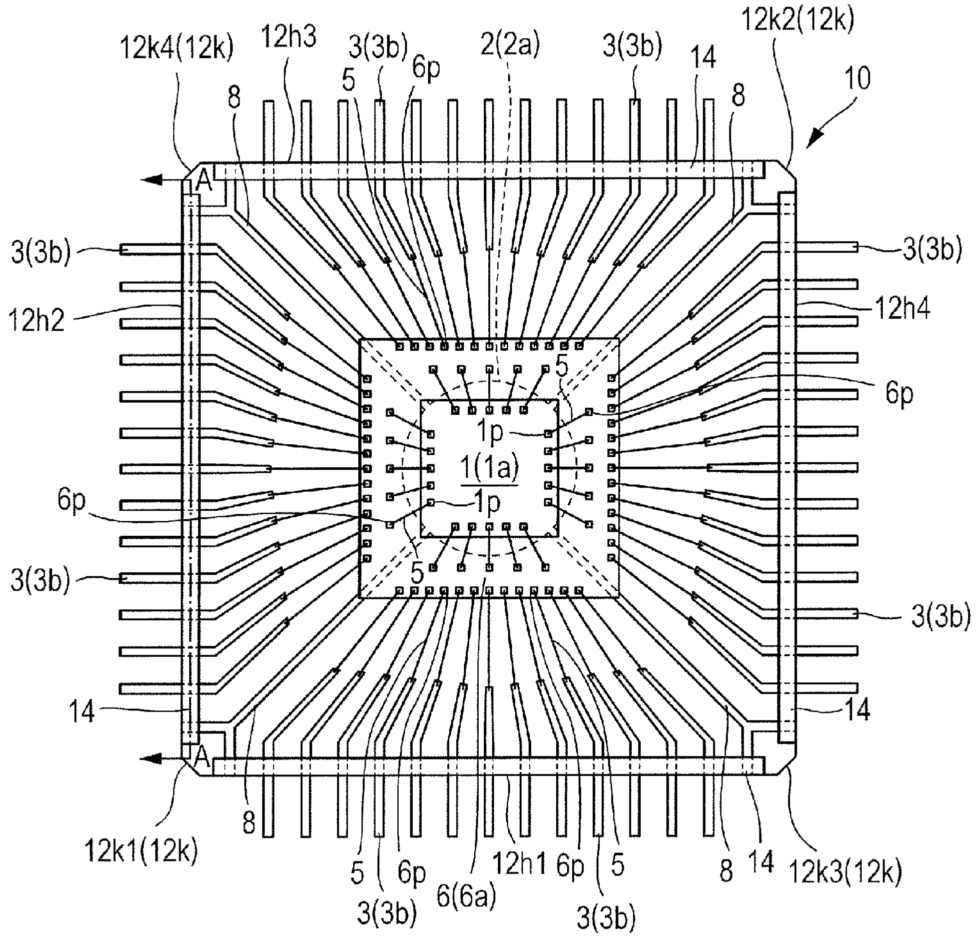
FIG. 6 is a transparent plan view showing an internal structure through an upper cap of the semiconductor device shown in FIG. 1.
Figure 7:
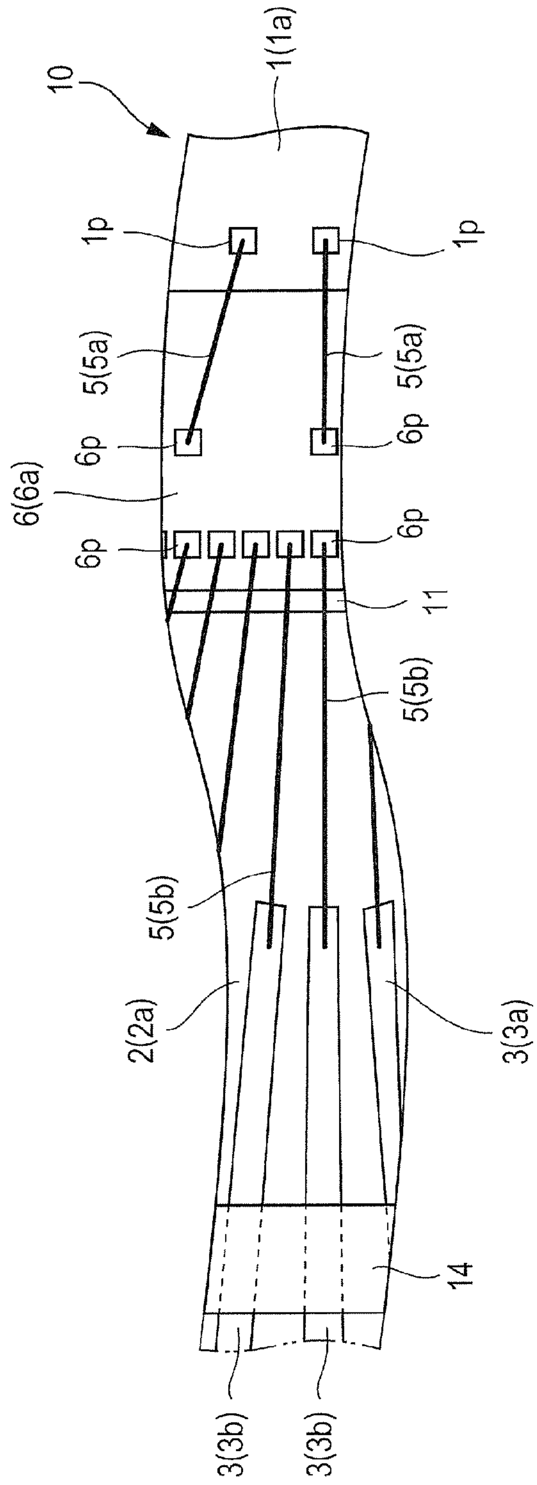
FIG. 7 is an enlarged plan view showing a part of the structure shown in FIG. 6.
Figure 8:
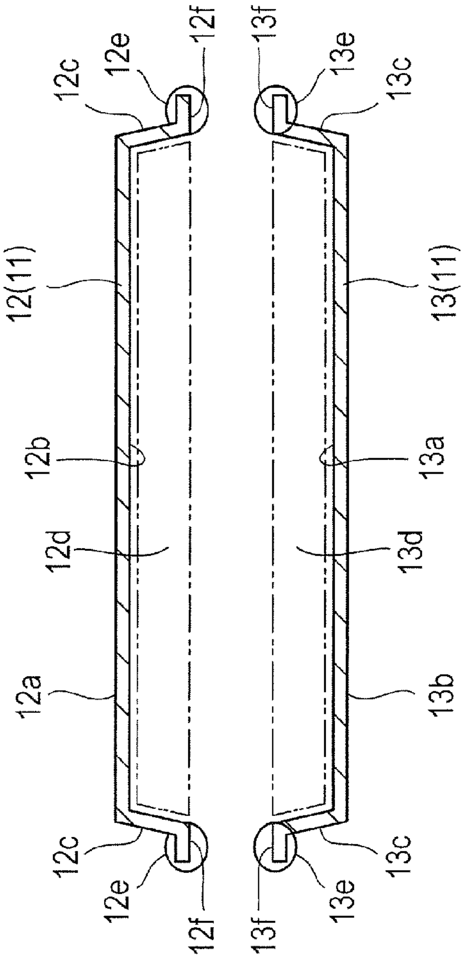
FIG. 8 is a cross-sectional view showing the cap shown in FIG. 4 or 5.
Figure 9:
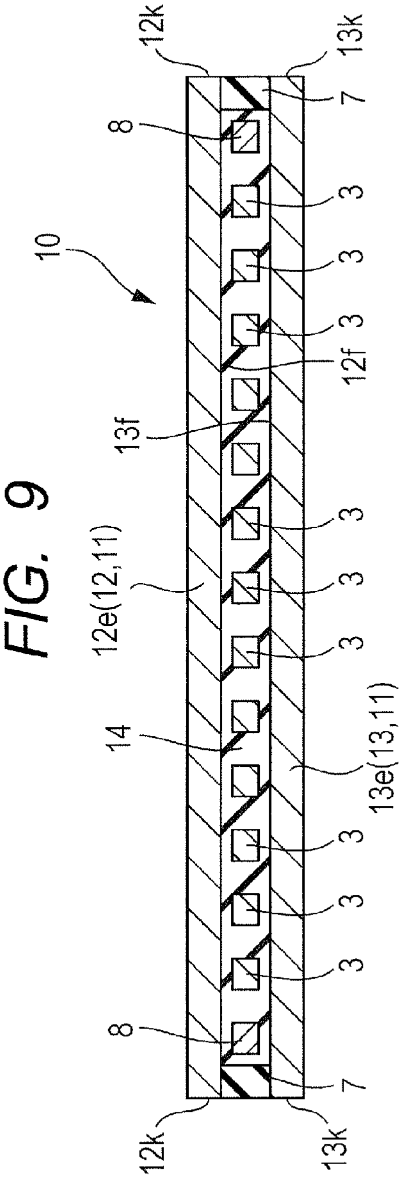
FIG. 9 is a cross-sectional view taken along the line A-A of FIG. 6.

First, the structure of a semiconductor device in this embodiment will be described below. FIG. 1 shows a plan view of an upper surface of a semiconductor device in this embodiment. FIG. 2 shows a plan view of a lower surface of the semiconductor device shown in FIG. 1. FIG. 3 is a side view of the semiconductor device shown in FIG. 1. FIG. 4 is a cross-sectional view taken along the line A-A of FIG. 1. FIG. 5 is a cross-sectional view taken along the line B-B of FIG. 1. FIG. 6 shows a transparent plan view of an internal structure through an upper cap of the semiconductor device shown in FIG. 1. FIG. 7 shows an enlarged plan view of a part of the structure shown in FIG. 6. FIG. 8 shows a cross-sectional view of the structure shown in FIG. 4 or 5. FIG. 9 is a cross-sectional view taken along the line A-A of FIG. 6.

A semiconductor device 10 of this embodiment is a lead frame type semiconductor package with a semiconductor chip mounted over a chip mounting portion of a lead frame used as a base. In this embodiment, as shown in FIGS. 1 and 2, the quad flat package (QFP) semiconductor device 10 will be described below by way of example of the lead frame type semiconductor device. The package of the semiconductor device 10 has a quadrate external appearance in a planar view, and has a plurality of leads arranged at its four sides.

<External Appearance>

First, the external appearance of the semiconductor device 10 will be described below. An upper cap (lid) 12 on the upper surface side shown in FIG. 1 has an outer surface (upper surface) 12*a*, and sides 12*c* arranged around the outer surface 12*a*, and thus has a quadrangle (quadrilateral) in the planar view. The upper cap 12 includes four sides (four main sides) at its periphery to be described later. That is, the upper cap 12 includes a side (main side) 12*h*1 extending in the direction X, a side (main side) 12*h*2 extending in the direction Y and intersecting (perpendicular to) the side 12*h*1, a side (main side) 12*h*3 opposed to the side 12*h*1, and a side 12*h*4 opposed to the side (main side) 12*h*2. The upper cap 12 has four corners 12*k* positioned in regions where adjacent ones of the sides 12*h*1, 12*h*2, 12*h*3, and 12*h*4 intersect each other. Specifically, the upper cap 12 has a corner 12*k*1 positioned in the region where the side 12*h*1 intersects the side 12*h*2. The upper cap 12 has the corner 12*k*2 positioned in the region where the side 12*h*3 intersects the side 12*h*4. The upper cap 12 has the corner 12*k*3 positioned in the region where the side 12*h*1 intersects the side 12*h*4. The upper cap 12 has the corner 12*k*4 positioned in the region where the side 12*h*2 intersects the side 12*h*3.

Each of the corners 12*k* of the upper cap 12 covers an intersection point of two arbitrary intersecting sides (two main sides) among four sides (four main sides) of the upper cap 12, and its surroundings. Strictly, as shown in FIG. 1, each corner 12*k* of the upper cap 12 has its part chamfered, and thus the intersection of the two main sides is positioned outside the corresponding corner 12*k* of the upper cap 12. The chamfered part, however, is small enough as compared to the length of the main side. In the present application, the center of the chamfered part is regarded as the corner of the upper cap 12 in the description. That is, in the present application, when the region where two arbitrary sides (two main sides) among the four sides (four main sides) of the upper cap 12 intersect is chamfered, the chamfered part corresponds to the corner 12*k*. When the region is not chamfered, the intersection of the two arbitrary (two main sides) corresponds to the corner 12*k*. The term "corner of the cap" as used in the present application is used to have the same meanings and contents as described above, especially, except when the term is specified to have different meanings and contents.

As shown in FIG. 2, a lower cap (lid) 13 on the lower surface (mounting surface) side has an outer surface (lower surface) 13*b*, and sides 13*c* arranged around the outer surface 13*b*, and thus has a quadrangle (quadrilateral) in the planar view. The lower cap 13 has four sides (four main sides) at its periphery to be described later. That is, the lower cap 13 includes a side (main side) 13*h*1 extending in the direction X, a side (main side) 13*h*2 extending in the direction Y and intersecting (perpendicular to) the side 13*h*1, a side (main side) 13*h*3 opposed to the side 13*h*1, and a side 13*h*4 opposed to the side (main side) 13*h*2. The lower cap 13 has four corners 13*k* positioned in regions where adjacent ones of the sides 13*h*1, 13*h*2, 13*h*3, and 13*h*4 intersect each other. Specifically, the lower cap 13 has a corner 13*k*1 positioned in the region where the side 13*h*1 intersects the side 13*h*2. The lower cap 13 has a corner 13*k*2 positioned in the region where the side 13*h*3 intersects the side 13*h*4. The lower cap 13 has a corner 13*k*3 positioned in the region where the side 13*h*1 intersects the side 13*h*4. The lower cap 13 has the corner 13*k*4 positioned in the region where the side 13*h*2 intersects the side 13*h*3. The definition of the corner 13*k* of the lower cap 13 is the same as that described as to the corner 12*k* of the upper cap 12, and thus its repeated description will be omitted.

As shown in FIG. 3, the sides 12*c* of the upper cap 12 and the sides 13*c* of the lower cap 13 are respectively inclined surfaces. The upper cap 12 and the lower cap 13 have flanges (protrusions, bonding regions) 12*e* and 13*e* protruding outward from the sides 12*c* and 13*c* (toward the periphery of the sides 12*c* ad 13*c*). As shown in FIGS. 1 and 2, the flanges 12*e* and 13*e* are formed at the peripheries of the upper cap 12 and the lower cap 13 so as to surround the sides 12*c* and 13*c*, respectively. In the semiconductor device 10, the inner surface (lower surface, or bonding surface 12*f* shown in FIG. 4) of the flange 12*e* of the upper cap 12 is opposed to the inner surface (upper surface, or bonding surface 13*f* shown in FIG. 4) of the flange 13*e* of the lower cap 13, and the respective flanges 12*e* and 13*e* are bonded to leads 3 via a sealant 14, which forms a cap (lid, member) 11 covering the sealing body 7.

As shown in FIGS. 1 and 2, in the semiconductor device 1, a plurality of leads 3 are arranged along each side (each main side) of the cap 11. Specifically, the leads 3 (a group of leads) are arranged along each of the sides 12*h*1, 12*h*2, 12*h*3, and 12*h*4 of the upper cap 12 shown in FIG. 1. In other words, the leads 3 (a group of leads) are arranged along each of the sides 13*h*1, 13*h*2, 13*h*3, and 13*h*4 of the lower cap 13 shown in FIG. 2. As shown in FIG. 3, a suspension lead 8 is arranged at each end of the lead group arranged along each side.

The leads 3 (and suspension leads 8) are made of metal. In this embodiment, for example, each of the lead and the suspension lead is comprised of a laminated metal film which includes a metal film (not shown) of nickel (Ni) or nickel-palladium formed over a surface of a substrate made of copper (Cu) or a copper alloy. The term "nickel-palladium" as used herein means a metal film made of an alloy of nickel (Ni) and palladium (Pd). In the following, the alloy of the nickel and palladium is defined as "nickel-palladium or Ni/Pd", and a metal film (plating film) made of the nickel-palladium is defined as a nickel-palladium film.

As shown in FIG. 4, the leads 3 protrude outward from between the upper cap 12 and the lower cap 13 to expose from the cap 11. Exposed parts (outer leads 3*b*) of the leads 3 are formed (bent) outside the cap 11 in a gull-wing shape toward the lower cap 13. The position of the lower end of each lead 3 is located at a lower level than the position of the outer surface 13*b* of the lower cap 13.

The exposed part (outer lead 3*b*) from the cap 11 of the lead 3 is provided with the metal film MM to cover the lower surface of the above substrate. The metal film MM is, for example, a metal film that improves the wettability of solder serving as a bonding material in joining the lead 3 to a terminal (not shown) on the mounting substrate side. The metal film MM is comprised of the above nickel (Ni), or nickel-palladium (Ni/Pd). The nickel film or nickel-palladium film serves as an adhesion improving film for improving the adhesion between the sealing body 7 and the die pad 2, lead 3, or cap 11. For this reason, the nickel film or nickel-palladium film does not need to be formed up to the exposed part (outer lead 3*b*) from the cap 11 of the lead 3. However, in order to improve the solder wettability, it is necessary to additionally form the metal film (exterior plating film) MM at the outer lead 3*b* of each lead 3.

<Internal Structure>

Next, the internal structure of the semiconductor device 10 will be described below. As shown in FIG. 4, the semiconductor device 10 includes the semiconductor chip 1, a semiconductor chip 6, a die pad (chip mounting portion) 2, and the leads 3 arranged around the die pad 2. The semiconductor device 10 includes a plurality of wires 5 for electrically connecting the semiconductor chip 1 with the leads 3. The semiconductor device 10 also includes a sealing body 7 for sealing the semiconductor chips 1 and 6 and the wires 5, and a cap (lid) 11 covering the sealing body 7.

As shown in FIG. 4, the semiconductor chip 1 has a front surface (main surface, upper surface) 1*a*, aback surface (main surface, lower surface) 1*b* opposite to the front surface 1*a*, and sides 1*c* positioned between the front surface 1*a* and the back surface 1*b*. A plurality of pads (electrodes, bonding pads) 1*p* serving as an electrode of the semiconductor chip 1 is formed over the front surface 1*a*. The pads 1*p* are electrically connected to a plurality of semiconductor elements (not shown) formed over the main surface (semiconductor element formation surface) of the semiconductor substrate (not shown), thereby forming an electric circuit (not shown). The semiconductor chip 6 has a front surface (main surface, upper surface) 6*a*, a back surface (main surface, lower surface) 6*b* opposite to the front surface 6*a*, and sides 6*c* positioned between the front surface 6*a* and the back surface 6*b*. A plurality of pads 6*p* serving as an electrode of the semiconductor chip 6 are formed over the front surface 6*a*. The pads 6*p* are electrically connected to a plurality of semiconductor elements (not shown) formed over the main surface (semiconductor element formation surface) of the semiconductor substrate (not shown), thereby forming an electric circuit (not shown).

In an example shown in FIGS. 4 to 7, the semiconductor device 10 has the semiconductor chips (semiconductor chips 1 and 6), and the semiconductor chip 1 is mounted over the front surface 6*a* of the semiconductor chip 6. In other words, the semiconductor device 10 is one having a plurality of semiconductor chips laminated and mounted. The semiconductor chip 6 is mounted over the die pad 2 via an adhesive (die bond material) S1. The semiconductor chip 1 is mounted over the front surface 6*a* of the semiconductor chip 6 via another adhesive (die bond material) S2. As shown in FIG. 4, the semiconductor chip 6 is mounted by the so-called face up mounting such that the back surface 6*b* is opposed to the upper surface 2*a* of the die pad 2. The semiconductor chip 1 is mounted by the so-called face up mounting such that the back surface 1*b* is opposed to the front surface 6*a* of the semiconductor chip 6.

The adhesive S1 is not limited to a specific one as long as it can fix the semiconductor chip 6 over the upper surface 2*a* of the die pad 2. In this embodiment, for example, the semiconductor chip 6 is bonded by applying a paste-like resin adhesive made of thermosetting epoxy resin, and is then thermoset to be fixed. The adhesive S2 is a member for fixing the semiconductor chip 1 over the semiconductor chip 6. A part of the adhesive S2 might be attached to the pad 6*p* of the semiconductor chip 6, which makes it difficult to connect the wires 5 to the pad 6*p* in a wire bonding step to be described later. To prevent this, the adhesive S2 is preferably a film-like adhesive. The film-like adhesive is preferable due to the poor flexibility because it does not expand outward from a position where the film-like adhesive is located as compared to a paste-like adhesive. The film-like adhesive is comprised of, for example, an adhesive layer formed over a substrate, and called "die attach film (DAF)". Adhesive films for general use in laminating one semiconductor chip over another semiconductor chip can be used.

In this way, an example of the structure with a plurality of semiconductor chips mounted in one package (semiconductor device) is a semiconductor device called a system in package (SIP). In the semiconductor device having the SIP structure, the semiconductor chips are electrically connected together to form the system. For example, a memory circuit is formed in the semiconductor chip 1 shown in FIG. 6, and a control circuit for controlling the memory circuit of the semiconductor chip 1 is formed in the semiconductor chip 6. In this way, the semiconductor chips are mounted in one package to form the system, which can reduce the mounting area. The number of semiconductor chips is not limited to two. In a modified example, for example, the same can goes for the case of mounting one semiconductor chip (not shown), or the case of mounting three or more semiconductor chips (not shown).

The die pad 2 with the semiconductor chip 6 mounted thereover is made of the same metal as that of the lead 3 (and suspension lead 8). In this embodiment, the die pad 2 is made of a laminated metal film including, for example, a metal film (not shown) of nickel (Ni) or nickel-palladium formed over the front surface of the substrate made of copper (Cu) or a copper alloy. As shown in FIG. 6, the upper surface 2*a* of the die pad 2 serving as a chip mounting surface has a circular shape in the planar view with an area smaller than that of the front surface 6*a* of the semiconductor chip 6. Thus, as shown in FIG. 4, a part of the back surface 6*b* of the semiconductor chip 6 is exposed from the die pad 2 to adhere to the sealing body 7. Accordingly, the part of the back surface 6*b* of the semiconductor chip 6 adheres to the sealing body 7, which can improve the strength of bonding of the sealing body 7 to the semiconductor chip 6. The area and shape of the chip mounting surface of the die pad 2 are not limited to the above conditions. Alternatively, the chip mounting surface of the die pad 2 can be formed in a quadrangular planar shape to have an area larger than that of the back surface 6*b* of the semiconductor chip 6.

The die pad 2 is supported by the suspension leads 8. As shown in FIG. 5, the suspension lead 8 has one end connected to the die pad 2 and extends toward the corners 12*k* and 13*k*. In this embodiment, as shown in FIG. 6, each suspension lead 8 is branched into a plurality of parts (for example, two in FIG. 6) between the corner 12*k* and the die pad 2. The respective branched ends of the leads 8 are exposed from the cap 11 (see FIG. 3) in the respective sides 12*h*1, 12*h*2, 12*h*3, and 12*h*4 of the upper cap 12 (see FIG. 1). In other words, the suspension lead 8 extends from the die pad 2 toward the corner 12*k*, but is positioned so as to avoid the corresponding corner 12*k* of the upper cap 12. Further, in short, the suspension lead 8 is exposed from the cap 11 between the corner 12*k* and the lead 3. Each suspension lead 8 is branched into a plurality of parts between the corner 12*k* and the die pad 2, and thus serves as a stopper for inhibiting the progression of cracks as will be described in detail later. The suspension lead 8 is not positioned at the corner 12*k*, which can effectively supply resin from the corner 12*k* (specifically, an opening between the corners 12*k*1 and 13*k*1 shown in FIG. 5) in a manufacturing procedure of the semiconductor device 10.

As shown in FIG. 4, the semiconductor chip 1 is electrically connected to the leads 3 via a plurality of wires (conductive members, metal lines) 5. Specifically, one end of the wire 5*b* is bonded to the pad 6*b* of the semiconductor chip 6, and the other end thereof is bonded to the lead 3. Thus, the semiconductor chip 6 is electrically connected to the leads 3 via the wires 5. The semiconductor chip 1 on the upper stage is electrically connected to the semiconductor chip 6 on the lower stage via the wires 5. Specifically, one end of the wire 5*a* is connected to the pad 6*p* of the semiconductor chip 6, and the other end thereof is connected to the pad 1*p* of the semiconductor chip 1. Thus, the semiconductor chip 1 is electrically connected to the semiconductor chip 6 via the wires 5*a*. In other words, the semiconductor chip 1 is electrically connected to the leads 3 via the semiconductor chip 6. In a modified example of FIG. 6, the same can go for the case where the semiconductor chip 1 and the lead 3 are electrically connected together via the wires 5.

As shown in FIG. 4, the semiconductor chips 1 and 6 and the wires 5 are sealed with the sealing body 7 made of rubber. The wires are sealed with the sealing body 7, which can protect the wires 5 and also can prevent or suppress the deterioration of electric characteristics due to oxidation or deformation. The wires 5 are sealed with the sealing body 7, which can prevent or suppress the contact between the adjacent wires 5. The materials for the sealing body 7 are not specifically limited, but can be a resin seal material containing a thermosetting epoxy resin with filler material (particles), such as silica, added thereto.

The formation of the sealing body 7 can protect the wires 5 without forming the cap 11 shown in FIG. 4. However, the inventors of the present application have found that in some cases, cracks might be generated in the sealing body 7 under a high-temperature environment, for example, of about 175 to 250° C. when the cap 11 is not formed. Specifically, the inventors of the present application have evaluated high-temperature durability by leaving the semiconductor device without forming the cap 11 as shown in FIG. 4, under high-temperature environments of about, 175° C., 200° C., and 250° C. As a result, cracks are found to be generated on the front surface of the sealing body 7. It is confirmed that cracks will progress toward the inside of the sealing body 7, starting from the position of the crack generated at the front surface of the sealing body 7. That is, depending on the position of the generated crack and the degree of progression of the cracks, the cracks might reach the wire 5, a bonding portion between the wire 5 and the pads 1*p* and 6*p*, or the semiconductor chips 1 and 6 to reduce the reliability of the semiconductor device (electric characteristics).

The above phenomenon is supposed to be generated by the following mechanism. That is, when the temperature of the front surface of the sealing body 7 becomes high, polymerization was broken at the front surface of the sealing body 7 due to oxidation. Together with breaking of the polymerization, depolymerization is generated. When the depolymerization is nonuniformly generated at the front surface of the sealing body 7, distortion occurs at the front surface, thus causing cracks.

In recent years, resin sealed semiconductor devices are used for various applications, and for example, as a semiconductor device which is mounted on a vehicle in some cases. For use as an on-vehicle semiconductor device, in some cases, the temperature of environment of usage of the semiconductor device becomes high as compared to a semiconductor mounted on a cellular phone. Accordingly, the technique is required to ensure the reliability of the resin sealed semiconductor device under the above high-temperature environment at a temperature of about 175 to 250° C.

For cracks generated, there is proposed a method that prevents the cracks from reaching the wire 5, the bonding portion between the wire 5 and the pads 1*p* and 6*p*, and the semiconductor chips 1 and 6. The method involves thickening the sealing body 7 to elongate the distance from the front surface to the wire 5. However, the semiconductor device is required to be thinned, which tends to decrease the distance from the front surface of the sealing body 7 to the wire 5. Particularly, in the semiconductor device including a lamination of the semiconductor chips 1 and 6 like this embodiment, the distance between the front surface of the sealing body 7 and the wire 5 connected to the semiconductor chip 1 on the upper level becomes shorter.

Based on the above findings, the inventors of the present application have further studied and found the structure of the sealing body 7 covered with the cap 11 as shown in FIG. 4. The cap 11 includes a lower cap (mounting surface side lid, member, or cap) 13 arranged on the mounting surface side of the semiconductor device 10, and an upper cap (upper surface side lid, member, or cap) 12 arranged on the side opposite to the mounting surface of the semiconductor device 10. The periphery of the upper cap 12 is bonded and fixed to the periphery of the lower cap 13 via the sealant 14, thereby forming the cap 11 including a space for accommodating therein the sealing body 7.

As shown in FIG. 8, the upper cap 12 has an outer surface (upper surface, exposed surface) 12*a*, an inner surface (lower surface) 12*b* positioned opposite to the outer surface 12*a*, and sides (outer surfaces) 12*c* arranged around the outer surface 12*a*. The upper cap 12 has a recessed portion (space formation portion) 12*d* arranged at the substantially center of the inner surface (lower surface) 12*b*. The upper cap 12 includes a flange (protrusion, bonding region) 12*e* arranged around the recessed portion 12*d*. The lower surface side of the flange 12*e* serves as a bonding surface 12*f* for bonding the sealant 14 as shown in FIG. 4.

The lower cap 13 has an outer surface (lower surface, exposed surface, mounting surface) 13*b*, an inner surface (upper surface) 13*a* positioned opposite to the outer surface 13*b*, and sides (outer surfaces) 13*c* arranged around the outer surface 13*b*. The lower cap 13 has a recessed portion (space formation portion) 13*d* arranged at the substantially center of the inner surface (lower surface) 13*a*. The lower cap 13 includes a flange (protrusion, bonding region) 13*e* arranged around the recessed portion 13*d*. The upper surface side of the flange 13*e* serves as a bonding surface 13*f* for bonding the sealant 14 as shown in FIG. 4.

As shown in FIG. 8, the shape of each of the upper cap 12 and the lower cap 13 (shaped to have the recessed portions 12*d* and 13*d* and the flanges 12*e* and 13*e*) can be formed by plastically deforming a metal plate by pressing.

As shown in FIG. 4, the cap 11 accommodates the semiconductor chips 1 and 6 and the wires 5 in a space formed by the recesses 12*d* and 13*d* by opposing the bonding surface 12*f* of the upper cap 12 to the bonding surface 13*f* of the lower cap 13, and by bonding the bonding surfaces 12*f* and 13*f* to the leads 3 via the sealant 14. The space formed by the recessed portions 12*d* and 13*d* accommodates therein the sealing body 7. The flange 12*e* is provided around the recess 12*d* of the upper cap 12, and the flange 13*e* is provided around the recess 13*d* of the lower cap 13, which can enlarge the area of the bonding region of the sealant 14. Thus, the bonding strength between the upper cap 12 and the lower cap 13 can be improved.

The sealing body 7 is covered by the cap 11, which can serve as a heat dissipator (heatsink) to suppress the increase in temperature of the front surface of the sealing body 7. That is, when the semiconductor device 10 shown in FIG. 4 is exposed under the high-temperature environment at a temperature of about 175 to 250° C., the cap 11 has its temperature increased. The cap 11 is made of a material having a higher radiant efficiency than that of the sealing body 7, so that a part of heat contained in the cap 11 is dissipated outward from the front surface of the cap 11 as radiant heat. The sealing body 7 adheres to the cap 11, so that the heat is transferred from the sealing body 7 to the cap 11. As a result, this arrangement can suppress the increase in temperature of the front surface of the sealing body 7. The increase in temperature of the front surface of the sealing body 7 is suppressed, which can suppress the occurrence of the distortion to prevent the generation of cracks. That is, the semiconductor device 10 dissipates the heat from the sealing body 7 toward the outside of the semiconductor device 10 via the cap 11, which can prevent the generation of the cracks to improve the reliability of the device.

In order to cause the cap 11 to serve as the heat dissipator, the structure with the cap 11 having a higher radiation factor than that of the sealing body 7 can improve the heat dissipation as compared to the structure without the cap 11. Materials having a higher radiation factor than that of the sealing body 7 made of resin include metal, ceramic, and the like. The cap 11 is preferably formed of metal for easy processing in a manufacturing step. In order to improve the heat conductivity from a contact interface with the sealing body 7, the cap 11 is also preferably formed of metal. For the purpose of improving the heat conductivity and the radiation factor (that is, heat dissipation characteristic), more preferably, the cap 11 is formed of, for example, copper or a copper alloy.

When the sealing body 7 adheres to the cap 11, like the semiconductor device 10, the sealing body 7 preferably has the same coefficient of linear expansion as that of the cap 11 in order to suppress the occurrence of distortion due to a difference in coefficient of linear expansion. Filler material, such as silica, is added to the sealing body 7 as described above, which results in a small difference in coefficient of linear expansion between the semiconductor chips 1 and 6. Thus, the material for the cap 11 has the same coefficient of linear expansion as that of the semiconductor chips 1 and 6, so that a coefficient of linear expansion of the sealing body 7 can be set to the same as that of the cap 11.

For example, in this embodiment, the semiconductor substrate of the semiconductor chips 1 and 6 is comprised of silicon (Si), and the cap 11 (upper cap 12 and lower cap 13) is comprised of kovar (alloy of iron with nickel and cobalt added thereto), which has a coefficient of linear expansion similar to that of silicon (Si). For example, a metal film (plating film) comprised of nickel or nickel-palladium is formed over the front surface of the substrate comprised of koval. The plating film comprised of nickel or nickel-palladium (nickel film or nickel-palladium film) serves as an oxidation preventing film for preventing the oxidation of the cap 11. Further, a metal film (nickel film or nickel-palladium film) formed over the inner surface of the cap 11 (inner surface 12*b* of the upper cap 12 and inner surface 13*a* of the lower cap 13) serves as an adhesion improving film for improving the adhesion of the interface between the sealing body 7 and the cap 11. Improvement of the adhesion between the sealing body 7 and the cap 11 increases the effectiveness of heat transfer, thereby improving the heat dissipation.

The sealant 14 is arranged at the bonding portion between the upper cap 12 and the lower cap 13 (between the flanges 12*e* and 13*e*). In order to improve the sealing of the inside of the cap 11, the sealant 14 preferably has the high sealing characteristics (embedding property between the adjacent leads 3, the shape keeping property until the sealant 14 is bonded and fixed after application, and the adhesion property of the bonding interface). For the purpose of reducing a gap generated between the adjacent leads 3, a material having a paste-like property is preferably used before curing as compared to a material for bonding in a solid state, like the film-like (tape-like) adhesive.

Until the sealant 14 is cured after application, it is necessary to keep the applied shape. Thus, the sealant 14 preferably has a viscosity to some degree. For example, a sealant having a viscosity similar to that of water cannot keep the shape of application or coating. In contrast, the sealant having the excessively high viscosity might cause a gap between the adjacent leads 3. Like this embodiment, when the upper cap 12 and the lower cap 13 are made of metal (for example, koval, copper, or a copper alloy), the accidental contact between the lead 3 and the upper cap 12 or lower cap 13 causes short circuit between the leads 3. As shown in FIG. 9, in order to prevent the contact with the lead 3, the sealant 14 as an insulator needs to surely intervene in between the upper cap 12 and the lead 3, and between the lower cap 13 and the lead 3.

While the sealant 14 is applied and cured to fix the bonding surfaces 12*f* and 13*f* of the upper cap 12 and the lower cap 13, the viscosity of the sealant 14 is preferably low as long as it can keep the shape of the application or coating. For example, in this embodiment, the adhesive S1 is formed using an adhesive including a thermosetting epoxy resin with filler (particles) mixed thereinto. However, the viscosity of the sealant 14 before curing is lower than that of the adhesive S1 before curing. Such adjustment of the viscosity can be performed by controlling the shape of the filler added to the adhesive, the grain diameter of the filler, a compounding ratio of an additive, such as a binder for adjustment of the viscosity to the main material of the adhesive, and the like.

After curing the sealant 14, bonding interfaces with each of the upper cap 12, the lower cap 13, and the lead 3 are required to be bonded and fixed to the sealant 14. In this embodiment, a plating film comprised of the same metal (for example, nickel or nickel-palladium) is formed over the bonding surfaces 12*f* and 13*f* of the upper cap 12 and the lower cap 13 and the front surface of the lead 3 respectively. The plating film can easily improve the adhesion with each component arranged in the bonding portion between the bonding surfaces 12*f* and 13*f*.

When one of the upper cap 12 and the lower cap 13 (for example, the upper cap 12) is first bonded to the lead 3, and then the other (for example, the lower cap 13) is bonded to the lead 3, different types of sealants 14 can be used for bonding. For example, as will be described in detail later, upon first bonding (for example, to the bonding surface 12*f* of the upper cap 12), a film-like sealant 14 (not shown) is attached in advance. Then, upon bonding (for example, the lower cap 13), a paste-like sealant 14 can be applied to the leads 3 or the bonding surface 13*f* of the lower cap 13.

In use of the lower cap 13 made of metal, when the semiconductor device 10 is mounted over a mounting substrate (not shown), a heat dissipation terminal positioned over the mounting substrate can be connected to the outer surface 13*b* of the lower cap 13 via a metal bonding material, such as solder. That is, the lower cap 13 can serve as a heat dissipator (heat spreader) for dissipating heat from the inside of the cap 11 toward the outside of the semiconductor device 10. In this case, in addition to a heat dissipation route depending on radiation from the cap 11, another heat dissipation route (heat dissipation route through the lower cap 13 and the metal bonding material (not shown)) can be added, which can further improve the heat dissipation efficiency.

In order to cause the sealing body 7 to adhere to the inner surface of the cap 11 in this embodiment, the semiconductor chips 1 and 6 and the wires 5 are covered by the cap 11, and then the resin is charged, thereby forming the sealing body 7 (as will be described in detail below). When forming the sealing body 7 after formation of the cap 11 in this way, a supply port for resin is necessary. To prevent the formation of voids (bubble) within the sealing body 7 or between the sealing body 7 and the cap 11, an exhaust port for discharging gas in the cap 11 is preferably provided upon forming the sealing body 7. For this reason, as shown in FIG. 6, the sealant 14 is arranged along each side of the periphery of the upper cap 12, specifically, at each of the sides 12*h*1, 12*h*2, 12*h*3, and 12*h*4 of the upper cap 12 (see FIG. 1). The sealant 14, however, is not provided at each corner 12*k* of the upper cap 12. In other words, the sealant is arranged so as to avoid each corner 12*k* of the upper cap 12. Thus, upon forming the sealing body 7 shown in FIG. 5, one or some of four corners 12*k* can be used as a gate for supply of resin, and others can be used as a vent for discharging gas in the cap 11.

As mentioned above, after forming the cap 11, the resin is supplied into the cap 11 to form the sealing body 7. In this case, the supply port for the resin and the exhaust port for the gas are opened, so that a part of the sealing body 7 is exposed between the corner 12*k* and the corner 13*k* as shown in FIG. 5. When the semiconductor device 10 with a part of the sealing body 7 exposed is left under a high-temperature environment, cracks might be caused at the exposed part. That is, in some cases, the cracks might reach the wire 5, the bonding part between the wire 5 and the pads 1*p* and 6*p*, or the semiconductor chips 1 and 6 (see FIG. 4), depending on the position of the exposed part of the sealing body 7 (position of generation of the crack). In the related art, for example, when a part of the upper surface 7*a* of the sealing body 7 is exposed above the wire 5 shown in FIG. 4, cracks are more likely to reach the wires 5.

In contrast, in this embodiment, the sealing body 7 is exposed between the corners 12*k* and 13*k* as mentioned above. However, even if cracks are caused in the exposed part of the sealing body 7, the cracks are generated far away from the wires 5. Thus, the possibility of the crack reaching the wire 5 can be reduced. Further, the entire upper surface 7*a* of the sealing body 7 is covered with the upper cap 12, which can prevent the generation of cracks. It is not necessary to excessively thicken the sealing body 7 taking into consideration the progression of the cracks. In other words, the thickness of the sealing body 7 has only to have the thickness required to cover the wire 5, which can result in reduction in thickness of the semiconductor device 10.

In this embodiment, as shown in FIG. 6, the suspension lead 8 is branched into a plurality of parts (two parts in FIG. 6) between the corner 12*k* and the die pad 2. Each branched end is exposed from the cap 11 (see FIG. 3) at each of the sides 12*h*1, 12*h*2, 12*h*3, and 12*h*4 of the upper cap 12 (see FIG. 1). Even if cracks are generated at the exposed surface of the sealing body 7 shown in FIG. 5, the suspension lead 8 can be placed in the direction of progression of the crack to stop the progression of cracks before the crack reaches the suspension lead 8. That is, since each suspension lead 8 is branched into the plurality of parts between the corner 12*k* and the die pad 2 in the planar view, the suspension lead 8 can serve as a stopper for interrupting the progression of the cracks. This arrangement can surely prevent the cracks from reaching the wire 5 or lead 3.

<Manufacturing Procedure of Semiconductor Device>

Figure 10:
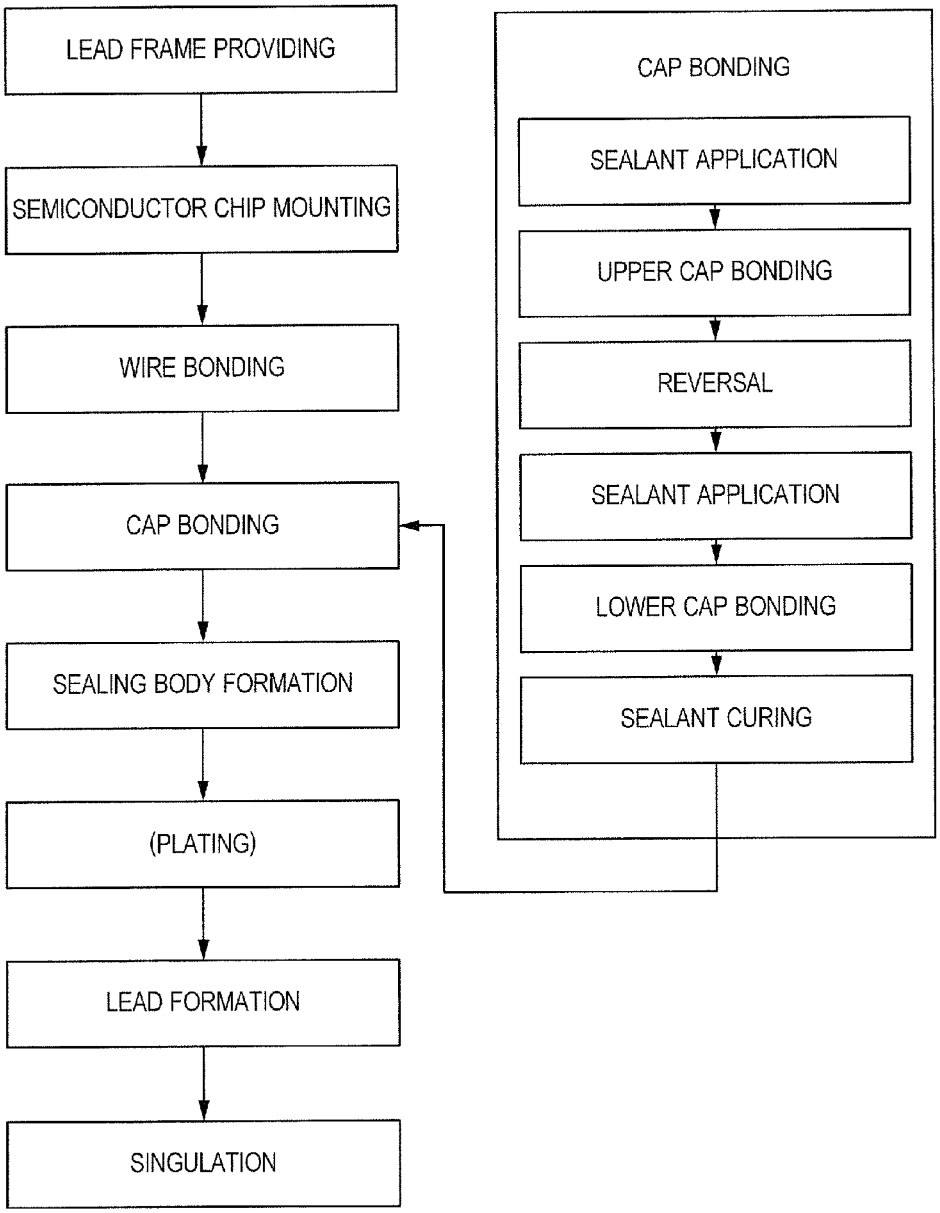
FIG. 10 is an explanatory diagram showing an assembly flowchart of the semiconductor device shown in FIG. 1.

Next, a manufacturing procedure of the semiconductor device 10 shown in FIGS. 5 to 9 will be described below. The semiconductor device 10 is manufactured according to an assembly flowchart shown in FIG. 10. FIG. 10 shows an explanatory diagram of the assembly flowchart of the semiconductor device in this embodiment. The details of respective steps will be described below using FIGS. 11 to 33.

Figure 11:
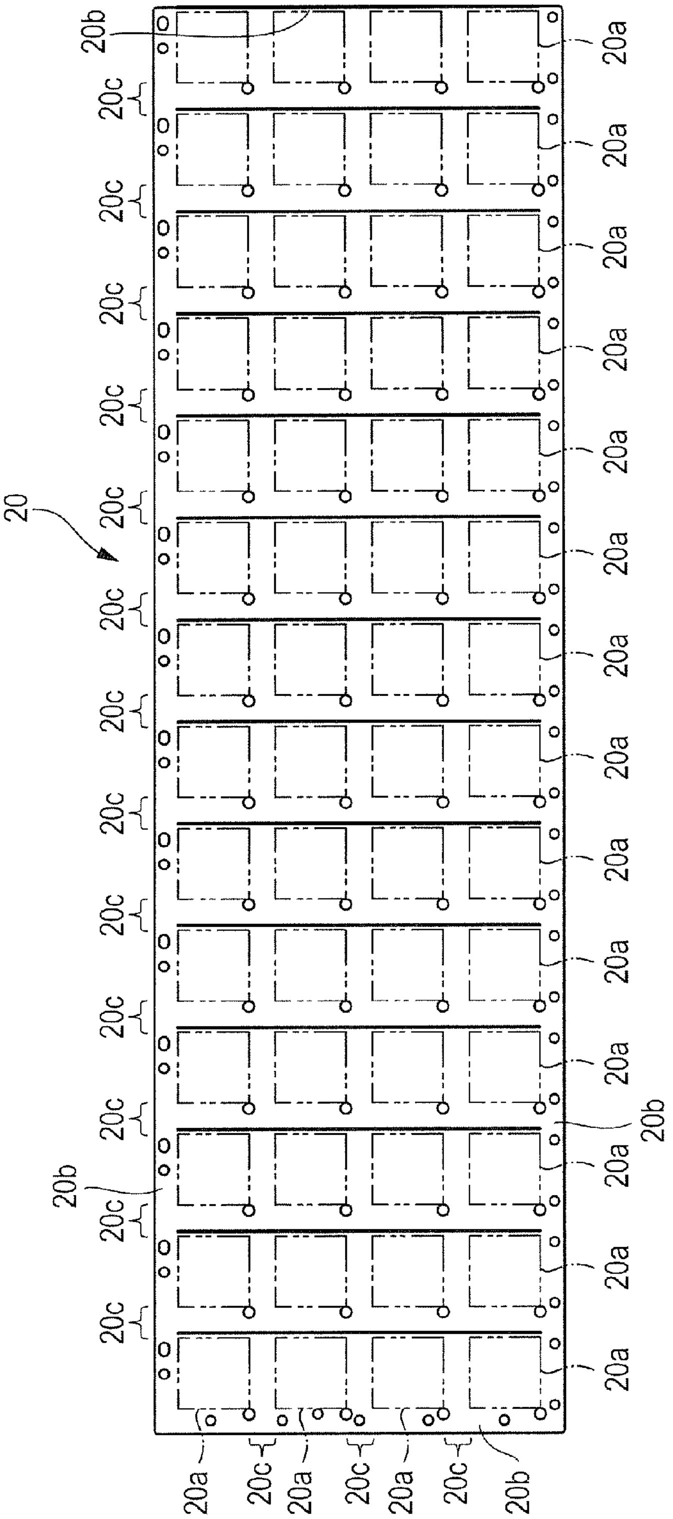
FIG. 11 is a plan view showing an entire structure of a lead frame provided in a lead frame providing step shown in FIG. 10.
Figure 12:
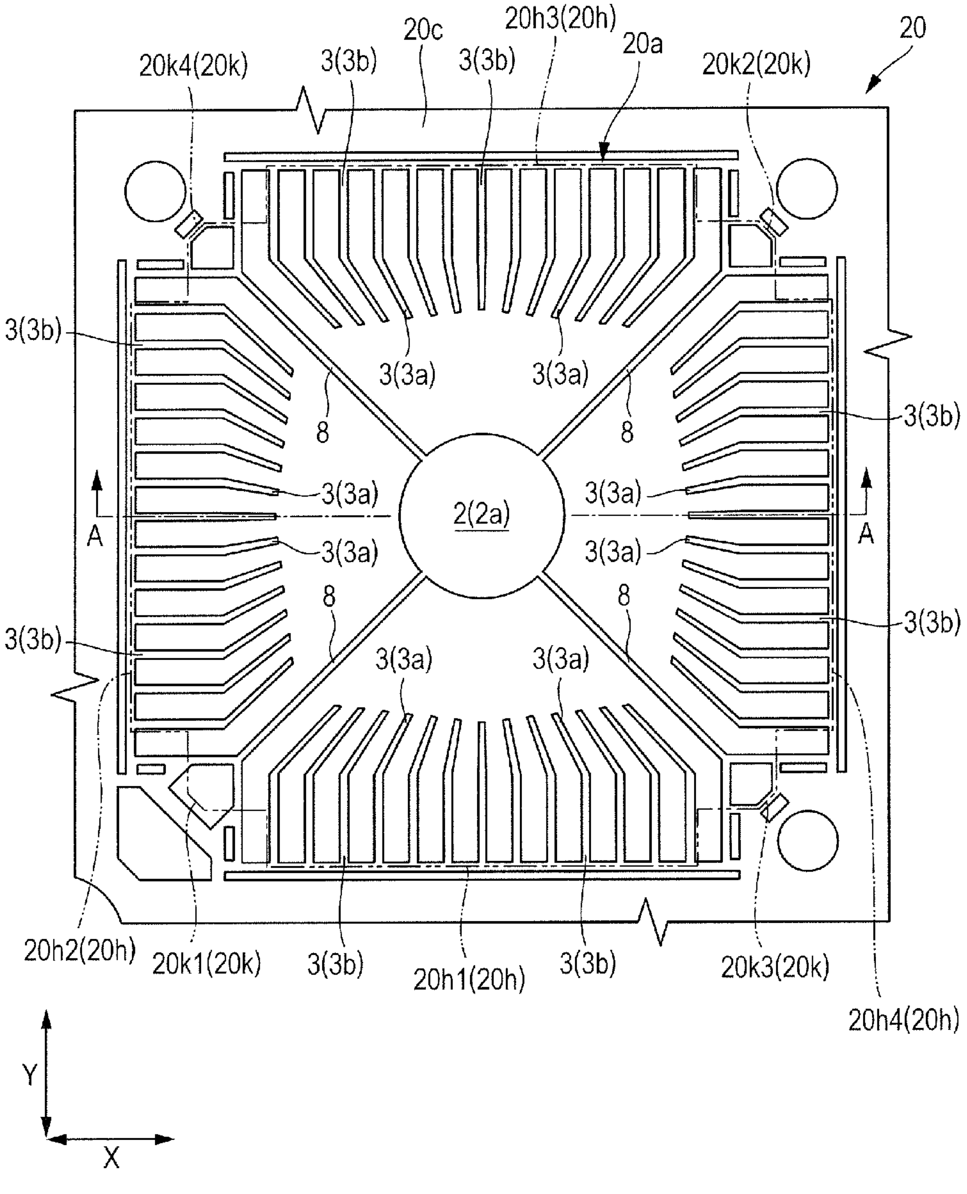
FIG. 12 is an enlarged plan view of one of a plurality of product formation regions and its surroundings shown in FIG. 11.
Figure 13:
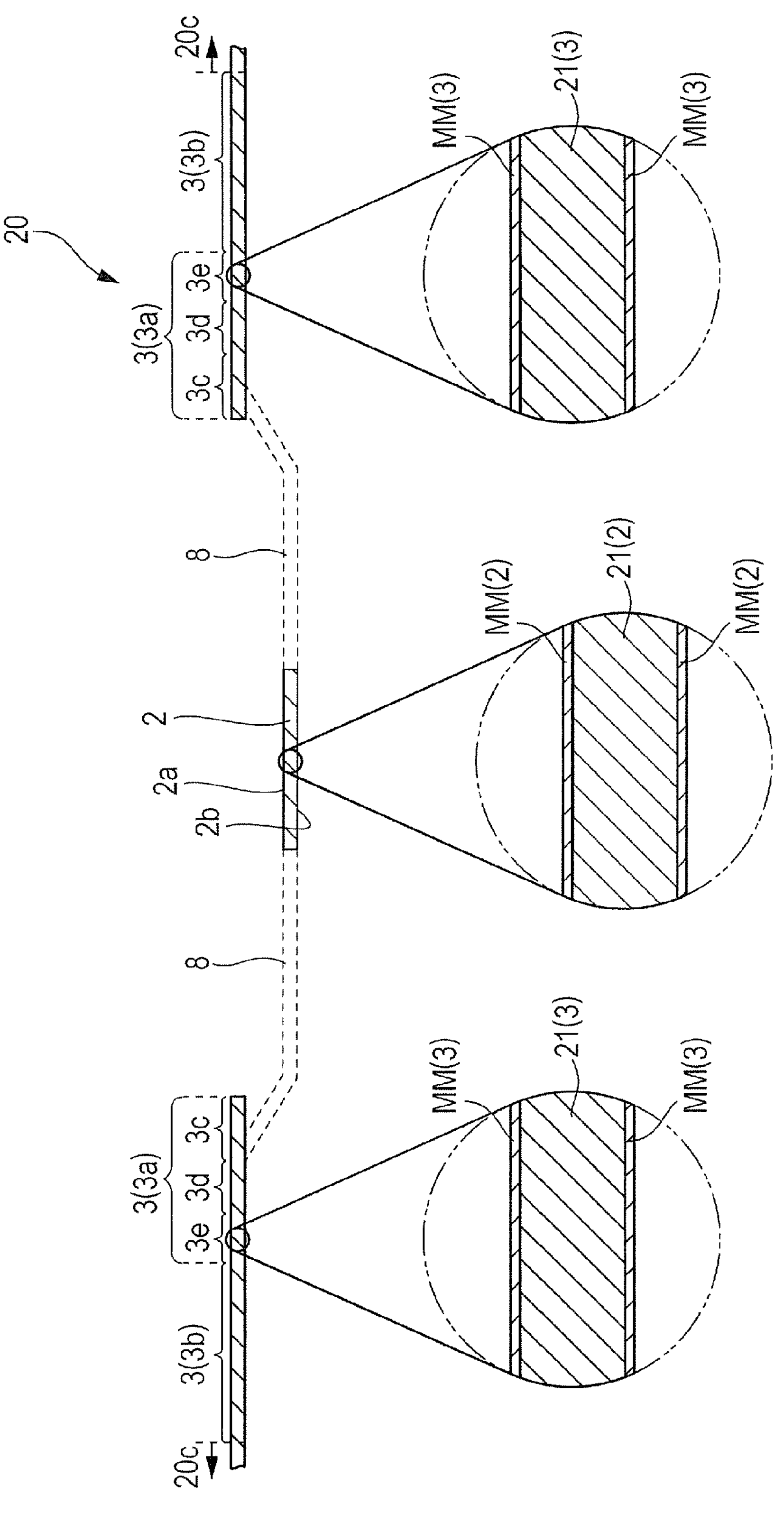
FIG. 13 is an enlarged cross-sectional view taken along the line A-A of FIG. 12.

1. Lead Frame Preparation Step:

FIG. 11 shows a plan view of the entire structure of the lead frame provided in a lead frame providing step shown in FIG. 10. FIG. 12 is an enlarged plan view of one of a plurality of product formation regions and its surroundings shown in FIG. 11. FIG. 13 shows an enlarged cross-sectional view taken along the line A-A of FIG. 12.

In the lead frame providing step shown in FIG. 10, a lead frame 20 is provided as shown in FIG. 11. The lead frame 20 used in this embodiment includes a plurality of product formation regions 20*a* inside an exterior frame (frame body) 20*b*. The product formation regions 20*a* are arranged in rows. A frame portion 20*c* is arranged between the adjacent product formation regions 20*a*. The frame portion 20*c* is connected to the components of each product formation region 20*a* (for example, leads 3 and die pad 2 shown in FIG. 12) to support them. In a sealing body formation step to be described later, the frame portion 20*c* serves as a region (runner arrangement region) for positioning a runner (not shown) as a supply route for supplying the resin for sealing into the cap arranged in each product formation region 20*a*.

As shown in FIG. 12, which is a partial enlarged diagram of FIG. 11, each product formation region 20*a* has a side (main side) 20*h*1 extending in the direction X, a side (main side) 20*h*2 extending in the direction Y and intersecting (perpendicular to) the side 20*h*1, a side (main side) 20*h*3 opposed to the side 20*h*1, and a side 20*h*4 opposed to the side (main side) 20*h*2. The product formation region 20*a* has four corners 20*k* positioned in the regions where adjacent ones of the four sides 20*h* intersect. Specifically, the product formation region 20 has a corner 20*k*1 in a region where the side 20*h*1 intersects the side 20*h*2. The product formation region 20*a* has the corner 20*k*2 positioned in the region where the side 20*h*3 intersects the side 20*h*4. The product formation region 20*a* has the corner 20*k*3 positioned in the region where the side 20*h*1 intersects the side 20*h*4. The product formation region 20*a* has the corner 20*k*4 positioned in the region where the side 20*h*2 intersects the side 20*h*3.

In each product formation region 20*a*, the die pad 2 serving as a chip mounting portion is arranged at the center of the product formation region 20*a*. A plurality of leads 3 are arranged around the die pad 2 so as to enclose the die pad 2. In the product formation region 20*a*, the leads 3 are arranged along each of the four sides 20*h* of the product formation region 20*a*. The die pad 2 is previously bent and supported by the frame portions 20*c* via the suspension leads 8, each having a sloped part. Thus, as shown in FIG. 13, the upper surface 2*a* of the die pad 2 is positioned at a lower level than the upper surfaces of the leads 3. That is, the lead frame 20 provided in the lead frame providing step is previously subjected to down-setting processing (offset-processing).

Each of the suspension leads 8 has one end connected to the die pad 2, and extends toward the corresponding corner 20*k* of the product formation region 20*a*. In this embodiment, as shown in FIG. 12, the suspension lead 8 is branched into a plurality of parts (two in FIG. 6) between the corner 20*k* and the die pad 2. Each branched end is connected to the frame portion 20*c* between the lead 3 and the corner 20*k*. In other words, the suspension lead 8 extends from the die pad 2 toward the corner 20*k*, and is arranged so as to avoid the corner 20*k*.

As shown in FIG. 4, each of the leads 3 includes an inner lead 3*a* sealed with the sealing body 7 and the sealant 14 in completion of the manufacturing, and an outer lead 3*b* exposed from the cap 11. As shown in FIG. 13, the inner lead 3*a* includes a bonding region 3*c*, a seal region 3*d*, and a sealing adhesive region 3*e* arranged from the inner end side of the lead 3 in that order. The bonding region 3*c* is positioned at the inner end of the lead 3. The bonding region 3*c* is a region for bonding the wire 5 (see FIG. 4) in the wire bonding step (see FIG. 10). The seal region 3*d* is positioned between the bonding region 3*c* and the sealing adhesive region 3*e*. The seal region 3*d* is a region which is sealed by the sealing body 7 (see FIG. 4) in the sealing body formation step (see FIG. 10). The sealing adhesive region 3*e* is positioned between the seal region 3*d* and the outer lead 3*b*. The sealing adhesive region 3*e* is a region which is subjected to sealing adhesion (or sealed) by the sealant 14 (see FIG. 4) between the flanges 12*e* and 13*e* (see FIG. 4) of the cap 11 (see FIG. 4) in the cap bonding step (see FIG. 10). The outer lead 3*b* is positioned at the outer end of the lead 3. The outer lead 3*b* is a region which is bent in the gull-wing shape as shown in FIG. 6 in the lead formation step (see FIG. 10), and which is connected to a terminal over the mounting substrate (not shown).

The die pad 2 and the leads 3 are integrally formed with the frame portion 20*c* of the lead frame 20, and as shown in FIG. 13, for example, includes a substrate 21 made of copper (Cu), and a metal film (plating film) MM previously formed over the front surface of the substrate 21 and made of, for example, nickel (Ni) or nickel-palladium (Ni—Pd). The metal film MM is not necessarily formed over the entire surface of each of the leads 3 in the way described above. When the metal film MM is not formed over the entire surface, as described using FIG. 4, the metal film (exterior plating film) MM is formed of solder (containing lead-free solder), for example, by a plating method over the front surface (upper surface, lower surface, and sides) of the outer lead 3*b* exposed from the cap 11 of the lead 3. Conversely, when the metal film MM is formed over the entire lead 3 including the outer lead 3*b* in advance, the step of forming the metal film MM shown in FIG. 4 can be omitted.

As shown in FIG. 12, the leads 3 are respectively connected to the frame portion 20*c*, and integral with each other via the frame portion 20*c*, but are not connected within the frame portion 20*c*. As will be described in detail below, in this embodiment, in the sealing body formation step (see FIG. 10), resin is supplied into a space sealed by the cap 11 (see FIG. 4) and the sealant 14 (see FIG. 4), thereby forming the sealing body 7 (see FIG. 4). The leads 3 are connected together at the frame portion 20*c*, and thus can be separated from each other in other regions except for the frame portion 20*c*.

Figure 14:
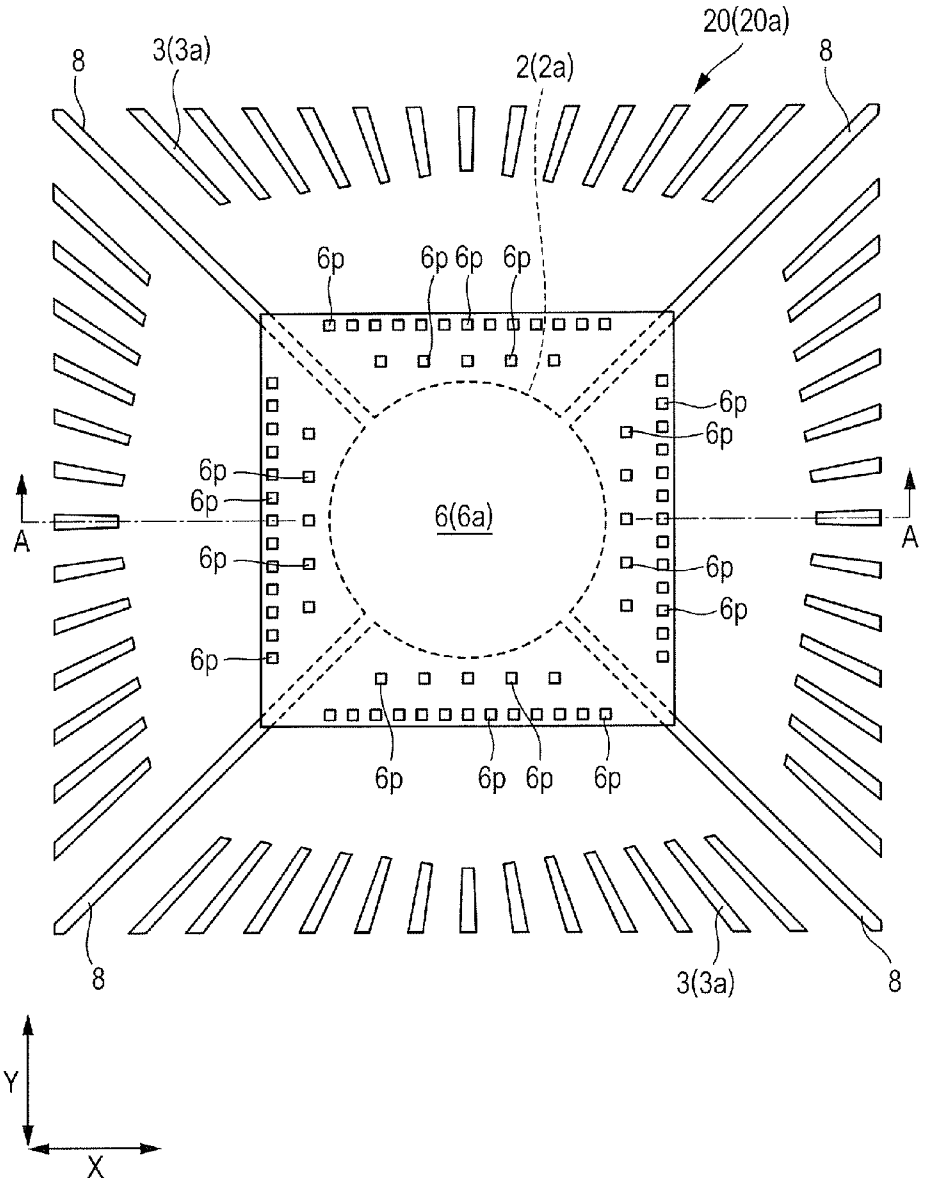
FIG. 14 is an enlarged plan view showing the state of a semiconductor chip mounted via an adhesive over a die pad shown in FIG. 12.
Figure 15:
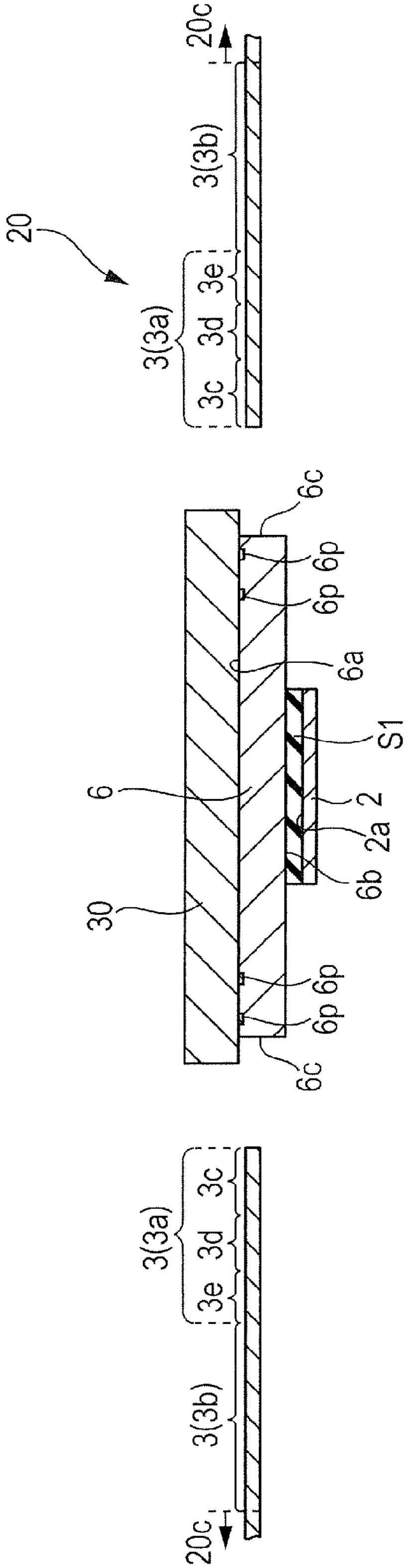
FIG. 15 is an enlarged cross-sectional view taken along the line A-A of FIG. 14.
Figure 16:
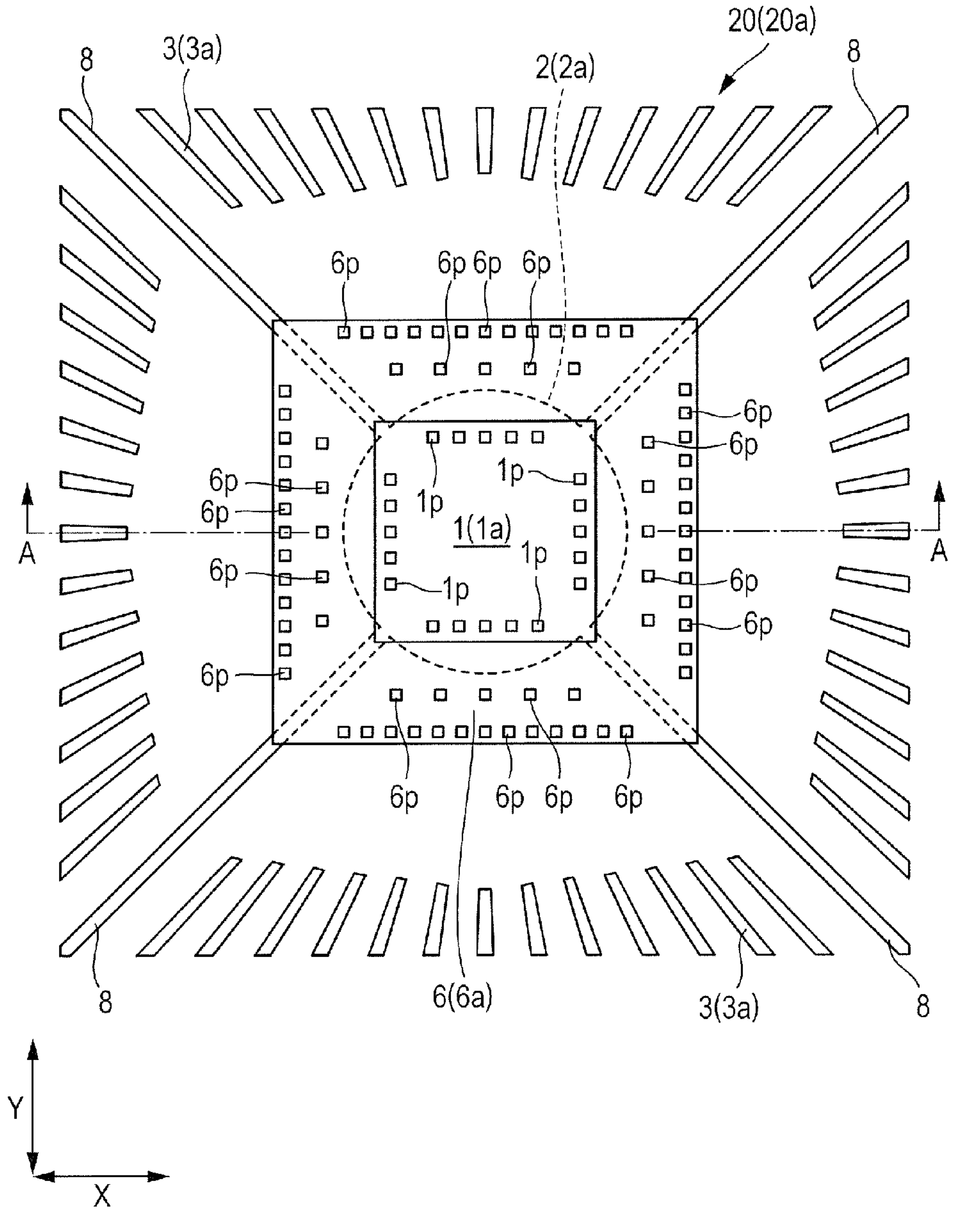
FIG. 16 is an enlarged plan view showing the state in which another semiconductor chip is mounted via an adhesive over the semiconductor chip shown in FIG. 14.
Figure 17:
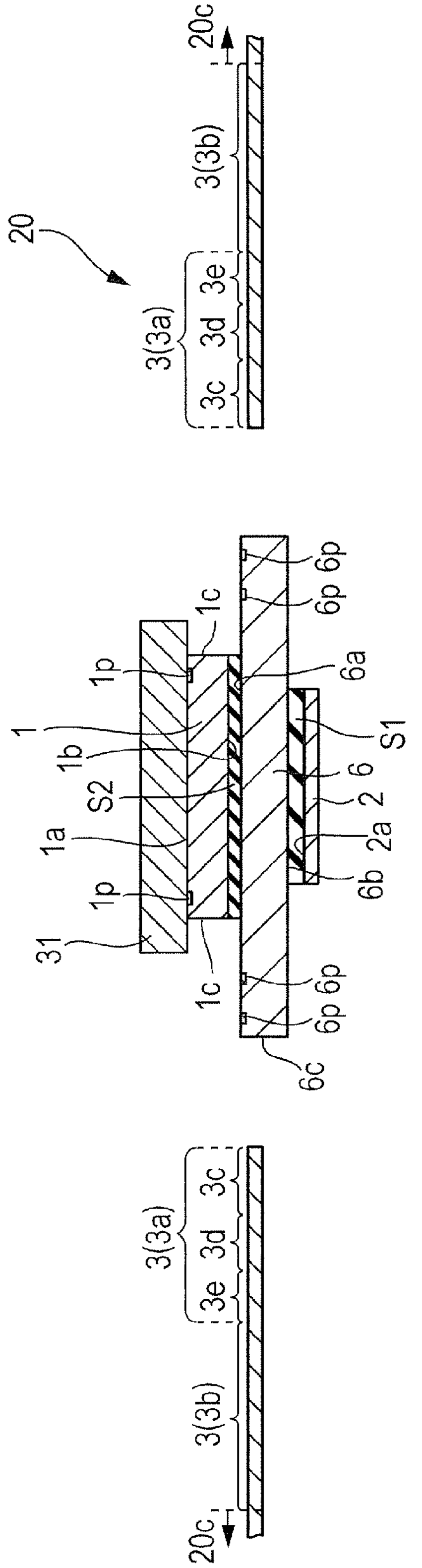
FIG. 17 is an enlarged cross-sectional view taken along the line A-A of FIG. 16.

2. Semiconductor Chip Mounting Step:

FIG. 14 is an enlarged plan view showing the state of a semiconductor mounted via an adhesive over a die pad shown in FIG. 12. FIG. 15 is an enlarged cross-sectional view taken along the line A-A of FIG. 14. FIG. 16 is an enlarged plan view showing the state in which another semiconductor chip is mounted via an adhesive over the semiconductor chip shown in FIG. 14. FIG. 17 is an enlarged cross-sectional view taken along the line A-A of FIG. 16.

Then, in the semiconductor chip mounting step shown in FIG. 10, as shown in FIGS. 14 to 17, the semiconductor chip 6, and the semiconductor chip 1 are mounted over the die pad 2 in that order. First, in the present step, a plurality of semiconductor chips (semiconductor chip 1 and semiconductor chip 6) are provided. The semiconductor chips 1 and 6 can be obtained, for example, in the following steps. For example, a semiconductor wafer (not shown) made of silicon is provided, and an integrated circuit is then formed thereover. The integrate circuit includes a semiconductor element, a wiring layer connected to the semiconductor element, and an external terminal (pad 1*p* or pad 6*p*) connected to the wiring layer. Thereafter, a dicing blade (rotary cutter) (not shown) is moved along a dicing line of the semiconductor wafer to separate the wafer into a plurality of types of semiconductor chips, each type including the chips.

Specifically, each semiconductor wafer is made to be singulation to provide the semiconductor chips 1 and the semiconductor chips 6. Since in this embodiment, the semiconductor chip 1 is mounted over the front surface 6*a* of the semiconductor chip 6 via the film-like adhesive S2, for example, called DAF, each of the semiconductor chips 1 obtained in this step has the adhesive S2 attached to its back surface 1*b*.

Then, as shown in FIGS. 14 and 15, first, the semiconductor chip 6 to be positioned as a lower layer is previously mounted over the upper surface 2*a* of the die pad 2 via the adhesive S1. As shown in FIG. 15, the semiconductor chip 6 is mounted with its back surface 6*b* opposed to the upper surface 2*a* of the die pad 2, that is, by the so-called face-up mounting.

In this embodiment, the semiconductor chip 6 is mounted via the adhesive S1, which is thermosetting expoxy resin, for example. The adhesive S1 is a paste having adequate flexibility before curing (thermal hardening). In use of the paste as the adhesive S1 in this way, first, the paste-like adhesive S1 is applied to the upper surface 2*a* of the die pad 2. Then, for example, the back surface 6*b* of the semiconductor chip 6 is pushed against the upper surface 2*a* of the die pad 2 by pressing a pressing jig 30 against the front surface 6*a* of the semiconductor chip 6, so that the adhesive S1 is spread over the entire back surface 6*b* of the semiconductor chip 6, thereby bonding the semiconductor chip 6 to the die pad 2. After the bonding, the adhesive S1 is cured (for example, by heat treatment). As a result, as shown in FIGS. 14 and 15, the semiconductor chip 6 is fixed to the die pad 2 via the adhesive S1.

In a modified example, the adhesive S1 can be a film-like adhesive. Further, in order to improve the heat dissipation toward the die pad 2, an adhesive containing conductive particles with a high heat conductivity may be used. However, in order to improve the bonding strength with the upper surface 2*a* of the die pad 2 comprised of metal (for example, nickel or nickel-palladium), the paste-like adhesive is preferable.

Then, as shown in FIGS. 16 and 17, the semiconductor chip 1 is mounted over the front surface 6*a* of the semiconductor chip 6 via the adhesive S2. In this step, the semiconductor chip 1 is positioned over the front surface 6*a* of the semiconductor chip 6 with the back surface 1*b* of the semiconductor chip 1 (surface with the adhesive S2 applied) opposed to the front surface 6*a* of the semiconductor chip 6. The semiconductor chip 1 is mounted, for example, by pressing the pressing jig 31 shown in FIG. 17 against the front surface 6*a* of the semiconductor chip 6 to push and bond the back surface 1*b* of the chip 1 against the front surface 6*a* of the chip 6. Since the semiconductor chip 1 has the film-like adhesive S2 attached to its back surface 1*b* in advance, the semiconductor chip 1 can be mounted by a small pressing force as compared to the case of mounting the semiconductor chip 6. Thus, the damages on the semiconductor chip 1 which might be caused in this step can be suppressed. As shown in FIG. 17, the film-like adhesive S2 does not protrude outward from the outer edge of the back surface 1*b* of the semiconductor chip 1, which can prevent apart of the adhesive from adhering to (polluting) the pad 6*p* of the semiconductor chip 6. Then, a bonding layer of the adhesive S2 is cured to fix the semiconductor chip 1 over the front surface 6*a* of the semiconductor chip 6.

3. Wire Bonding Step

Figure 18:
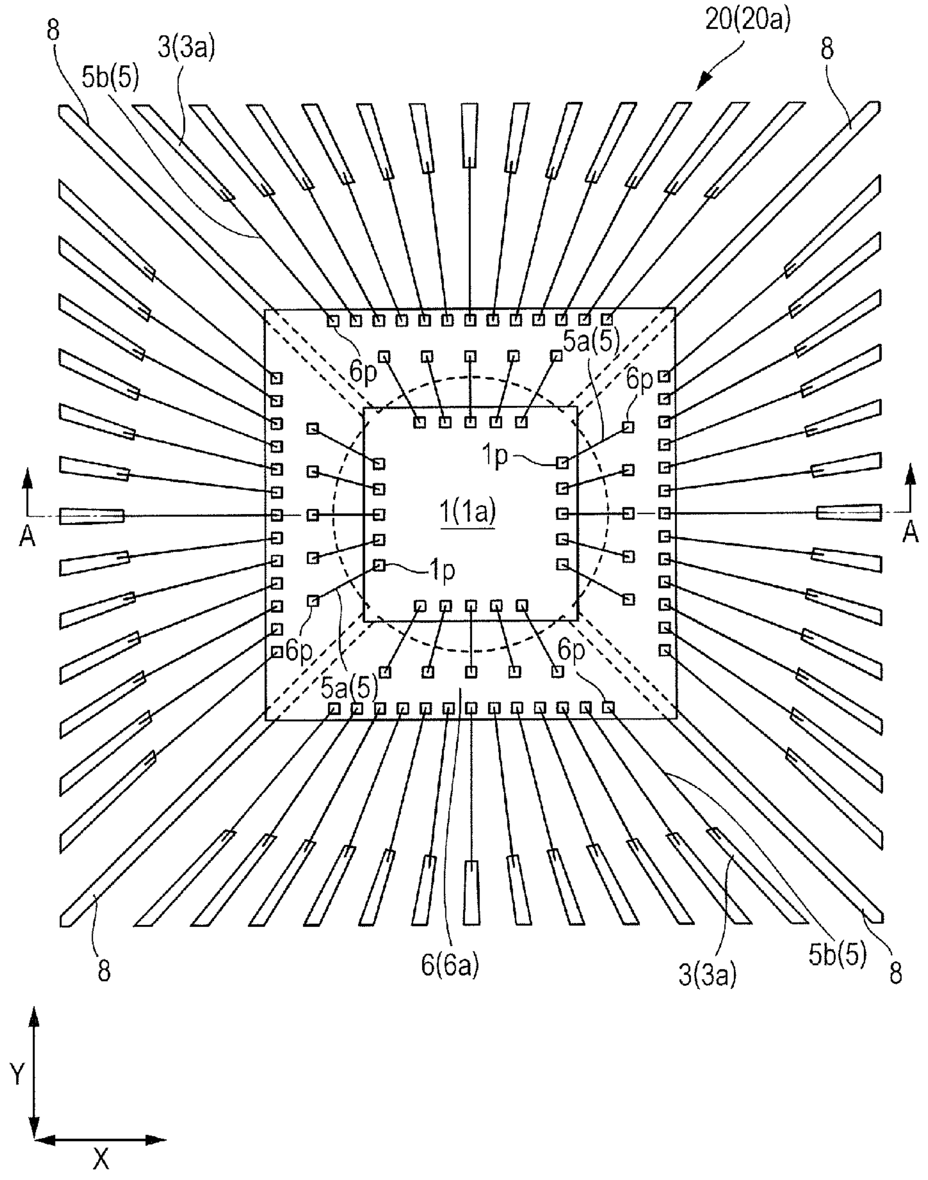
FIG. 18 is a plan view showing the state in which the semiconductor chip shown in FIG. 16 is electrically connected to a plurality of leads via wires.
Figure 19:
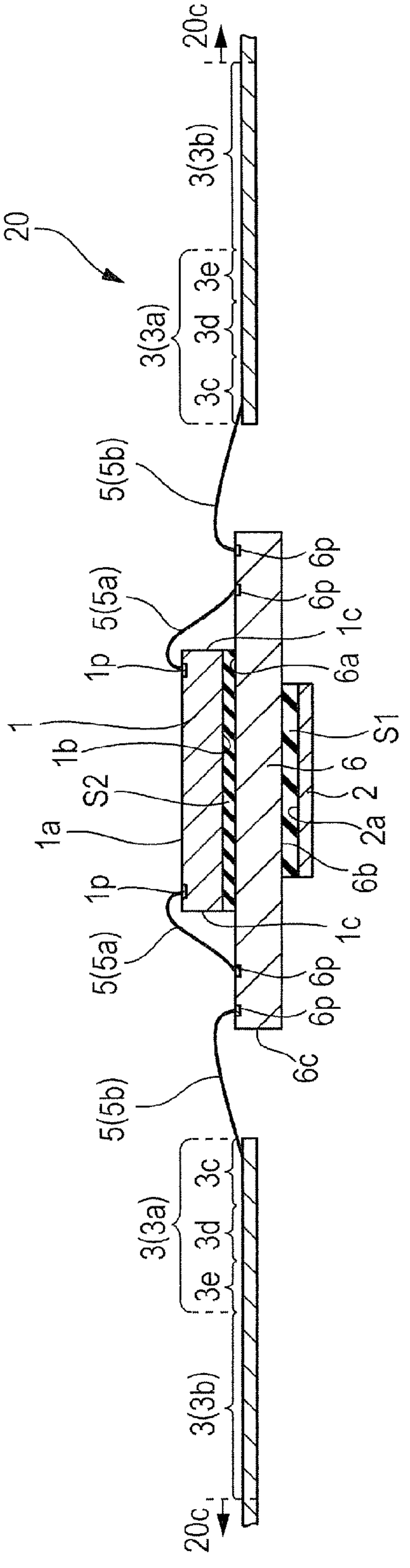
FIG. 19 is an enlarged cross-sectional view taken along the line A-A of FIG. 18

FIG. 18 is a plan view showing the state in which the semiconductor chip shown in FIG. 16 are electrically connected to a plurality of leads via wires. FIG. 19 is an enlarged cross-sectional view taken along the line A-A of FIG. 18.

Then, in the wire bonding step shown in FIG. 10, as shown in FIGS. 18 and 19, the pads of the semiconductor chips and the leads 3 are electrically connected to each other via the wires 5. In this step, the pads 1*p* of the semiconductor chip 1 are electrically connected to the pads 6*p* of the semiconductor chip 6 via the wires 5*a*. Further, the pads 6*p* of the semiconductor chip 6 are electrically connected to the bonding regions 3*c* of the leads 3 (see FIG. 19) via the wires 5*b*.

Figure 20:
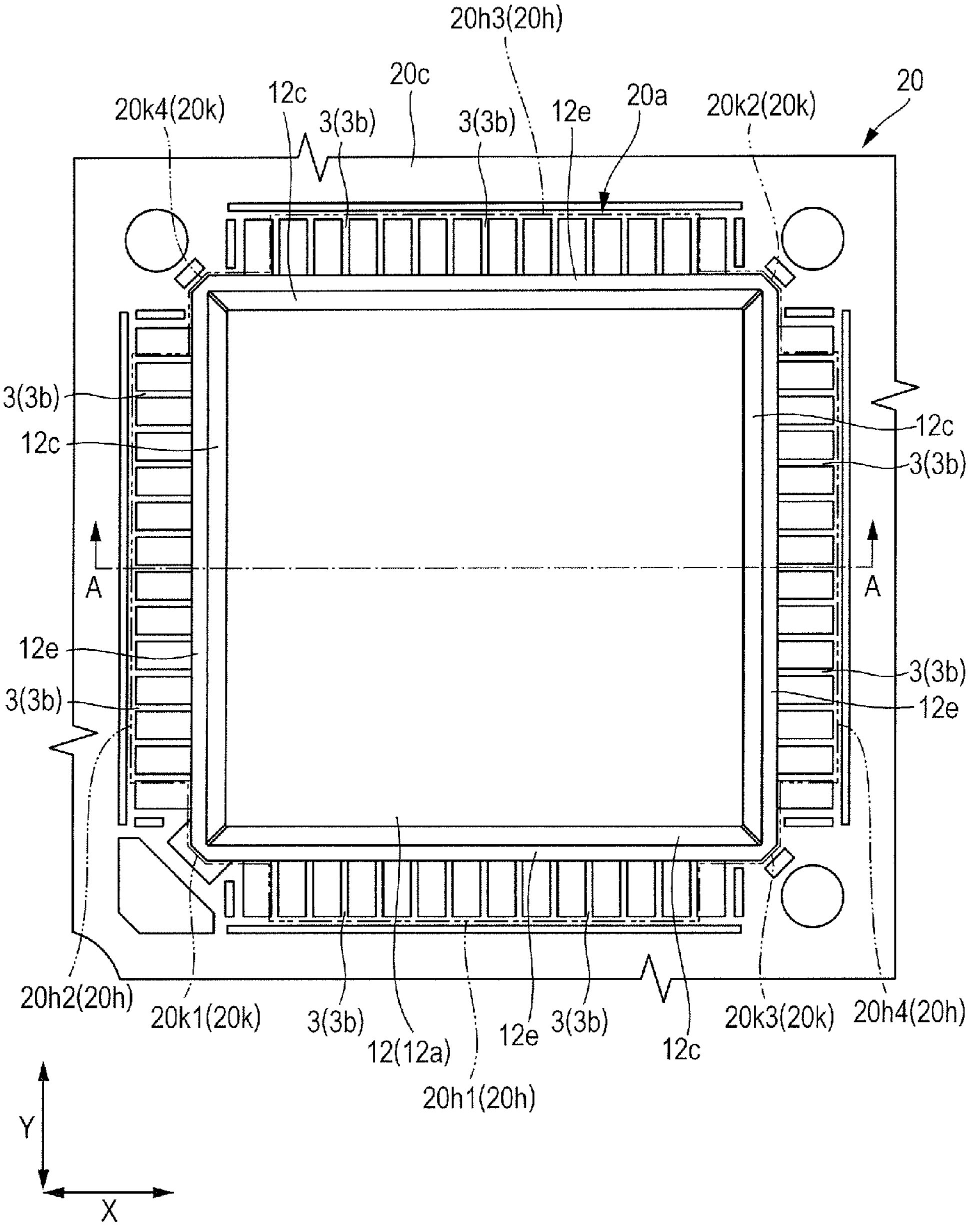
FIG. 20 is an enlarged plan view showing the state in which a cap is bonded and fixed over the leads shown in FIG. 18.
Figure 21:
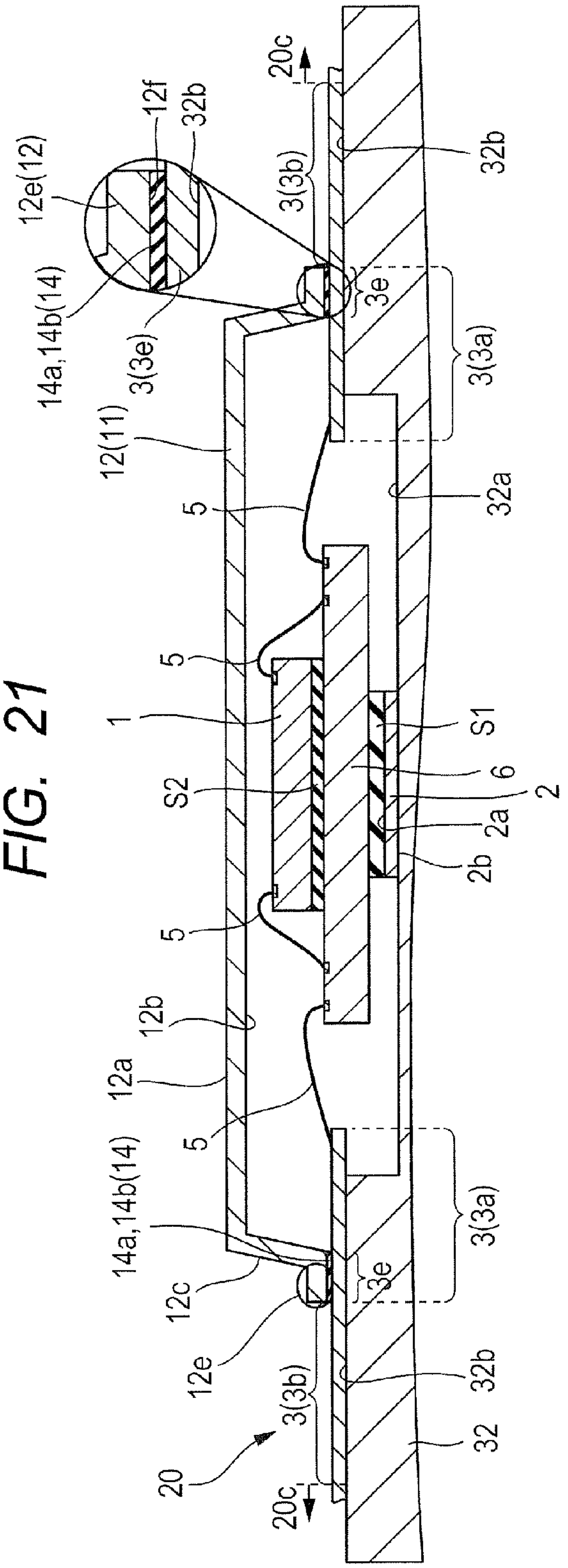
FIG. 21 is an enlarged cross-sectional view taken along the line A-A of FIG. 20.
Figure 22:
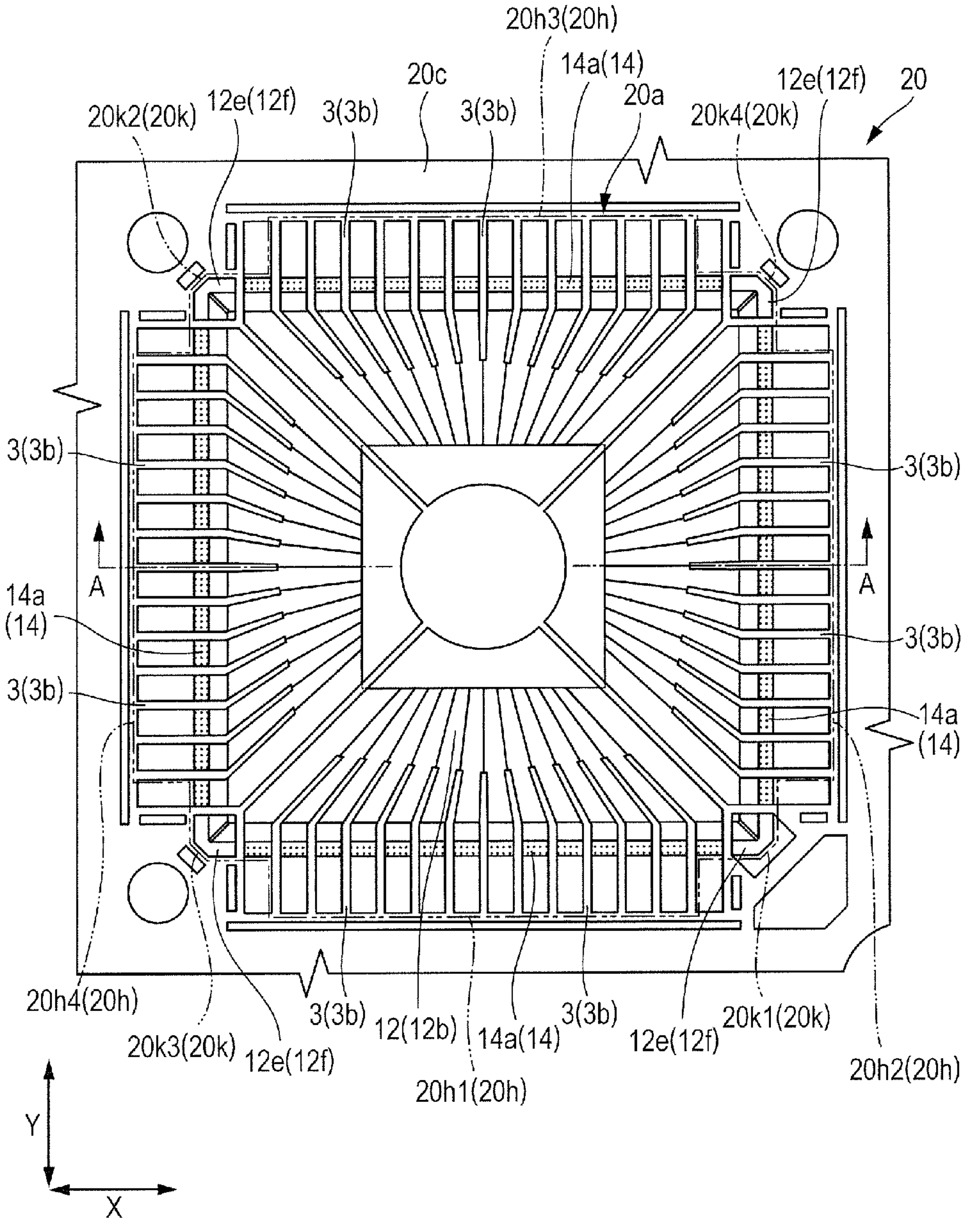
FIG. 22 is an enlarged plan view showing the state in which the top and bottom of the lead frame shown in FIG. 20 are reversed.
Figure 23:
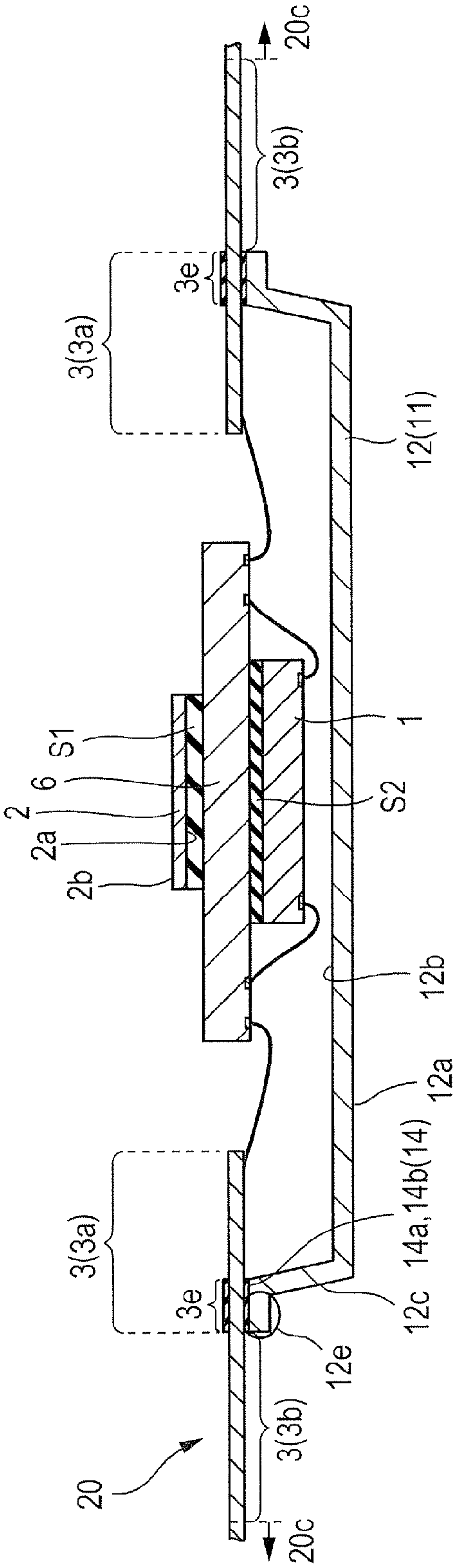
FIG. 23 is an enlarged cross-sectional view taken along the line A-A of FIG. 22.
Figure 24:
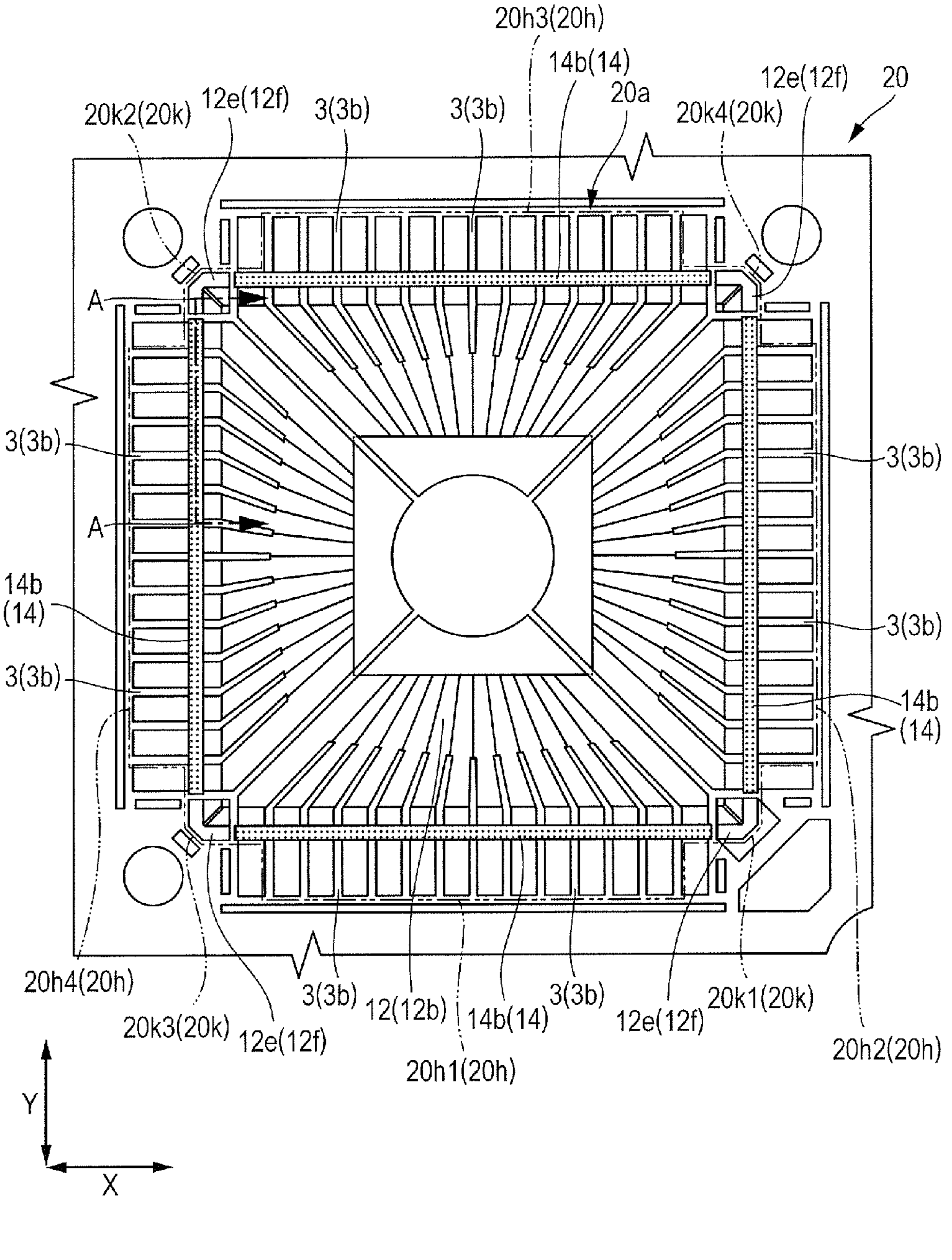
FIG. 24 is an enlarged plan view showing the state in which a sealant is applied over the cap and the leads shown in FIG. 18.
Figure 25:
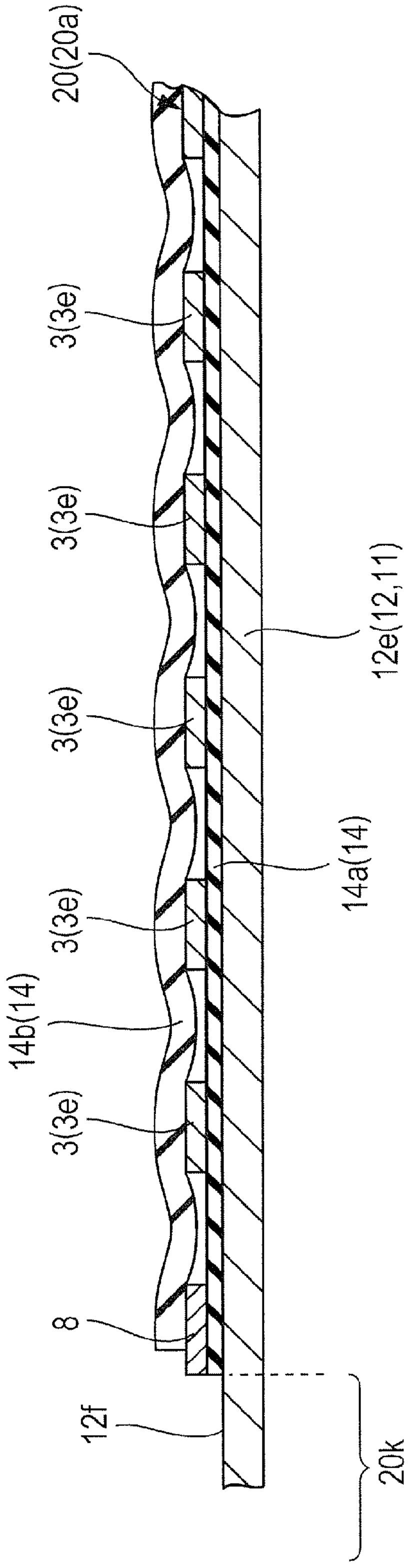
FIG. 25 is an enlarged cross-sectional view taken along the line A-A of FIG. 24.
Figure 26:
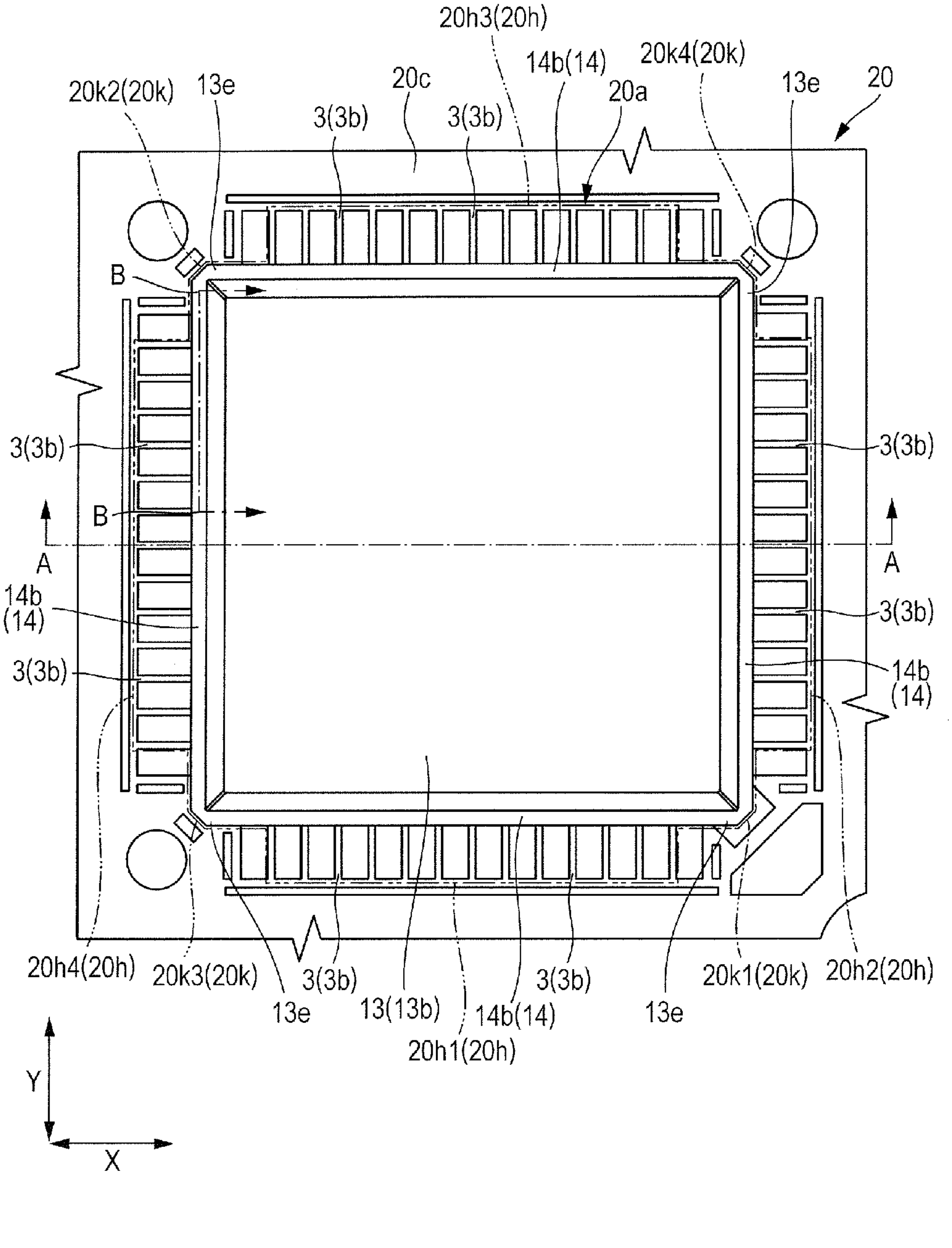
FIG. 26 is an enlarged plan view showing the state in which the cap on the mounting surface side is bonded and fixed via the sealant shown in FIG. 24.
Figure 27:
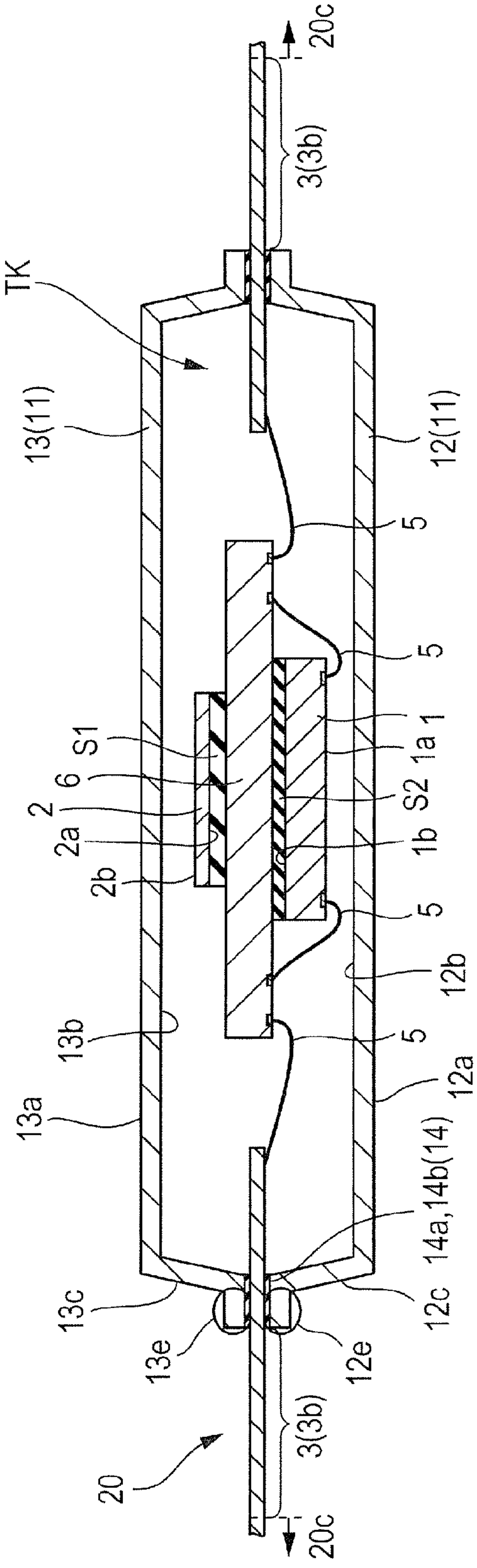
FIG. 27 is an enlarged cross-sectional view taken along the line A-A of FIG. 26.
Figure 28:
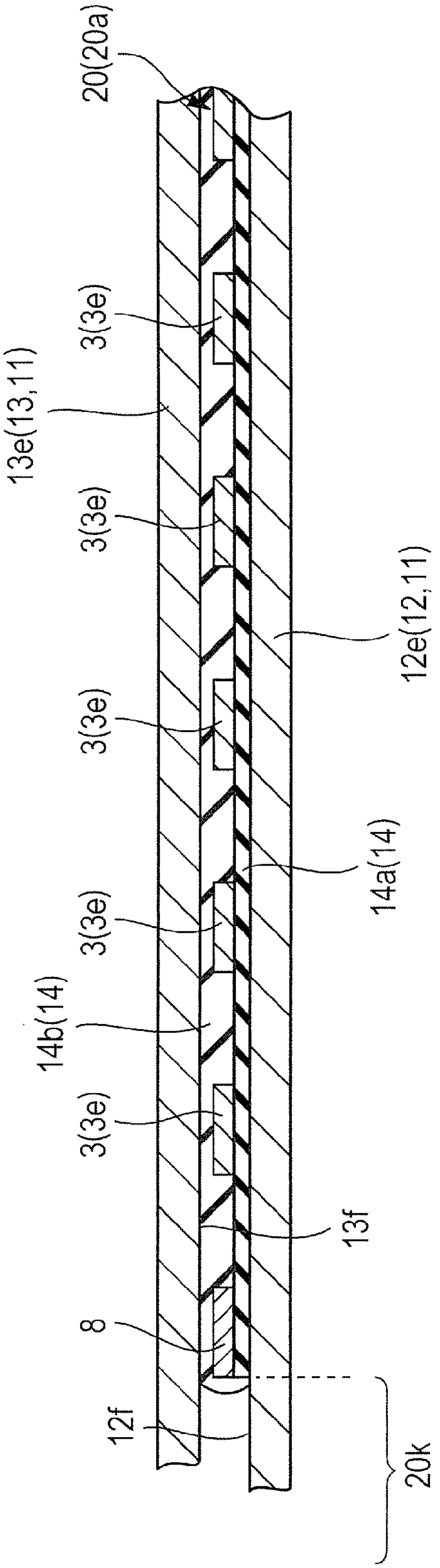
FIG. 28 is an enlarged cross-sectional view taken along the line B-B of FIG. 26.

4. Cap Bonding Step:

FIG. 20 is an enlarged plan view showing the state in which a cap is bonded and fixed over the leads shown in FIG. 18. FIG. 21 is an enlarged cross-sectional view taken along the line A-A of FIG. 20. FIG. 22 is an enlarged plan view showing the state in which the top and bottom of the lead frame shown in FIG. 20 are reversed. FIG. 23 is an enlarged cross-sectional view taken along the line A-A of FIG. 22. FIG. 24 is an enlarged plan view showing the state in which a sealant is applied over the cap and the leads shown in FIG. 18. FIG. 25 is an enlarged cross-sectional view taken along the line A-A of FIG. 24. FIG. 26 is an enlarged plan view showing the state in which the cap on the mounting surface side is bonded and fixed via the sealant shown in FIG. 24. FIG. 27 is an enlarged cross-sectional view taken along the line A-A of FIG. 26. FIG. 28 is an enlarged cross-sectional view taken along the line B-B of FIG. 26.

Then, in the cap bonding step shown in FIG. 10, as shown in FIG. 27, the cap 11 is arranged so as to cover the semiconductor chips 1 and 6 and the wires 5, and bonded to the leads 3 via the sealant 14. In this step, the upper cap 12 and the lower cap 13 are provided as shown in FIG. 27. Then, the upper cap 12 is mounted over the front surface 1*a* side of the semiconductor chip 1, and the lower cap 13 is mounted over the back surface 1*b* side of the semiconductor chip 1.

In the cap bonding step of this embodiment, the order of mounting the upper cap 12 and the lower cap 13 is not limited to the above-mentioned one. However, in order to mount the lower cap 13 while the wires 5 connected to the chips 1 and 6 are protected, preferably, the upper cap 12 is first mounted over the front surface 1*a* side, and then the lower cap 13 is mounted over the back surface 1*b*. Specifically, as shown in FIG. 21, a stage (supporting table) 32 including a concave portion (recessed portion) 32*a* and a lead holder 32*b* arranged around the concave portion 32*a* is provided. Subsequently, the lead frame 20 is placed over the stage 32 such that the leads 3 are located over the lead holder 32*b* and the lower surface 2*b* of the die pad 2 is located over the concave portion 32*a*.

Then, the upper cap 12 is arranged so as to cover the semiconductor chips 1 and 6 and the wires 5 and bonded to the leads 3 via the sealant 14. As shown in FIG. 21, the upper cap 12 includes the outer surface 12*a*, the inner surface (lower surface) 12*b* opposite to the outer surface 12*a*, and the sides 12*c* positioned between the outer surface 12*a* and the inner surface 12*b*. The upper cap 12 has a recessed shape toward the outer surface 12*a*, and includes on the main surface 12*b* side, a recessed portion (space formation portion, concave portion, or chip accommodation portion) 12*d*, and the flange (bonding portion) 12*e* arranged to surround the recessed portion 12*d*. The upper cap 12 is obtained by forming the recessed portion 12*d* and the flange 12*e*, for example, by pressing a flat plate made of koval. A method for forming the upper cap 12 is not limited thereto, and the recessed portion 12*d* and the flange 12*e* (part protruding from the bottom of a flat plate) may be formed by removing (cutting out) a part (center) of one thick flat plate. From the viewpoint of reduction in amount of used material or in weight, the flat plate is preferably shaped, like this embodiment.

The recessed portion 12 has such a planar size that can hold (accommodate) therein the semiconductor chips 1 and 6, the wires 5, and parts of the leads 3 (bonding regions 3*c* shown in FIG. 13). Thus, in this step, the semiconductor chips 1 and 6, the wires 5, and the parts of the leads 3 (bonding regions 3*c*) are covered with the upper cap 12. In other words, in this step, the upper cap 12 is bonded and fixed to the leads 3 so as to cover the semiconductor chips 1 and 6, the wires 5, and the parts of the leads 3 (bonding regions 3*c*). Each of the leads 3 is comprised of the inner lead 3*a* and the outer lead 3*b* which are integrally formed together, and extends from the inner side of the recessed portion 12*d* of the upper cap 12 toward the outside of the recessed portion 12*d* in the planar view.

In this step, in order to embed the sealant 14 in between the adjacent leads 3, a paste-like resin is preferably used. In this embodiment, however, the upper cap 12 and the lower cap 13 (see FIG. 27) are bonded and fixed in that order, and thus the use of the paste-like resin upon bonding the cap to be fixed later (for example, lower cap 13) can fill the gap between the adjacent leads 3 with the sealant 14.

Thus, the cap to be first fixed (for example, upper cap 12) can be bonded and fixed via the film-like (tape-like) sealant 14*a* as shown in FIG. 21. In this case, for example, one bonding surface of the film-like (tape-like) sealant 14*a* is bonded to the bonding surface 12*f* of the upper cap 12 in advance. Then, the upper cap 12 is bonded to the sealing adhesive region 3*e* of the lead 3 with the sealant 14*a* bonded thereto. Thus, the upper cap 12 can be easily bonded and fixed to the leads 3. The sealant application step shown in FIG. 10 involves bonding the film-like (tape-like) sealant 14*a* to the bonding surface 12*f*.

The sealant 14 is not limited to the above film-like sealant 14*a*. The paste-like resin can be used as the sealant 14, like the sealant used for bonding the lower cap 13 to be described later. In this case, the paste-like sealant 14*b* is applied over the sealing regions 3*e* of the leads 3. The upper cap 12 is arranged over the die pad 2 such that the region (sealing adhesive region 3*e*) with the sealant 14 applied is opposed to the bonding surface 12*f* of the flange 12*e* of the upper cap 12. At this time, the semiconductor chips 1 and 6, the wires 5, the bonding regions 3*c* of the leads 3 (see FIG. 19), and the die pad 2 are accommodated in the recessed portion 12*d* of the upper cap 12. The bonding surface 12*f* of the flange 12*e* is pushed against the stage 32 side by pressing the upper cap 12 from the outer surface 12*a* toward the stage 32 by a pressing jig (not shown), so that the sealant 14 is spread to fill the gap between the adjacent leads 3, which bonds the sealing adhesive region 3*e* of each lead 3 to the bonding surface 12*f* of the flange 12*e* via the sealant 14. The details of application of the paste-like sealant 14 are the same as the process of bonding the lower cap 13 to be described later, and thus a repeated description thereof will be omitted below.

Then, as shown in FIGS. 22 and 23, the top and bottom (front and back) of the lead frame 20 are reversed. That is, as shown in FIG. 23, the lead frame 20 is arranged such that the die pad 2 is positioned above the semiconductor chips 1 and 6. As shown in FIG. 22, in this embodiment, the sealant 14 is not arranged at the corner 20*k*. At each corner 20*k*, the bonding surface 12*f* of the flange 12*e* of the upper cap 12 is exposed. This is because the corner 20*k* serves as a supply port (gate) for resin or as an exhaust port (vent) for gas in the sealing body formation step to be described later (see FIG. 10).

Then, as shown in FIGS. 24 and 25, the paste-like sealant 14*b* is applied over the sealing adhesive regions 3*e* of the leads 3 (see FIG. 25), in other words, over the bonding surface 12*f* of the flange 12*e* of the upper cap 12 (see FIG. 25). Subsequently, as shown in FIG. 27, the lower cap 13 is arranged so as to cover the semiconductor chips 1 and 6 and the wires 5, and bonded to the leads 3 via the sealant 14. As shown in FIG. 28, the lower cap 13 is arranged such that the flange 13*e* is opposed to the flange 12*e* of the upper cap 12, and then bonded by pressing the lower cap 13 against the upper cap 12 by a pressing jig (not shown).

As mentioned above, the paste-like sealant 14*b* has such a viscosity that can hold the shape of application (for example, the shape shown in FIG. 25). Thus, the sealant 14*b* can be prevented from spreading over the surroundings of the application region until the lower cap 13 (see FIG. 27) is bonded after the application of the sealant 14*b*.

The leads 3 are positioned in a region (bonding region) where the sealant 14*b* is to be applied, and thus the region has a rough corrugated surface as compared to the bonding surface 12*f* of the upper cap 12. Thus, as shown in FIG. 25, in the stage where the sealant 14*b* is applied, a gap is formed among the sealant 14*b*, the upper cap 12, and the adjacent leads 3 in some cases. As shown in FIG. 28, however, the lower cap 13 can be pressed to spread the paste-like sealant 14*b*, whereby the sealant 14 can be embedded in the gap between the adjacent leads 3. In particular, the use of the sealant 14*b* having a viscosity lower than that of the paste-like adhesive S1 shown in FIG. 15 improves the embedding property, which can effectively prevent the generation of the gap not filled with the sealant 14*b*.

As shown in FIG. 24, the sealant 14*b* is not applied to the corner 20*k* in the product formation region 20*a*. For example, as shown in FIG. 25, when the suspension lead 8 is positioned near the end of a group of the leads 3 arranged in parallel, the sealant 14*b* is continuously applied to cover the sealing regions 3*e* of the leads 3, but the application of the sealant 14*b* is stopped in the position where the sealant is superimposed over the suspension lead 8. As shown in FIG. 28, when the flange 13*e* of the lower cap 13 is pressed against the flange 12*e* of the upper cap 12, the gap between the adjacent leads 3 is filled with the sealant 14*b*, which can prevent the sealant 14*b* from spreading over each corner 20*k*. Thus, the sealant 14 is embedded in the gap between the adjacent leads 3 and the gap between the suspension lead 8 and the lead 3, so that an opening is formed at each corner 20*k* of the product formation region 20*a* (see FIG. 26).

Then, when the paste-like sealant 14*b* is heated and cured, the bonding surface 12*f* of the flange 12*e* of the upper cap 12 and the bonding surface 13*f* of the flange 13*e* of the lower cap 13 are bonded and fixed to the cured sealant 14. In this embodiment, the sealant 14*b* contains, for example, thermosetting epoxy resin, and thus can be heated to be cured.

Referring to FIGS. 24 and 25, one example of a method for applying the sealant 14 has been described above. As shown in FIG. 28, however, as long as the sealant 14 is embedded in between the adjacent leads 3 and the opening is formed at each corner 20 in the stage where the upper cap 12 is bonded to the lower cap 13, the application method is not specifically limited. For example, in the form shown in FIGS. 24 and 25, the paste-like sealants 14*b* are arranged in a strap shape along the periphery of the upper surface 2*a* of the die pad 2. In a modified example, paste-like sealants 14 are discontinuously arranged in a plurality of positions of the sealing adhesive regions 3*e* of the leads 3, that is, the so-called multi-point coating can be employed. Even in the multi-point coating, the lower cap 13 is pressed to spread the paste-like sealant 14*b*, so that the sealant 14*b* can be embedded in the gap between the leads 3. For example, referring to FIGS. 24 and 25, the application of the paste-like sealant 14*b* over the leads 3 has been explained above. A member to which the sealant 14*b* is applied is not limited to the lead 3. For example, the sealant 14*b* can be applied to the bonding surface 13*f* of the flange 13*e* of the lower cap 13. Alternatively, for example, the sealant 14*b* can be applied to both the bonding surface 13*f* of the lower cap 13 and the sealing adhesive regions 3*e* of the leads 3.

Through the above steps, the upper cap 12 and the lower cap 13 are bonded and fixed together with the recessed portions 12*d* and 13*d* opposed to each other. After bonding and fixing the lower cap 13, as shown in FIG. 27, the semiconductor chips 1 and 6, the wires 5, and the parts of the leads 3 (bonding regions 3*c*) are positioned within a space TK formed by superimposing the recessed portion 12*d* of the upper cap 12 over the recessed portion 13*d* of the lower cap 13.

In this step, the upper cap 12 and the lower cap 13 made of metal are bonded and fixed together via the sealant 14 made of insulating material so as not to be brought into contact with the leads 3.

5. Seal Member Formation Step

Figure 29:
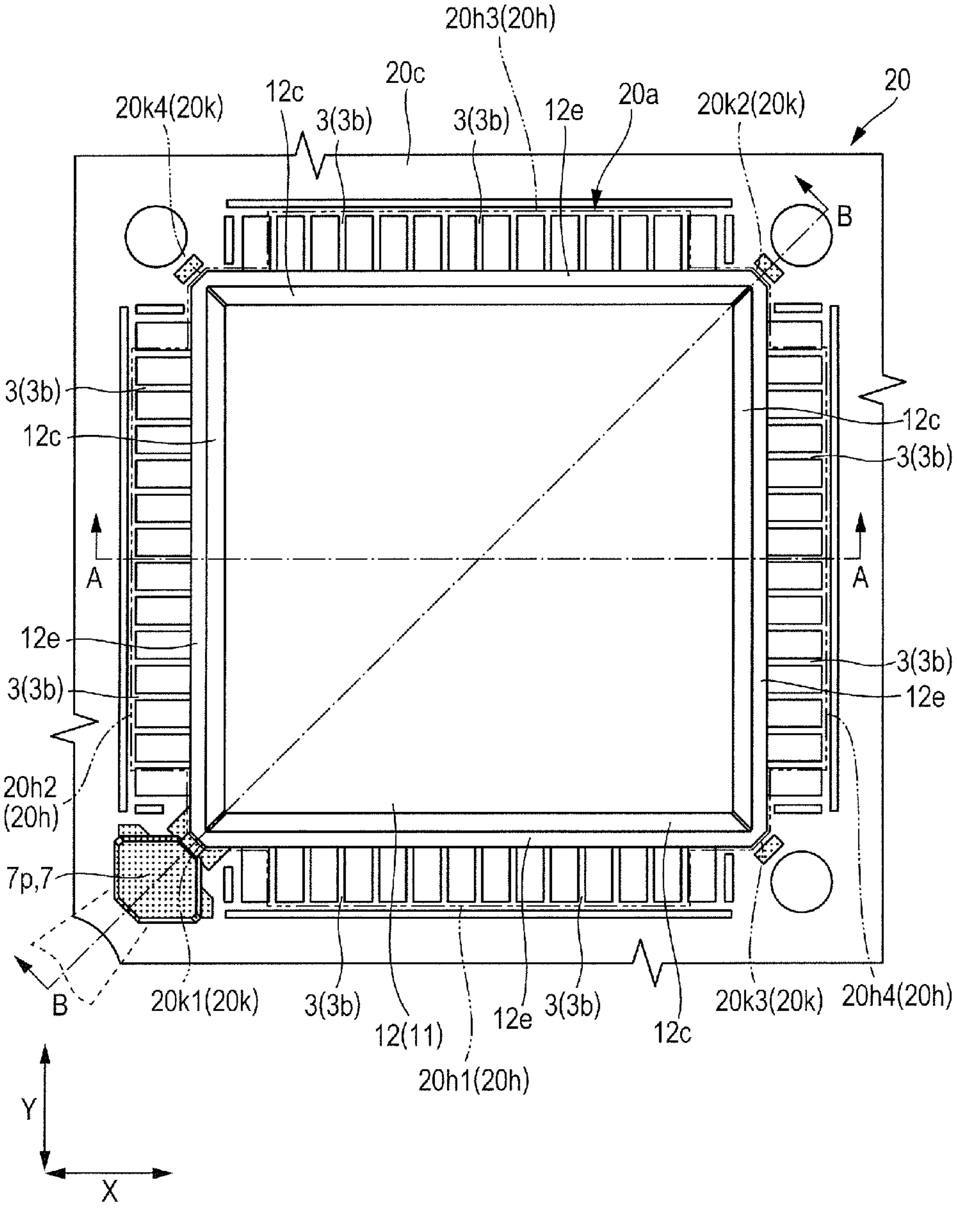
FIG. 29 is an enlarged plan view showing the state in which a sealing body is formed in the product formation region of the lead frame shown in FIG. 20.
Figure 30:
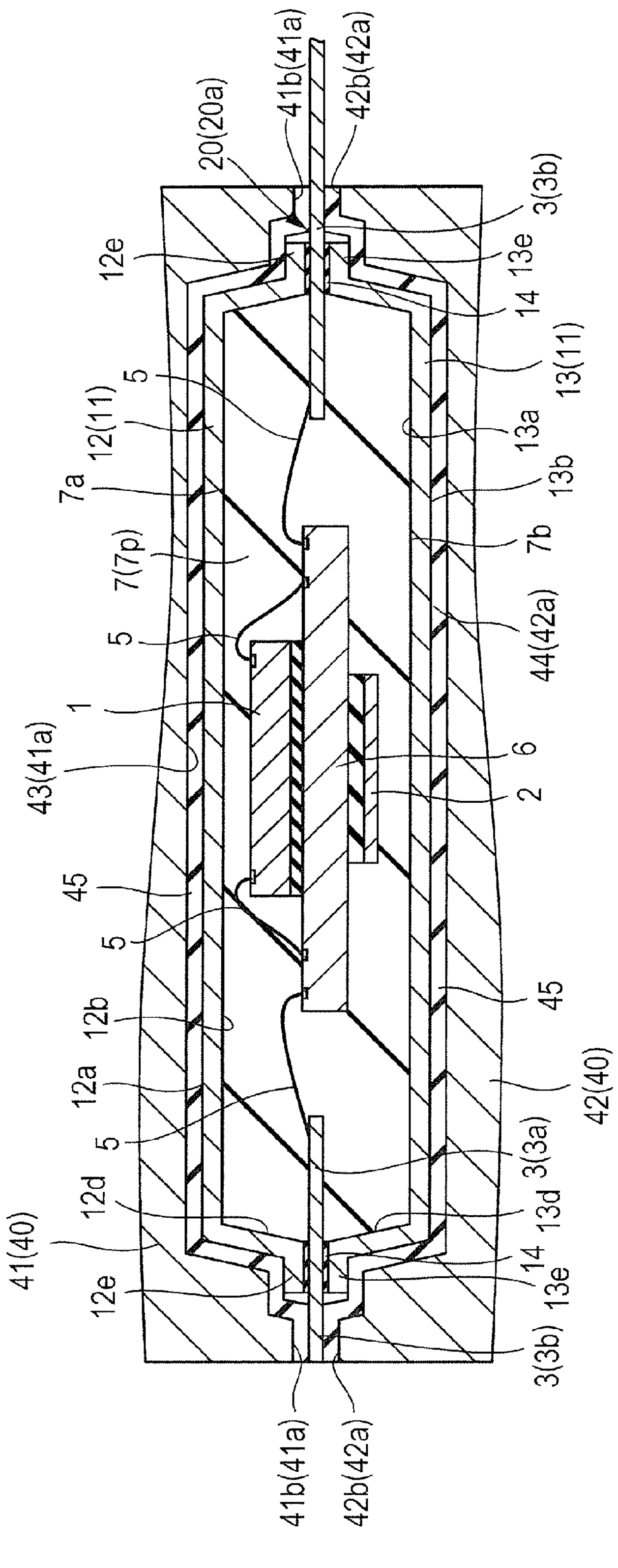
FIG. 30 is an enlarged cross-sectional view taken along the line A-A of FIG. 29.
Figure 31:
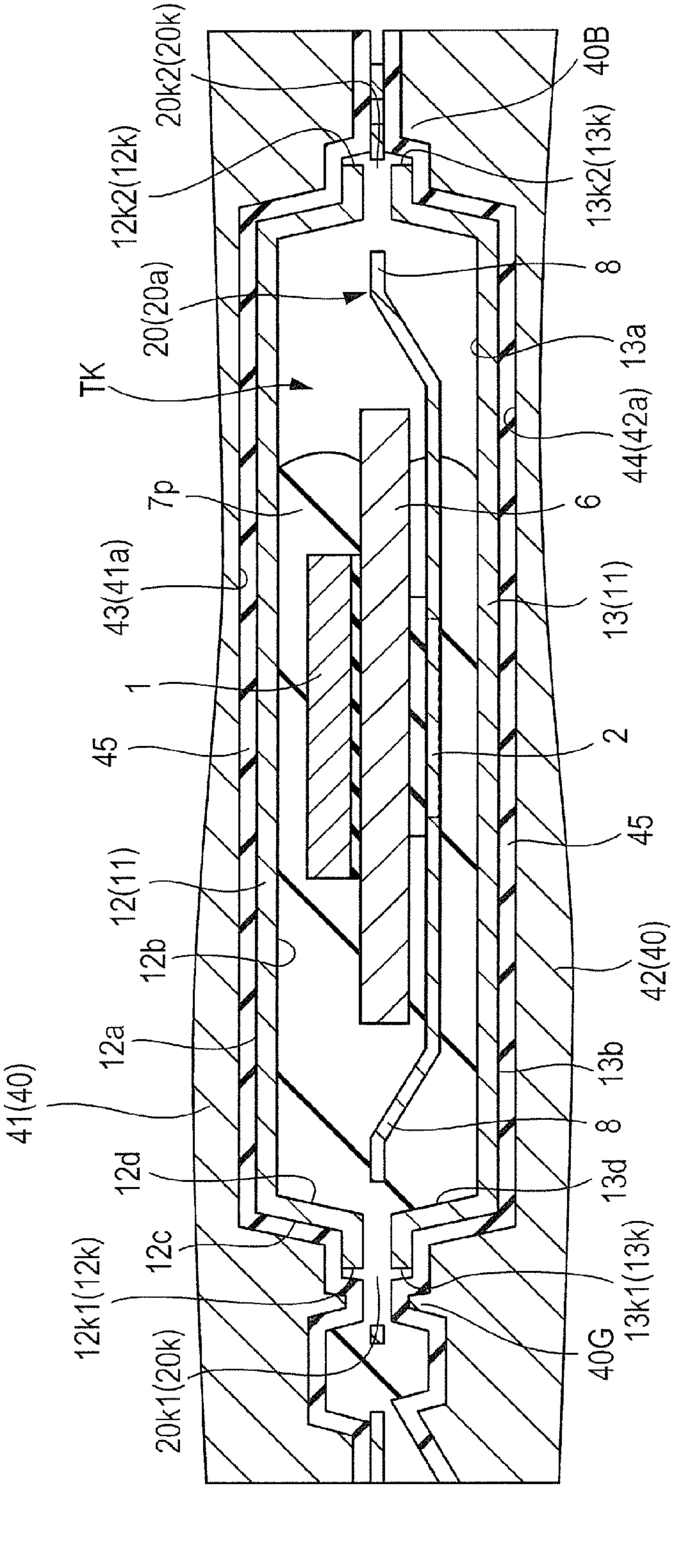
FIG. 31 is an enlarged cross-sectional view showing the state in which the resin for sealing is supplied into a space formed by the cap shown in the cross-sectional view taken along the line B-B of FIG. 29.

FIG. 29 is an enlarged plan view showing the state in which the sealing body is formed in the product formation region of the lead frame shown in FIG. 20. FIG. 30 is an enlarged cross-sectional view taken along the line A-A of FIG. 29. FIG. 31 is an enlarged cross-sectional view showing the state in which the resin for sealing is supplied to a space formed by the cap, and taken along the line B-B of FIG. 29.

Then, in the sealing body formation step shown in FIG. 10, as shown in FIGS. 29 to 31, resin 7*p* is supplied into a space TK (see FIG. 31) formed by the upper cap 12 and the lower cap 13, so that the wires 5 (see FIG. 30) and the semiconductor chips 1 and 6 (see FIGS. 30 and 31) are sealed with the resin 7*p*.

The sealing body 7 in this embodiment is formed by the so-called transfer molding. That is, as shown in FIG. 31, the lead frame 20 is fixed between an upper die 41 and a lower die 42 of a molding die 40. Subsequently, the thermosetting resin (resin 7*p*) softened (which becomes plastic) is supplied (pressed) into the space TK between the upper cap 12 and the lower cap 13 to be molded, and then heated and cured. The thermosetting resin (resin 7*p*) used in this embodiment contains resin, and fillers (particles) mixed into the resin.

The transfer molding is preferable in effectively manufacturing because the sealing body 7 can be formed in the product formation regions 20*a* by one operation. In the transfer molding, the softened resin 7*p* is supplied into the space TK, so that the resin 7*p* can easily adhere to the lower surface (inner surface) 12*b* of the upper cap 12 and the upper surface (inner surface) 13*a* of the lower cap 13. That is, as shown in FIG. 30, the sealing body 7 adheres to the cap 11, which can effectively transfer heat from the sealing body 7 to the cap 11.

In this step, first, a molding die 40 is provided as shown in FIGS. 30 and 31. The molding die 40 includes an upper die (first die) 41 covering the upper surface (surface with the semiconductor chip mounted) side of the lead frame 20, and a lower die (first die) 42 covering the lower surface (surface opposite to the surface with the semiconductor chip mounted) of the lead frame 20. The upper die 41 includes a cavity (concave portion, cap pressing portion, lid pressing portion) 43. The lower die 42 includes a cavity (concave portion, cap pressing portion, lid pressing portion) 44. The cavity 43 and the cavity 44 are opposed to and superimposed over each other, thereby forming a space for accommodating therein the cap 11.

The cavities 43 and 44 have the similar shape to that of the upper cap 12 and the lower cap 13. A resin film 45 is attached to each of an inner surface (lower surface) 41*a* of the upper die 41 and an inner surface (upper surface) 42*a* of the lower die 42 along the shape of each of the inner surfaces 41*a* and 42*a*. In other words, the resin film 45 is arranged between the cavity 43 and the upper cap 12, and between the cavity 44 and the lower cap 13. The resin film 45 is softer than the molding die 40 and the cap 11. In other words, the resin film 45 has a higher elasticity than that of each of the molding die 40 and the cap 11. Thus, when the cap 11 is sandwiched (clamped) between the upper die 41 and the lower die 42, the resin film 45 enters the gap 11, which can prevent the leakage of the resin 7*p*. That is, the resin 79 can be supplied into the space TK. Now, a molding method using the resin film 45 is called "laminate molding".

In this embodiment, the resin 7*p* is supplied while the entire surroundings of the upper cap 12 and the entire surroundings of the lower cap 13 are being pressed by the molding die 40 by way of example. The region to which the resin 7*p* is supplied is already covered with the upper cap 12 and the lower cap 13, and the bonding portion between the upper cap 12 and the lower cap 13 is fixed together by the hardened sealant 14. Thus, the resin 7*p* can be supplied into the space TK by pressing at least the supply port of the resin 7*p*. A balanced force (clamping force) is applied to the entire cap 11. For the purpose of stably supplying the resin 7*p*, the resin 7*p* is preferably supplied with the entire surroundings of the upper cap 12 and the entire surroundings of the lower cap 13 pressed by the molding die 40, like this embodiment.

As shown in FIG. 30, a die surface (clamping surface) 41*b* is arranged around a cavity 43 of the upper die 41. A die surface (clamping surface) 42*b* is arranged around a cavity 44 of the lower die 42 to be opposed to the die surface 41*b*. The molding die 40 fixes the lead frame 20 between the upper die 41 and the lower die 42 by pressing and sandwiching the lead frame 20 between the die surfaces 41*b* and 42*b* opposed to each other.

As shown in FIG. 31, the molding die 40 includes a gate 40G serving as a supply port for the resin 7*p*, and a vent 40B serving as an exhaust port for gas (air) in the space TK, or excessive resin 7*p*. In this embodiment, the product formation region 20*a* shown in FIG. 29 has the four corners 20*k*. At one corner 20*k*1, the gate 40G (see FIG. 31) is arranged, and at the remaining three corners 20*k*2, 20*k*3, and 20*k*4, the vents 40B (see FIG. 31) are arranged. In other words, the resin 7*a* is supplied from the corner 20*k*1 among the four corners of the product formation region, and gas is exhausted from other corners 20*k*2, 20*k*3, and 20*k*4. Thus, the gas is exhausted from the corners 20*k*, which can hardly leave air bubbles (voids) in the space TK.

As shown in FIG. 28 used in the description of the cap bonding step, the sealant 14 is embedded in between the adjacent leads 3, and between the suspension lead 8 and the lead 3, and an opening is formed at each corner 20*k* of the product formation region 20*a* (see FIG. 26). This step uses the openings formed at the corners 20*k* without the sealant 14, as the supply port (opening) for supplying the resin 7*p* and the exhaust port (opening) for exhausting gas. In other words, in this embodiment, the resin 7*p* is supplied (pressed) into the opening formed between the corner 12*k*1 and the corner 13*k*1 shown in FIG. 31. In this step, gas is exhausted into the cap 11 from the openings formed at the corners 12*k* other than the corner 12*k*1, and the corners 13*k* other than the corner 13*k*1.

As shown in FIG. 31, the system with the gate 40G arranged at the side of the cavity 43 is called side gate system. In the transfer molding system, the resin 7*p* is supplied from the gate 40G into the space TK shown in FIG. 31. In the space TK, the resin spreads over the surroundings of the die pad 2 and the semiconductor chips 1 and 6 to seal the entire components inside the space TK. The gas (air) in the space TK is pressed by the supply pressure of the resin 7*p* to be exhausted from the vent 40B.

The suspension lead 8 extending from the die pad 2 toward the corner 20*k*1 as shown in FIG. 12 is branched into a plurality of pieces (two) between the corner 12*k* and the die pad 2 so as to avoid the corner 12*k* of the upper cap 12. Thus, an area of the opening between the corners 12*k*1 and 13*k*1 shown in FIG. 31 can be widened, thereby effectively supplying the resin 7*p* from the opening.

Generally, when the sealing body is formed by the transfer molding using the molding die, a member for connecting the adjacent leads 3, which is called the dambar (diver), is provided. In applying the transfer molding, the dambar is provided for preventing the leakage of the resin 7*p* from the gap between the adjacent leads 3. In this embodiment, however, in the cap bonding step, the sealant 14 is embedded in between the adjacent leads 3. The sealant 14 has a function of preventing the leakage of the resin 7*p* in application of the transfer molding. In other words, in the sealing body formation step, the adjacent leads 3 are connected together via the sealant 14 comprised of an insulating material. Thus, after the sealing body formation step, a step of removing the dam (sealant 14) (in the dam removal step) is unnecessary. That is, this embodiment can cut a part of the manufacturing step, thereby improving the manufacturing efficiency.

In order to effectively transfer heat from the sealing body 7 to the cap 11, the air bubbles (voids) remaining inside the cap 11 is preferably reduced. From the viewpoint of reducing the air bubbles, since air bubbles (voids) remaining in the resin 7*p* is forcedly exhausted after the space TK shown in FIG. 31 is filled with the resin 7*p*, a pressure higher than the supply pressure (void removal pressure) is preferably applied to the inside of the space TK.

The method for removing air bubbles is not limited to the above. The so-called decompression molding can be applied which involves, for example, arranging the lead frame 20 in a decompression chamber (not shown) (vacuum chamber or the like), and supplying the resin 7*p* into the space TK. In this case, even when the supply pressure of the resin 7*p* is set low, the air babbles can be prevented from remaining, which can reduce stress on the sealant 14. The above method for applying a pressure (void removal pressure) higher than the above supply pressure to the space TK is advantageous in that the air bubbles can be removed without using the decompression chamber or the like, as compared to the decompression molding.

As mentioned above, after filling the space TK with the resin 7*p* to remove the air bubbles (voids), the resin 7*p* is heated to be cured, which forms the sealing body 7 shown in FIG. 30. In the heating step (baking step), for example, the resin 7*p* is temporarily cured in the molding die 40 (while the whole resin 7*p* is not cured with its shape kept even after being removed from the molding die 40). Thereafter, the lead frame 20 is taken out of the molding die 40, and transferred to a heating furnace (not shown), and then the resin 7*p* is completely cured (which hardens the whole resin 7*p*).

The sealing body 7 formed in the above steps has its upper surface 7*a* adhering to the inner surface 12*b* of the upper cap 12 as shown in FIG. 30. The lower surface 7*b* of the sealing body 7 adheres to the inner surface (upper surface) 13*a* of the lower cap 13. As shown in FIG. 29, the sealing body 7 is exposed from the cap 11 at the corners 20*k* of the product formation region 20*a*, serving as the supply port for the resin 7*p*, or the exhaust port for gas. The exposed part of the sealing body 7, however, is arranged at the corner 12*k*, which can separate the exposed part of the sealing body 7 from the wires 5 (see FIG. 30). Even when cracks are caused in the exposed part of the sealing body 7, the possibility of the cracks reaching the wires 5 can be reduced. The upper surface 7*a* of the sealing body 7 is covered by the upper cap 12, which can prevent the generation of cracks.

6. Lead Formation Step

Figure 32:
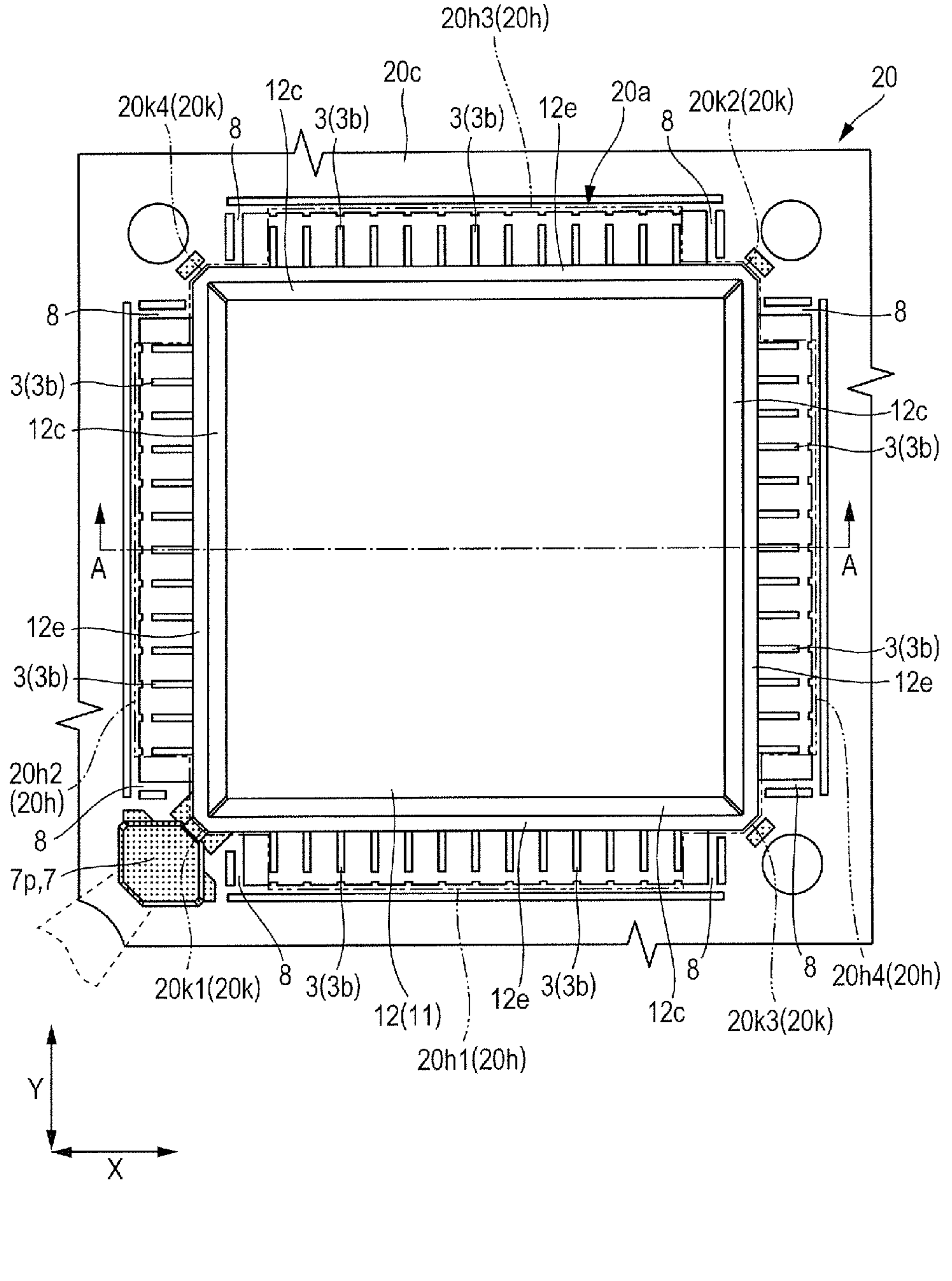
FIG. 32 is an enlarged plan view showing the state in which outer leads shown in FIG. 29 are cut to shape the product formation region.

FIG. 32 is an enlarged plan view showing the state of formation of the product formation region from which outer leads shown in FIG. 29 are cut. An enlarged cross-sectional view taken along the line A-A shown in FIG. 32 is the same as that in FIG. 4, and thus will be omitted herein. Now, a lead formation step will be described below with reference to FIG. 4.

Next, in the lead formation step shown in FIG. 10, as shown in FIG. 32, the outer leads 3*b* of the leads 3 are cut out of the frame portion 20*c*. Thereafter, as shown in FIG. 4, each of the outer leads 3*b* of the leads 3 is formed in the gull-wing shape. The way to cut the outer leads 3*b* of the leads 3 involves placing a punch (cutting blade) (not shown) on the upper surface side of the lead frame 20 and a die (supporting jig) (not shown) on the lower surface side thereof, and cutting the outer leads 3*b* by pressing the punch against the die. The way to shape the outer leads 3*b* of the leads 3 can involve pressing the outer lead using a punch and die for shaping. In this step, the leads 3 are respectively separated into individual members. In this step, the leads 3 are separated from the lead frame 20. Thus, unless each component within the product formation region 20*a* is supported by the frame portion 20*c* of the lead frame 20, the shaping becomes difficult. In this embodiment, the suspension leads 8 are arranged in a region where the leads 3 are not arranged. For example, as shown in FIG. 7, the suspension leads 8 are sealed with the sealing body 7. Thus, until the piece separating step is completed as will be described later, the product formation region 20*a* is connected to and supported by the frame portion 20*c* of the lead frame 20 via the suspension lead 8.

Figure 33:
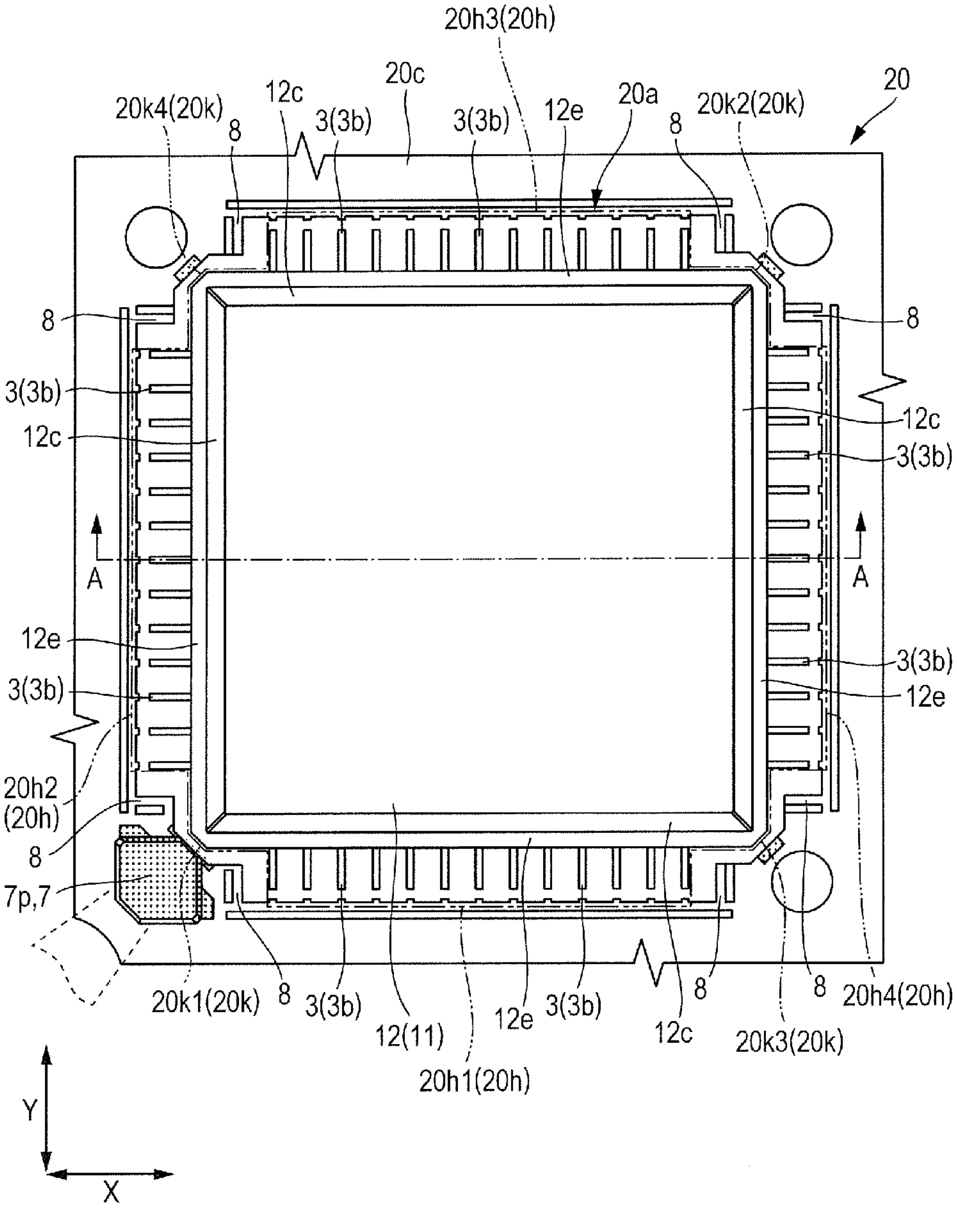
FIG. 33 is an enlarged plan view showing the state in which the product formation region shown in FIG. 32 is separated from a frame portion of the lead frame, and formed as singulation.

7. Singulation Step:

FIG. 33 is an enlarged plan view showing the state in which the product formation region shown in FIG. 32 is separated from the frame portion of the lead frame and formed as singulation.

Then, in the piece separating step shown in FIG. 10, as shown in FIG. 33, the product formation regions 20*a* are separated from the frame portion 20*c* of the lead frame 20 so that the singulation is performed. In this step, the suspension lead 8 serving as a connecting portion for connecting the product formation region 20*a* with the frame portion 20*c* is cut by being pressed using a punch (cutting blade) and a die (supporting die) (not shown), for example. At this time, the gate resin formed in the gate portion 40G, and the vent resin formed in the vent 40B are respectively removed by the punch.

In the above respective steps, the semiconductor device 10 shown in FIGS. 1 to 9 is obtained. This embodiment uses the lead frame 20 with the product formation regions 20*a* as shown in FIG. 11, so that a plurality of semiconductor devices 10 can be obtained from one piece of the lead frame 20. Thereafter, necessary checking and tests, such as an external appearance check and an electric test, are performed on each semiconductor device, which is then shipped, or mounted over a mounting substrate (not shown).

As shown in FIG. 13 used in the description of the lead frame providing step, in the lead frame 20 of this embodiment, a metal film (plating film) MM made of, for example, nickel (Ni) or nickel-palladium (Ni—Pd), is previously formed over the entire front surface (upper surface, lower surface, and sides) of the substrate 21 made of copper (Cu). That is, when the semiconductor device 10 is mounted over the mounting substrate (not shown) as shown in FIG. 4, the outer lead 3*b* connected to the terminal on the mounting substrate side is covered with the metal film MM made of nickel (Ni) or nickel-palladium (Ni/Pd). The metal film MM has a function of improving the wettability of the solder serving as a bonding member when mounting the semiconductor device 10 over the mounting substrate. In FIG. 10, the plating step represented in a bracket can be omitted.

In a modified example, when the metal film (plating film) MM made of nickel-palladium (Ni/Pd) is not formed over the outer lead 3*b*, a plating step is performed after the sealing body formation step as shown in the bracket of FIG. 10. In the plating step shown in FIG. 10, for example, a metal film (exterior plating film) made of solder is formed over the leads 3 (outer leads 3) exposed from the sealing body 7. In this step, the lead frame 20 as an object to be plated is arranged in a plating tank (not shown) filled with a plating solution (not shown), which forms the exterior plating film by electrolytic plating. The electrolysis plating method can form the exterior plating films in regions exposed from the sealing body 7 by one operation. The exterior plating film is formed over each of the upper surface, lower surface, and sides of each of the outer leads 3*b*. The sealant 14 made of insulating material intervenes in between each of the caps 12 and 13 and the lead 3, as mentioned above. Thus, in using the lead frame 20 as an electrode, the upper cap 12 and the lower cap 13 are not energized, and the exterior plating film is not formed at the cap 11. In order to prevent the oxidation of the cap 11, preferably, a metal film (plating film) is previously formed over the front surface of the cap 11 before bonding the cap 11 to the leads 3.

Second Embodiment

As a modified example of the semiconductor device 10 described in the first embodiment, this embodiment will describe a package structure using a cap made of a flat plate without forming a cavity in the cap arranged on the back surface side of the semiconductor chip. This embodiment will describe differences from the semiconductor device and the manufacturing method thereof described in the first embodiment, and a description of the parts common to these embodiments will be omitted below. As to drawings, the drawings required for explaining the differences from the first embodiment are shown according to the necessity, and in some cases, the drawings used for the description of the first embodiment are cited for the description below.

<Differences in Structure from First Embodiment>

Figure 34:
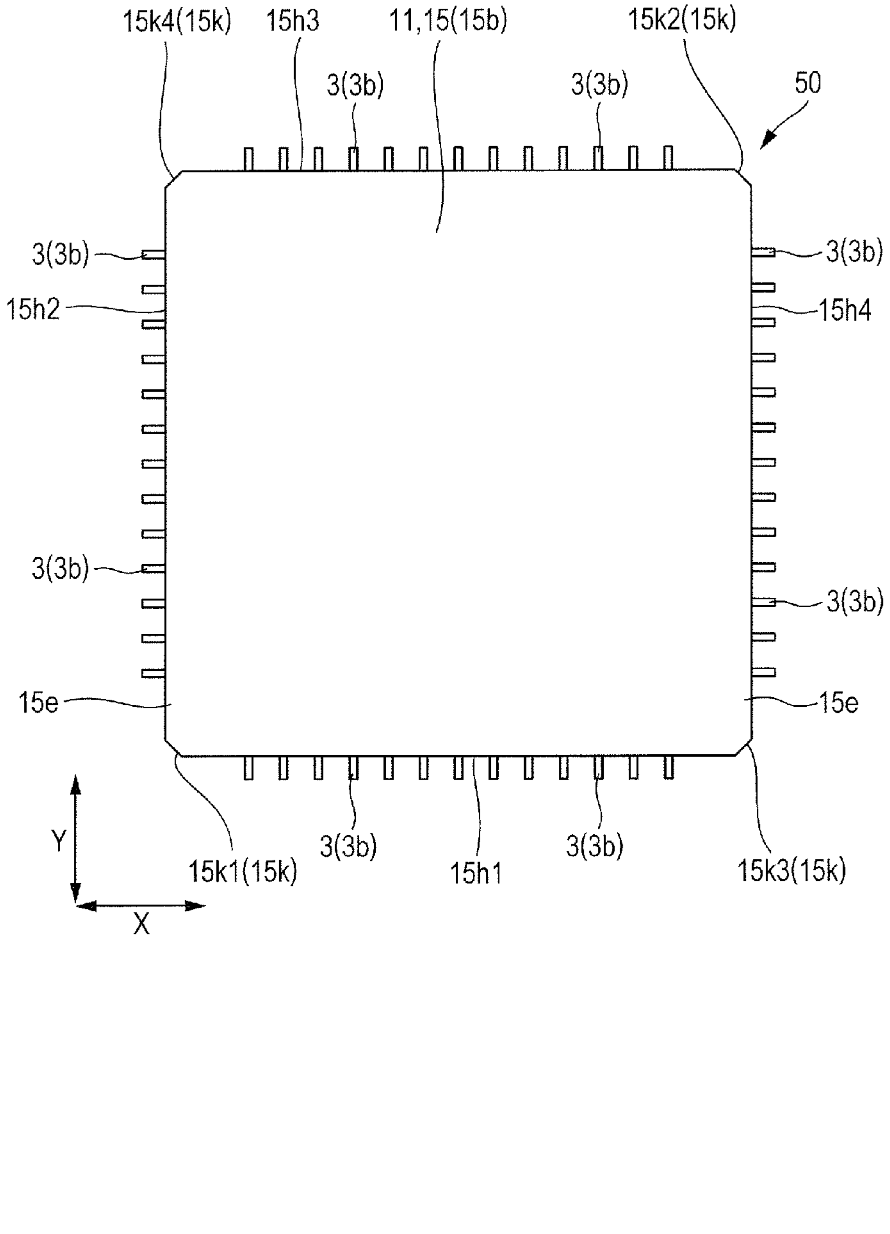
FIG. 34 is a plan view showing a lower surface of a semiconductor device as a modified example of FIG. 2.
Figure 35:
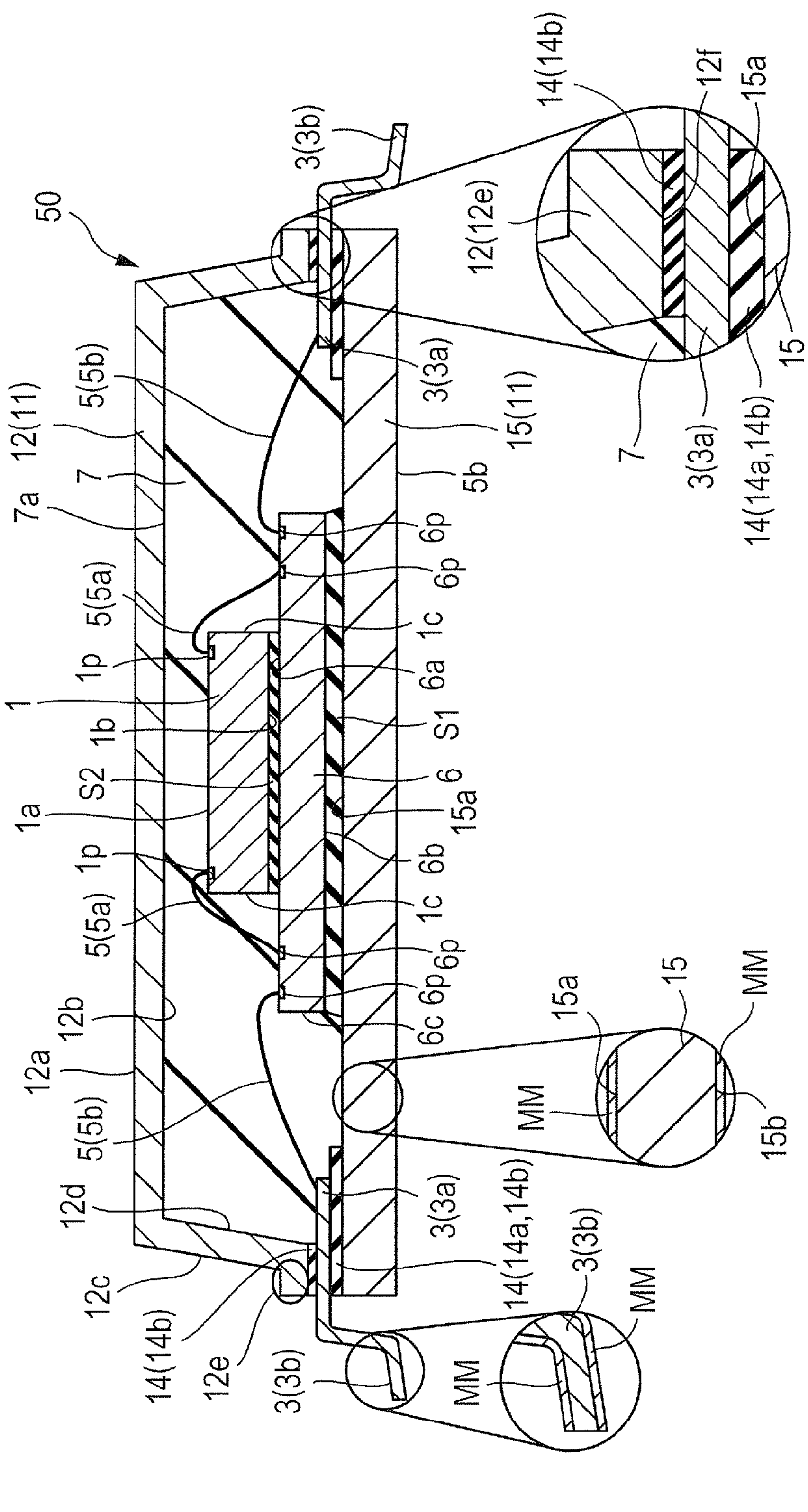
FIG. 35 is a cross-sectional view of a semiconductor device as a modified example of FIG. 4.
Figure 36:
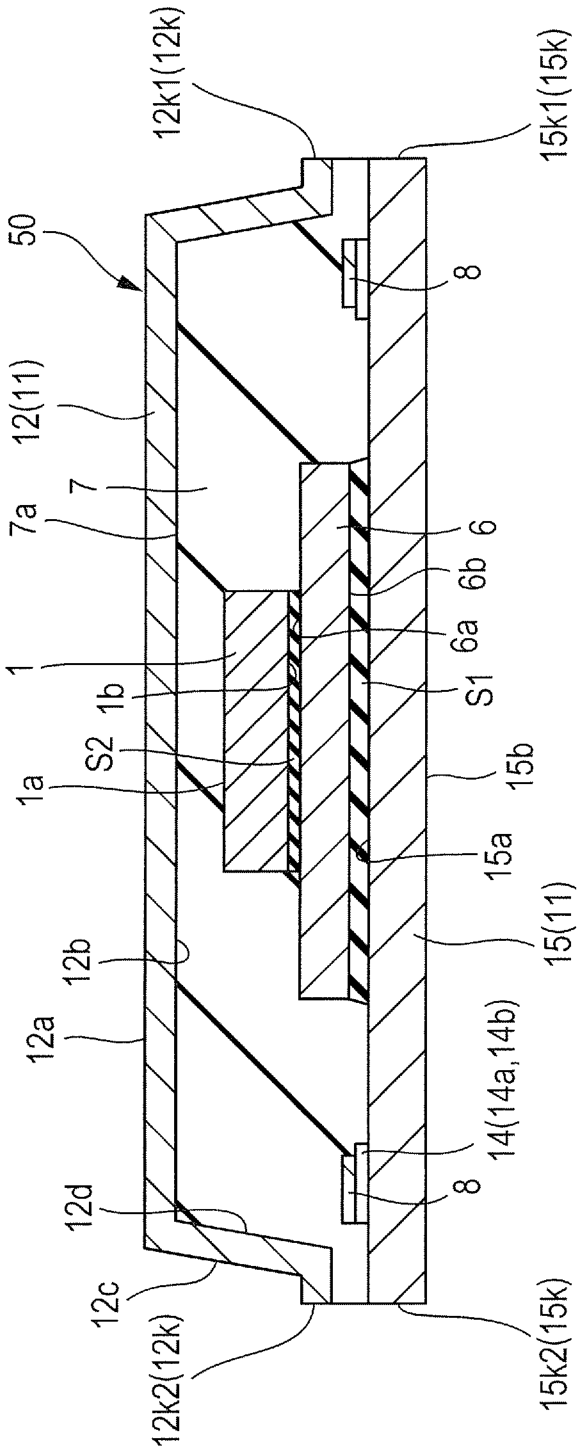
FIG. 36 is a cross-sectional view of a semiconductor device as a modified example of FIG. 5.
Figure 37:
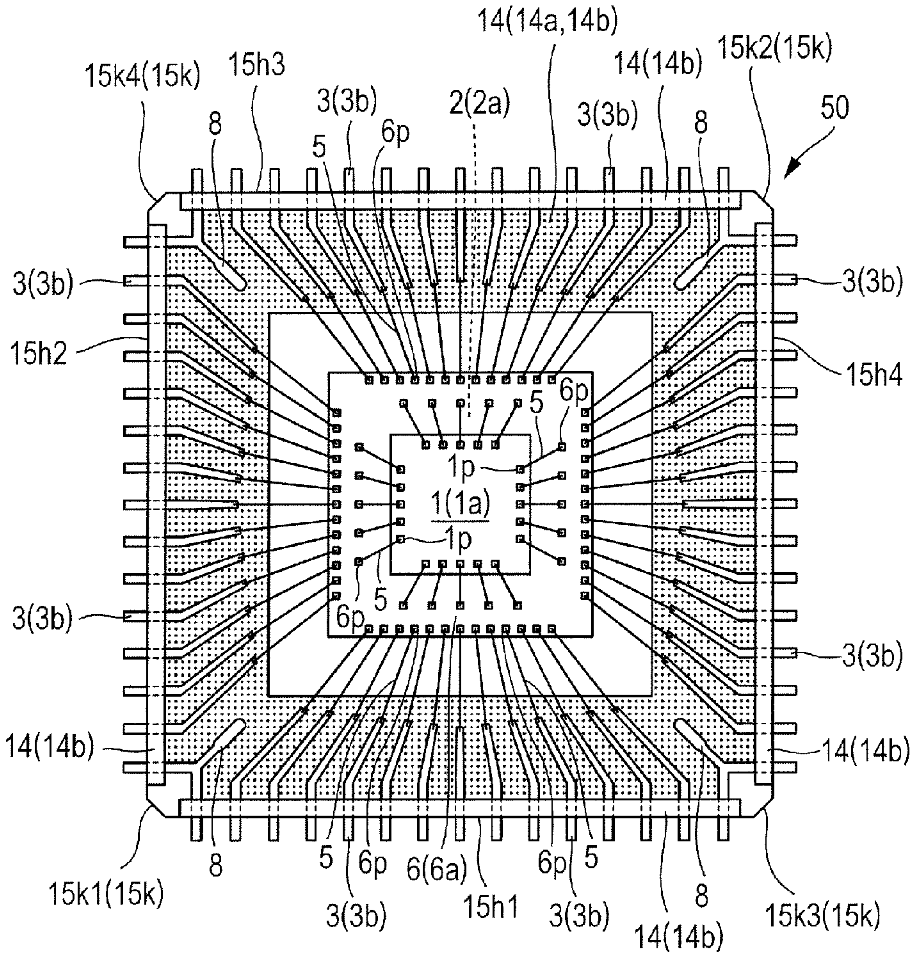
FIG. 37 is a transparent plan view of a semiconductor device as a modified example of FIG. 6.

FIG. 34 is a plan view showing a lower surface side of a semiconductor device as a modified example of FIG. 2. FIG. 35 is a cross-sectional view of a semiconductor device as a modified example of FIG. 4. FIG. 36 is a cross-sectional view of a semiconductor device as a modified example of FIG. 5. FIG. 37 is a transparent plan view of a semiconductor device as a modified example of FIG. 6. The top view of the semiconductor device shown in FIG. 34 is the same as that of FIG. 1 described in the first embodiment, and an illustration thereof will be omitted below.

A semiconductor device 50 shown in FIGS. 34 to 37 differs from the semiconductor device 10 described in the first embodiment in that a lower cap (lid) 15 made of a flat plate is bonded in the position opposed to the upper cap 12. As shown in FIG. 34, the lower cap (lid) 15 arranged on the lower surface (mounting surface) side of the semiconductor device 50 has outer surfaces (lower surface, exposed surface, mounting surface) 15*b*, and has a quadrangle (quadrilateral) in the planar view. The planar size of the lower cap 15 is the same as that of the upper cap 12 (see FIG. 1). The lower cap 15 is bonded and fixed to the upper cap 12 such that the periphery of the upper cap (flange 12*e*) is superimposed over the periphery of the lower cap 15. The lower cap 15 has a metal film (plating film) MM (see FIG. 35) made of, for example, nickel or nickel-palladium, and formed over the front surface of the substrate made of koval, like the lower cap 13 described in the first embodiment. In this way, the metal film MM is formed over the lower surface (mounting surface) 15*b* of the lower cap 15 arranged on the mounting surface side, which improves the wettability (wettability of solder) at the outer surface 15*b* of the lower cap 15. As a result, when mounting the semiconductor device 50 over the mounting substrate (not shown), the outer surface (lower surface) 15*b* of the lower cap 15 is connected to the terminal on the mounting substrate side, which can improve the heat dissipation.

The lower cap 15 includes the following four sides (four main sides) at its periphery. That is, the lower cap 15 has at its periphery, a side (main side) 15*h*1 extending in the direction X, a side (main side) 15*h*2 extending in the direction Y and intersecting (perpendicular to) the side 15*h*1, a side (main side) 15*h*3 opposed to the side 15*h*1, and a side 15*h*4 opposed to the side (main side) 15*h*2. The lower cap 15 has four corners 15*k* positioned in regions where adjacent ones of the sides 15*h*1, 15*h*2, 15*h*3, and 15*h*4 intersect each other. Specifically, the lower cap 15 has the corner 15*k*1 positioned in the region where the side 15*h*1 intersects the side 15*h*2. The lower cap 15 has the corner 15*k*2 positioned in the region where the side 15*h*3 intersects the side 15*h*4. The lower cap 15 has the corner 15*k*3 positioned in the region where the side 15*h*1 intersects the side 15*h*4. The lower cap 15 has the corner 15*k*4 in the region where the side 15*h*2 intersects the side 15*h*3. The definition of the corner 15*k* of the lower cap 15 is the same as that of the above corner 12*k* of the upper cap 12 described above, and thus a repeated description will be omitted.

The upper surface 7*a* of the sealing body 7 is not exposed, and the sealing body 7 is exposed between the corner 12*k* of the upper cap 12 and the corner 15*k* of the lower cap 15. This is the same as the semiconductor device 10 described in the previous embodiment.

As shown in FIG. 35, the lower cap 15 has an even plate (flat plate) shape in the cross-sectional view, without having the recessed portion 12*d* and the flange 12*e* of the upper cap 12. In the semiconductor device 50, the sealing body 7 is covered with the lower cap 15 having the flat plate shape, so that the lower cap 15 can be used as a chip mounting portion for mounting the semiconductor devices 1 and 6. In other words, the semiconductor device 50 differs from the semiconductor device 10 described in the first embodiment in that the die pad 2 shown in FIG. 1 is not arranged and that the semiconductor chip 6 is mounted over the inner surface 15*a* of the lower cap 15. Specifically, the semiconductor chip 6 is mounted over the inner surface 15*a* of the lower cap 15 as the chip mounting portion via the adhesive S1. And, the semiconductor chip 1 is mounted over the front surface 6*a* of the semiconductor chip 6 via the adhesive S2.

The lower cap 15 is used as the chip mounting portion without providing the die pad 2 (see FIG. 4), which can reduce the thickness of the semiconductor device. Alternatively, the lower cap 15 is used as the chip mounting portion, which can increase the thickness of the lower cap 15 (distance from the inner surface 15*a* to the outer surface 15*b*), thus improving the heat dissipation of the lower cap 15. In the example shown in FIGS. 35 and 36, for example, the thickness of the lower cap 15 is thicker (larger) than the thickness of the upper cap 12, that is, the distance from the outer surface 12*a* to the inner surface (lower surface) 12*b*.

When the lower cap 15 is used as the chip mounting portion, in a modified example, the suspension lead 8 cannot be provided. However, as shown in FIG. 32 used for description of the lead formation step of the first embodiment, unless each component within the product formation region 20*a* is supported by the frame portion 20*c* of the lead frame 20 after cutting the outer leads 3*b* of the leads 3, the leads 3 are difficult to form or shape. As shown in FIG. 35, in this embodiment, in order to easily form the leads 3 by bending, the suspension lead 8 is provided. As shown in FIG. 37, the suspension leads 8 are respectively arranged between four corners 15*k* of the lower cap 15 and the four corners of the semiconductor chip 6 in the planar view. Each suspension lead 8 is branched into a plurality of parts between each corner of the semiconductor chip 6 and the lower chap 15. Each exposed end is exposed from the cap 11 at each of the sides 15*h*1, 15*h*2, 15*h*3, and 15*h*4 of the lower cap 15 (see FIG. 35).

<Differences in Manufacturing Method from First Embodiment>

Figure 38:
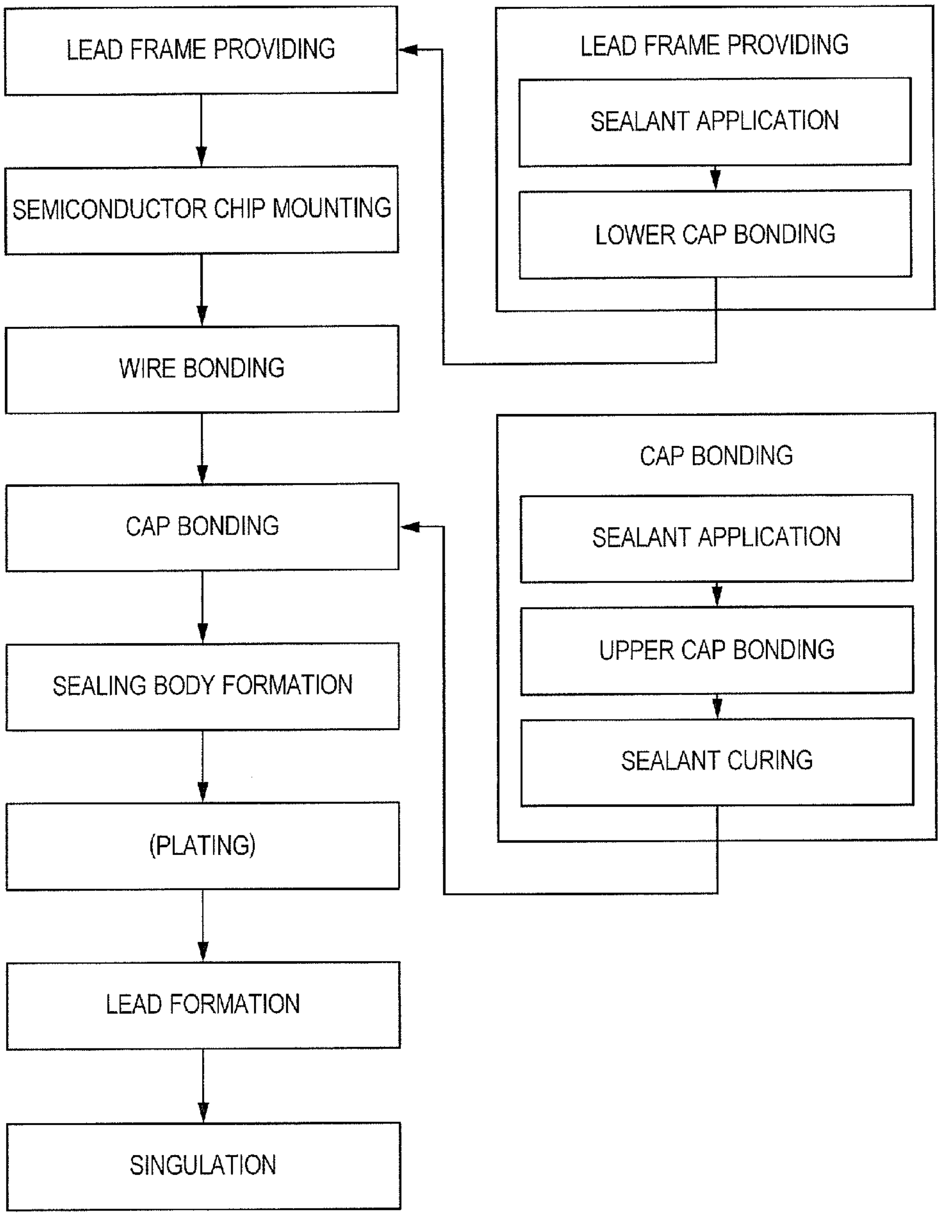
FIG. 38 is an explanatory diagram showing an assembly flowchart of a semiconductor device as a modified example of FIG. 10.

Now, the manufacturing method of the semiconductor device 50 shown in FIGS. 34 to 37 will be described below. Also in this section, the differences in manufacturing method of the semiconductor device from the first embodiment will be mainly described in the following and a description of parts common to these embodiments will be omitted below. FIG. 38 is an explanatory diagram showing an assembly flowchart of a semiconductor device in a modified example of FIG. 10.

The manufacturing method of the semiconductor device of this embodiment differs from that of the first embodiment in the lead frame providing step and the cap bonding step. In detail, this embodiment differs from the first embodiment in that a part of the lower cap 15 (chip mounting region arranged at the center thereof) is used as the chip mounting portion in the semiconductor chip mounting step. In this embodiment, the die pad 2 described in the first embodiment can be replaced by the lower cap 15 in application, except for the fact that the planar area of the inner surface (upper surface) 15*a* is larger than that of the semiconductor chip 6, and thus a description and explanation thereof will be omitted below.

Figure 39:
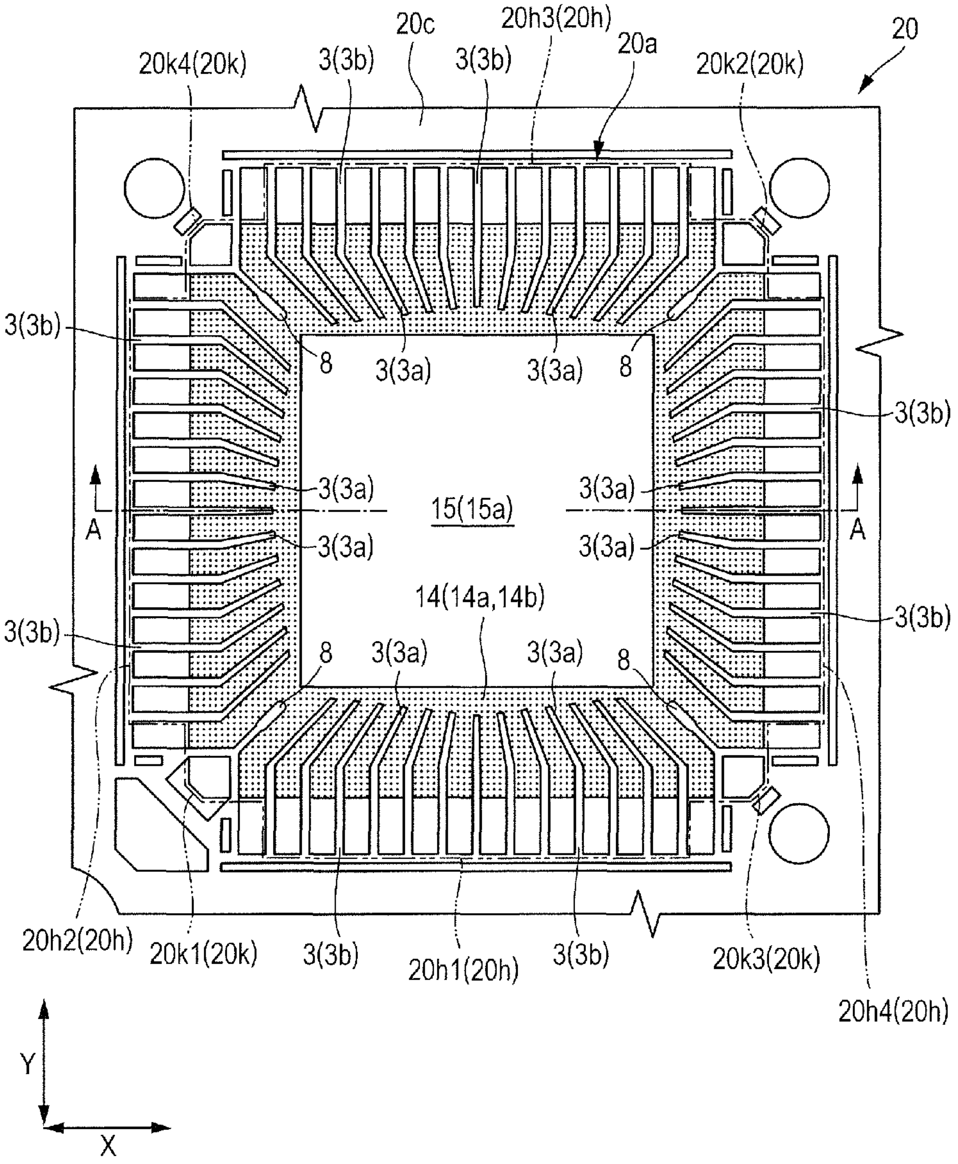
FIG. 39 is an enlarged plan view showing a lead frame as a modified example of FIG. 12.
Figure 40:
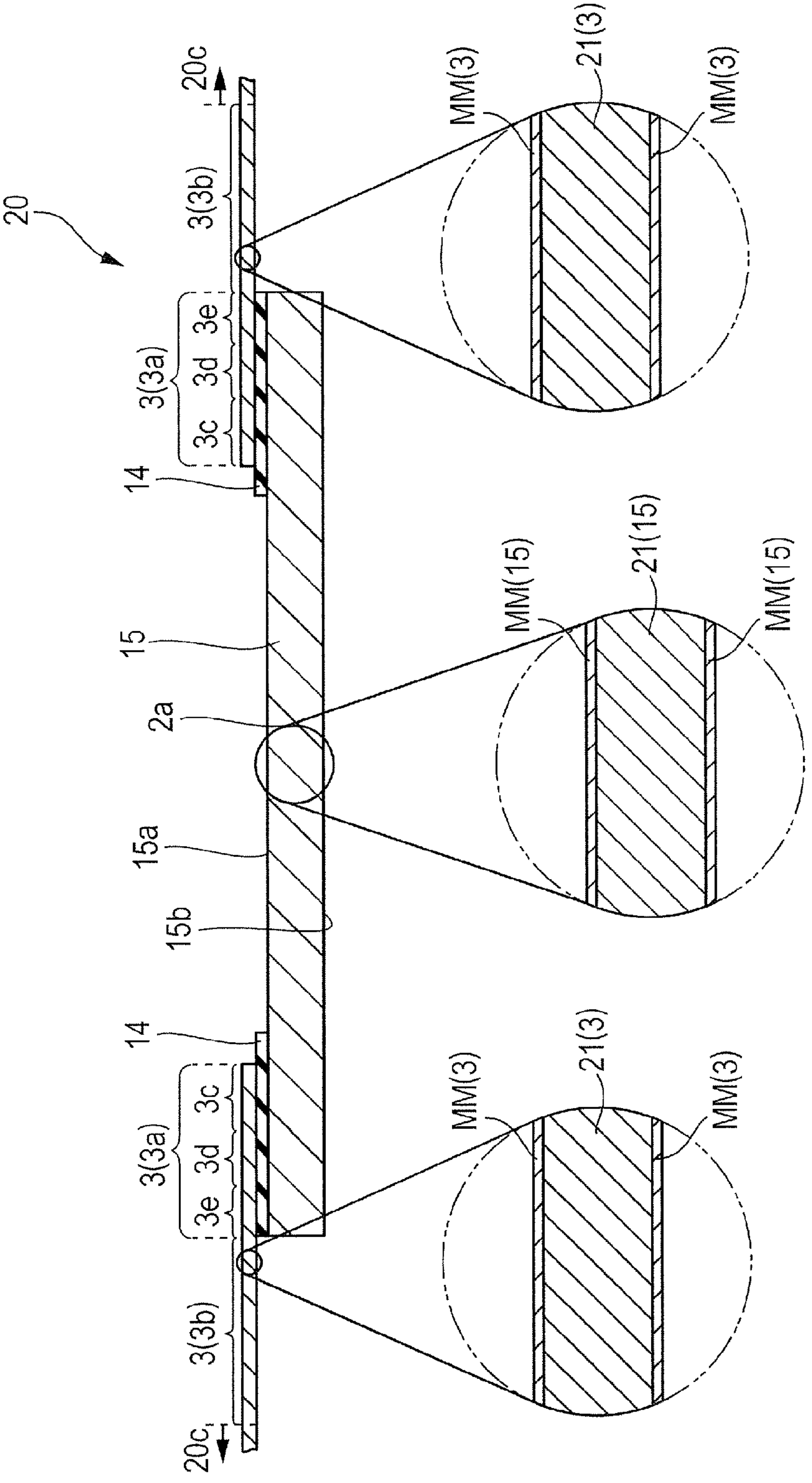
FIG. 40 is an enlarged cross-sectional view showing a lead frame as a modified example of FIG. 13.

In the lead frame providing step, first, the lead frame 20 is provided as shown in FIGS. 39 and 40. FIG. 39 is an enlarged planar view showing a lead frame in a modified example of FIG. 12. FIG. 40 is an enlarged cross-sectional view showing a lead frame in another modified example of FIG. 13.

Since in this embodiment, in the semiconductor chip mounting step (see FIG. 38), the semiconductor chip 6 (see FIG. 35) is mounted over the lower cap 15, it is necessary to bond the lower cap 15 to the lead frame before the semiconductor chip mounting step. Thus, as shown in FIG. 39, the lower cap 15 is positioned at the center of the product formation region 20*a*. The lower cap 15 is formed separately from the lead frame 20, and bonded and fixed to the leads (and suspension leads 8) via the sealant 14. At this time in the present step, it is not necessary to embed the sealant 14 in between the adjacent leads 3. The lower cap can be bonded using any one of the film-like sealant 14*a* or paste-like sealant 14*b* described in the first embodiment. The bonding interface between the sealant 14 and each of the lead 3 and lower cap 15 has the metal film MM formed of nickel or nickel-palladium, which can improve the adhesion to the sealant 14. In this step, as shown in FIG. 39, the lead frame 20 with the leads 3 bonded and fixed to the lower cap 15 is provided.

The leads 3 are arranged around the chip mounting region (region where the semiconductor chip 6 is to be mounted; chip mounting portion) of the lower cap 15. Each lead 3 includes the inner lead 3*a* sealed by the sealing body 7 and the outer lead 3*b* exposed from the sealing body 7 in completion shown in FIG. 35. As shown in FIG. 40, the inner lead 3*a* has the bonding region 3*c*, the seal region 3*d*, and the sealing adhesive region 3*e* arranged from the inner end of the lead 3 in that order. In this embodiment, the lower cap 15 is formed in an open shape, so that the lower cap 15 is located close to the inner lead 3*a* over the entire inner lead 3*a*. In order to prevent the contact between the lead 3 and the lower cap 15, the sealant 14 is arranged between the bonding region 3*c* and the lower cap 15, between the seal region 3*d* and the lower cap 15, and between the sealing adhesive region 3*e* and the lower cap 15.

Like the cap bonding step described in the first embodiment, the sealant 14 is not arranged at the corners 20*k* of the product formation region 20*a*. Thus, in the sealing body formation step, resin can be supplied from each corner 20*k* (specifically, from the opening between the corner 12*k*1 and the corner 15*k*1 as shown in FIG. 36). From other corners 20*k*, gas or excessive resin can be discharged. Like the first embodiment, the position where the sealing body is exposed from the cap 11 can be set at the corner of the cap 11 (specifically, between the corner 12*k* and the corner 15*k* shown in FIG. 36). In other words, the entire upper surface 7*a* of the sealing body 7 can be covered by the sealing body 7.

Figure 41:
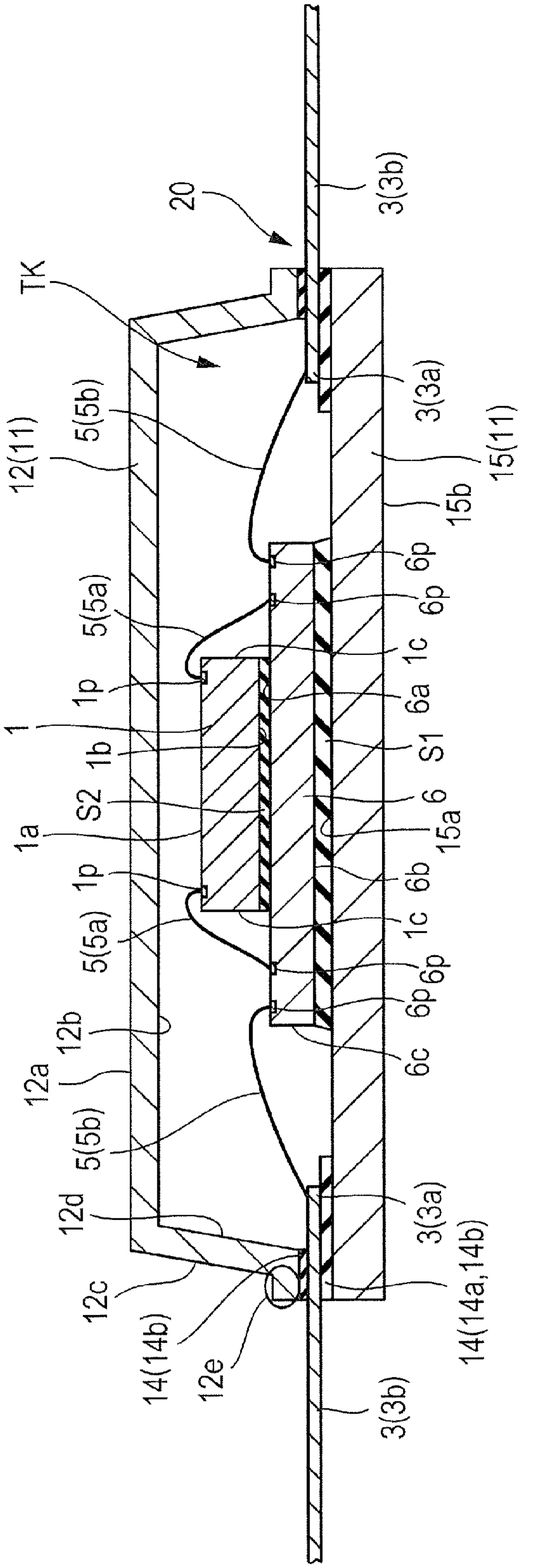
FIG. 41 is an enlarged cross-sectional view showing a modified example of FIG. 27.

Then, in the cap bonding step shown in FIG. 38, the lower cap 15 is already bonded. By bonding and fixing the upper cap 12, as shown in FIG. 41, the upper cap 12 and the lower cap 15 are bonded and fixed together with the recessed portion 12*d* of the upper cap 12 opposed to the inner surface 15*a* of the lower cap 15, thereby forming the space TK. In this step, the upper cap and the lower cap are bonded together such that the periphery of the upper cap 12 is superimposed over the periphery of the lower cap 15. FIG. 41 is an enlarged cross-sectional view of a modified example of FIG. 27. In this step, the upper cap (lid) 12 including the recessed portion 12*d* and the flange (protruding portion) 12*e* arranged around the recessed portion 12*d* is provided. And, the upper cap 12 is positioned such that the periphery of the lower cap 15 is superimposed over the periphery of the upper cap 12, and then bonded to the leads 3 via the sealant 14*b*. In the cap bonding step of this embodiment, the upper cap 12 is mounted. Thus, the sealant 14 is preferably embedded in the adjacent leads 3. The paste-like sealant 14*b* described in this embodiment is preferably used.

Although not shown, in this embodiment, the lower cap 15 is made of a flat plate, and thus the lower cap 15 is more likely to adhere to the molding die 40 (see FIG. 31) in the sealing body formation step, as compared to the lower cap 13 described in the first embodiment. For example, even if a resin film 45 (see FIG. 31) does not intervene in between the lower cap 15 and the molding die 40, this structure can prevent the leakage of the resin 7*p* (see FIG. 31). That is, the amount of use of expendable materials can be reduced in the manufacturing steps.

The semiconductor device and manufacturing method thereof in this embodiment is the same as the manufacturing method of the semiconductor device described in the first embodiment except for the above-mentioned differences. Thus, the repeated description thereof will be omitted below, and except for the above differences, the aspects of the first embodiment in the invention can be applied in this embodiment.

Third Embodiment

As a modified example of the semiconductor device 10 described in the first embodiment, a third embodiment will be described below in which after forming a sealing body, a cap is set so as to cover the sealing body. Also in this embodiment, the differences in manufacturing method and structure of the semiconductor device from those of the first embodiment will be mainly described in the following, and a description of the parts common to these embodiments will be omitted below. As to drawings, the drawings required to explain differences from the first embodiment will be shown, and if necessary, the drawings used for description in the first embodiment are cited for explanation.

<Differences from First Embodiment>

Figure 42:
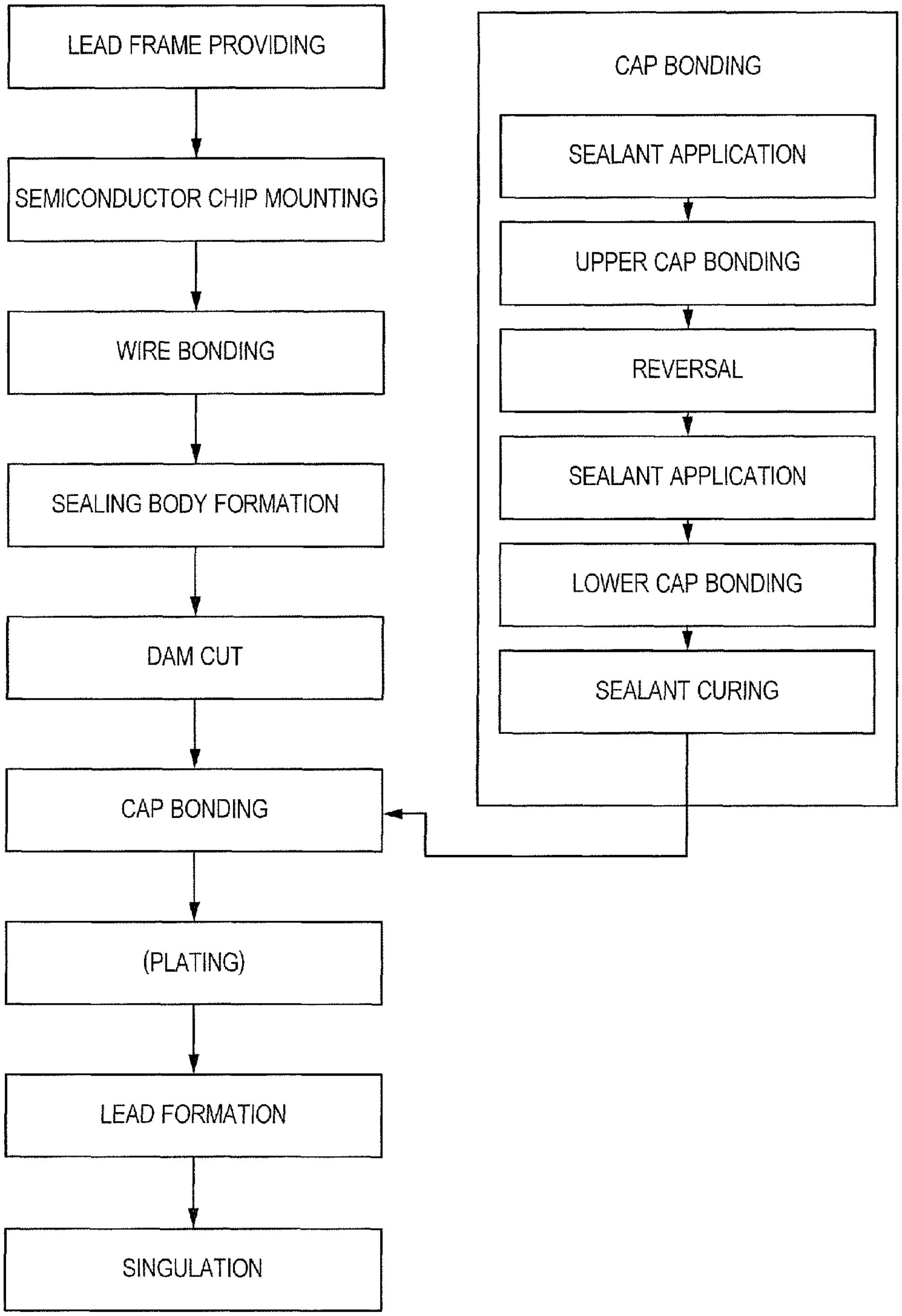
FIG. 42 is an explanatory diagram showing an assembly flowchart of a semiconductor as another modified example of FIG. 10.
Figure 43:
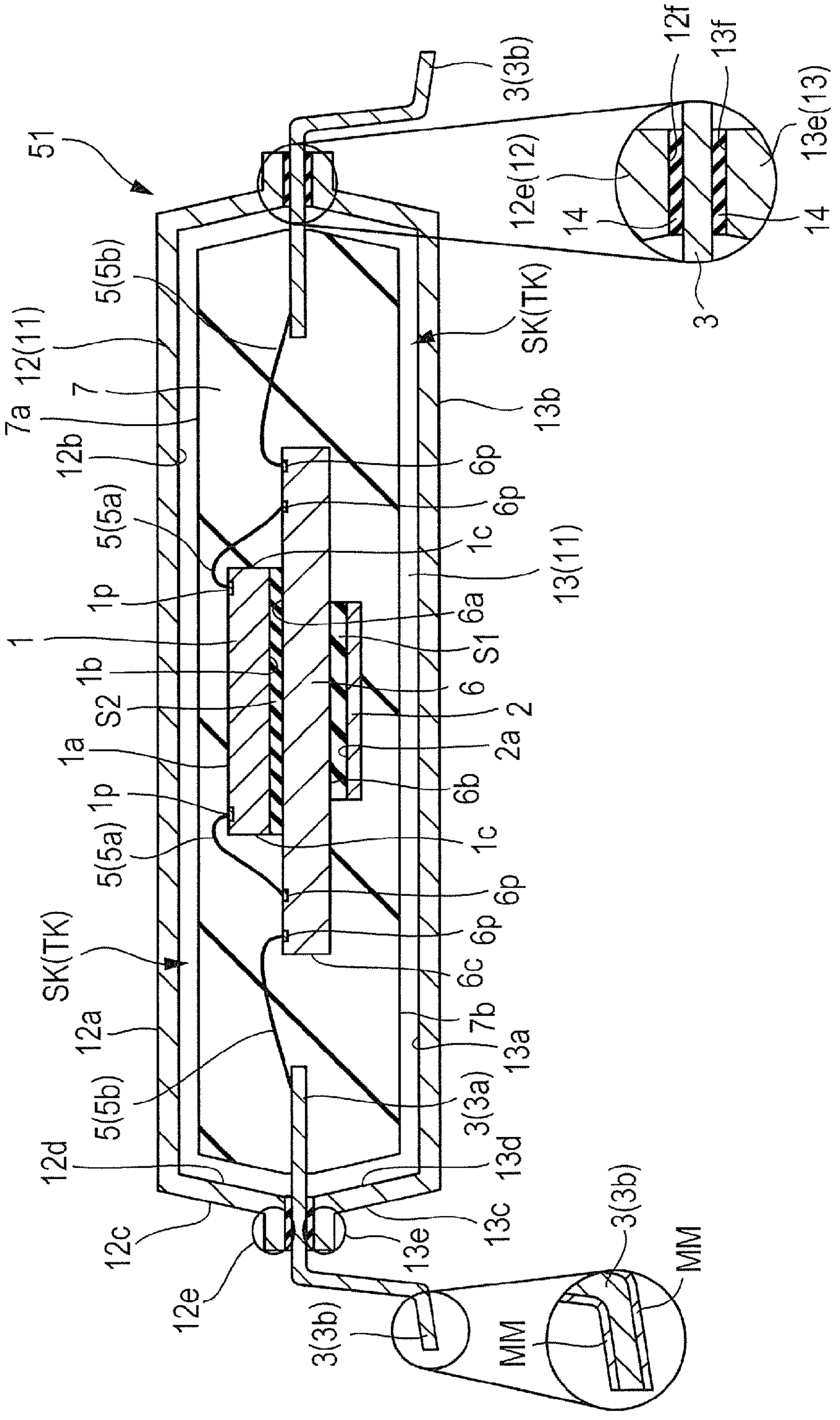
FIG. 43 is a cross-sectional view of a semiconductor device as another modified example of FIG. 4.
Figure 44:
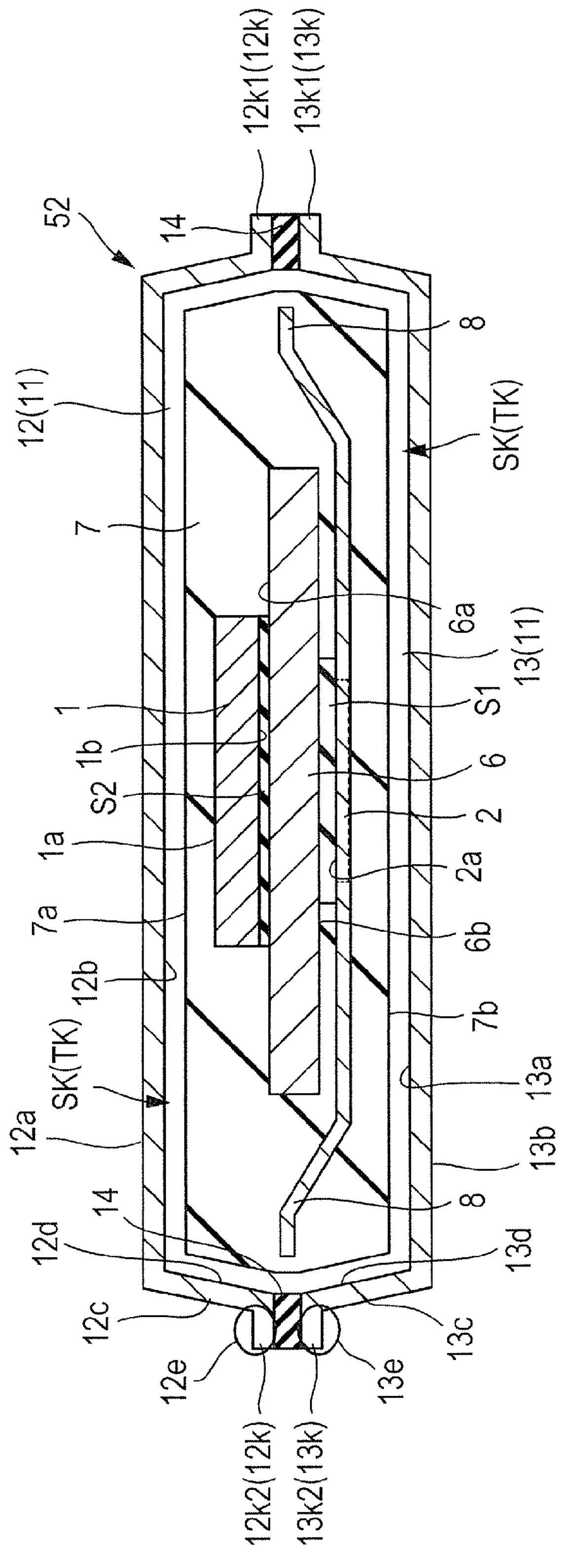
FIG. 44 is a cross-sectional view of a semiconductor device as another modified example of FIG. 5.
Figure 45:
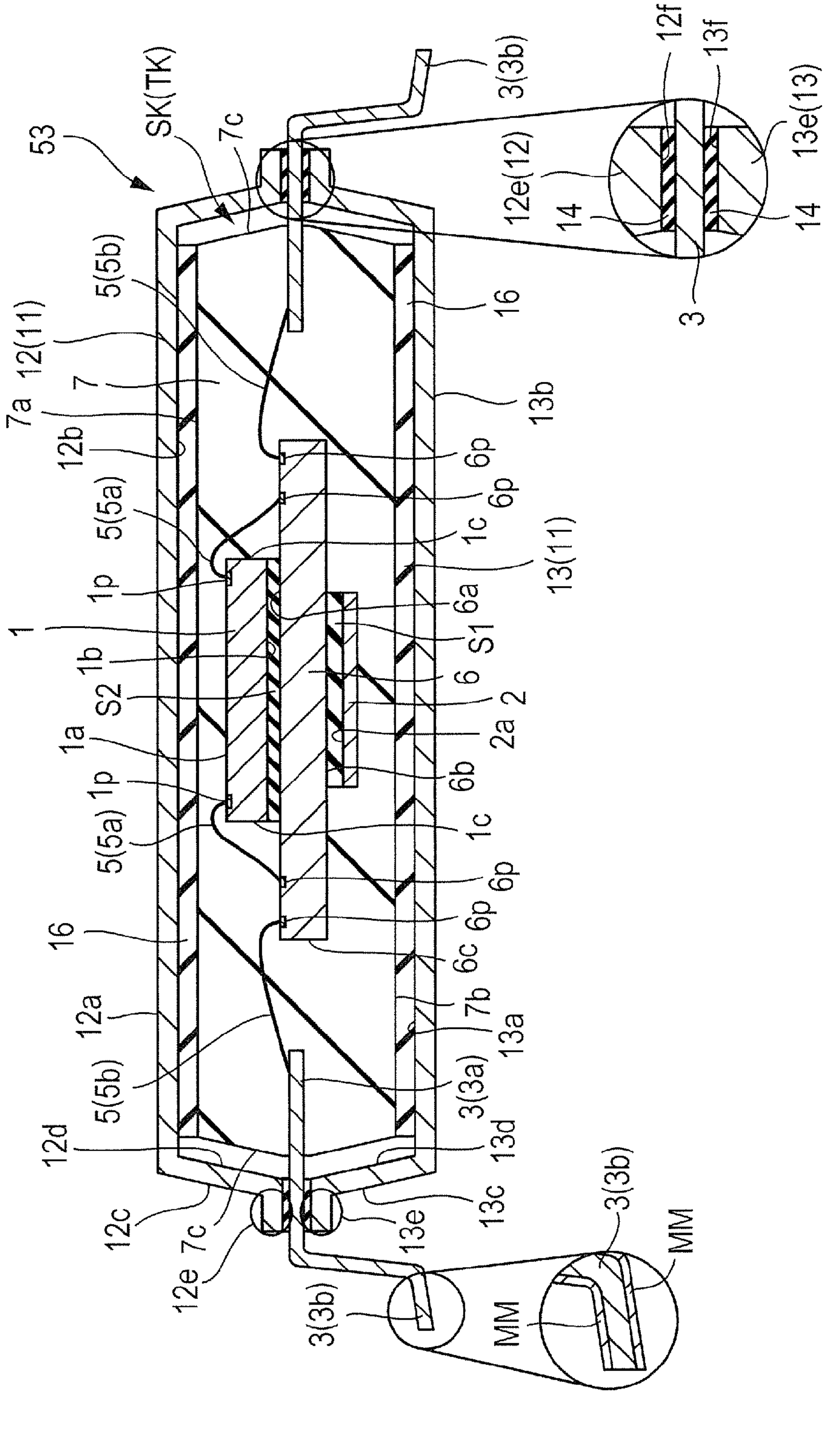
FIG. 45 is a cross-sectional view of a semiconductor device as a modified example of FIG. 43.

First, the manufacturing method of the semiconductor device in this embodiment will be described below. FIG. 42 is an explanatory diagram showing an assembly flowchart of a semiconductor device as a modified example of FIG. 10. FIG. 43 is a cross-sectional view of a semiconductor device as another modified example of FIG. 4, and FIG. 44 is a cross-sectional view of a semiconductor device as another modified example of FIG. 5. FIG. 45 is a cross-sectional view of a semiconductor device as a modified example of FIG. 43.

As shown in FIG. 42, a manufacturing method of a semiconductor device 52 of this embodiment differs from the manufacturing method of the semiconductor device 10 described in the first embodiment in that a cap bonding step is performed after the sealing body formation step.

As shown in FIGS. 43 and 44, the upper cap 12 is superimposed over the lower cap 13 to form the space TK for accommodating therein the sealing body 7. The sealant 14 is positioned at the bonding portion arranged at the peripheries of the upper cap 12 and the lower cap 13 (between the flanges 12*e* and 13*e*) to bring (seal) the space with the sealing body 7 accommodated therein into the airtight state.

When the sealing body 7 (see FIG. 43) is previously formed, like this embodiment, an opening for supplying resin for sealing is not required in the sealing body formation step. That is, the sealant 14 can be arranged between the corner 12*k* of the upper cap 12 and the corner 13*k* of the lower cap 13. In other words, the bonding surface between the upper cap 12 and the lower cap can be sealed over its periphery. As a result, the sealing body 7 is not exposed directly to the external environment, which can suppress the increase in temperature of the sealing body 7.

The upper cap 12 and the lower cap 13 is bonded and fixed together with the sealing body 7 formed, which makes it difficult to establish adhesion between the upper surface 7*a* of the sealing body 7 and the inner surface (lower surface) 12*b* of the upper cap 12, and between the lower surface 7*b* of the sealing body 7 and the inner surface (lower surface) 13*a* of the lower cap 13. In other words, as shown in FIG. 43, a gap SK is likely to be formed between the cap 11 and the sealing body 7.

Under the presence of the gap SK, the heat transfer rate from the sealing body 7 to the cap 11 is decreased as compared to the case of adhesion of the cap 11 to the upper surface 7*a* of the sealing body 7, as described in the first and second embodiments. The heat from the cap 11 radiates not only in the outward direction of the semiconductor device 51, but also in the inward direction (direction toward the inside of the sealing body 7) of the semiconductor device 51, so that the radiated heat tends to be stored in the space TK inside the cap 11. As a result, the temperature of the upper surface 7*a* of the sealing body 7 becomes higher than that of the semiconductor device 10 depending on the environmental temperature or radiation conditions.

In order to suppress the increase in temperature of the sealing body 7, like the semiconductor device 53 shown in FIG. 45, the upper surface 7a of the sealing body 7 is preferably connected to the inner surface 12b of the upper cap 12 via the adhesive 16. The adhesive 16 is a paste-like resin adhesive made of, for example, thermosetting epoxy resin containing a plurality of (a number of) metal particles. The adhesive 16 is a heat conductive adhesive having a higher heat conductivity rate than that of an adhesive made of only resin.

The adhesive 16 intervenes in between the upper surface 7a of the sealing body 7 near the wire 5 and the inner surface 12b of the upper cap 12, so that the upper surface 7a of the sealing body 7 adheres to the inner surface 12b of the upper cap 12, which can decrease the temperature of the upper surface 7a. The adhesive 16 is more preferably arranged to cover the entire upper surface 7a. As shown in FIG. 45, preferably, the adhesive 16 is more preferably arranged between the lower surface 7b of the sealing body 7 and the inner surface 13a of the lower cap 13. Although the lower surface 7b of the sealing body 7 is far away from the wire 5 as compared to the upper surface 7a, the adhesive 16 is also arranged on the lower surface 7b side, which can decrease the temperature of the entire sealing body 7.

Further, from the viewpoint of reducing the gap SK, the adhesive 16 is preferably provided at the sides 7c of the sealing body 7. However, since the adhesive 16 contains metal particles as mentioned above, the adhesive 16 should not be preferably arranged on the sides 7c of the sealing body 7 in order to prevent the contact between the lead 3 and the metal particle.

Figure 46:
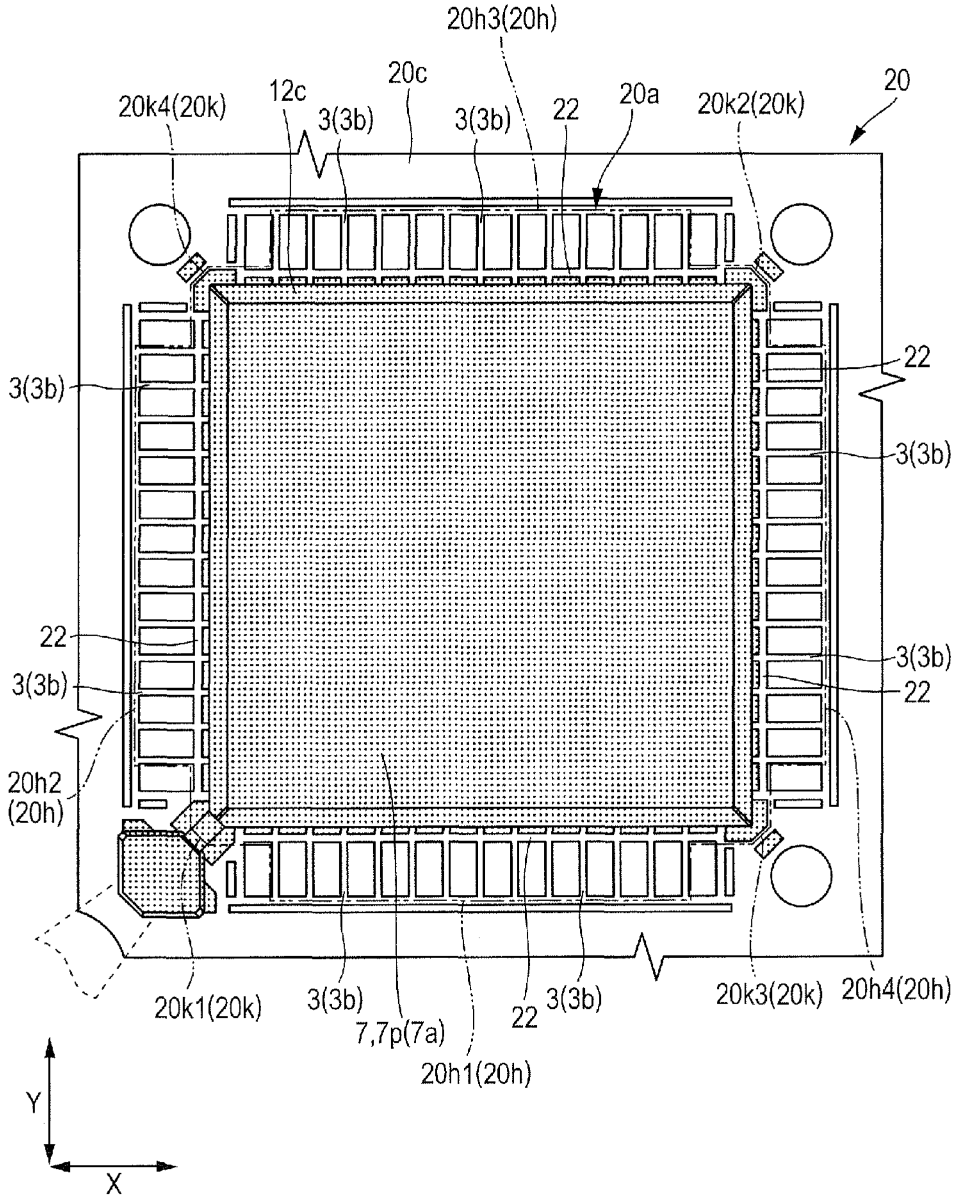
FIG. 46 is an enlarged plan view showing the state in which a sealant is formed at the lead frame shown in FIG. 18 in a sealing body formation step shown in FIG. 42.

Since in this embodiment the sealing body 7 is previously formed, as shown in FIG. 46, a dam bar (dam portion) 22 needs to be provided in the lead frame 20 to prevent the leakage of the resin 7p. FIG. 46 is an enlarged plan view showing the formation of the sealing body 7 in the lead frame shown in FIG. 18 in the seal formation step shown in FIG. 42. The dam bar (dam portion) 22 shown in FIG. 46 is integrally formed with the leads 3 so as to connect the adjacent leads 3, and arranged to surround the sealing body 7. In the sealing body formation step shown in FIG. 42, the dam bar 22 stops the leakage of the resin 7p. Since the sealing body 7 needs to be stored in the cap 11, the dam bar 22 needs to be provided on the inner side of the sealing adhesive region 3e (see FIG. 13) (on the bonding region 3c side shown in FIG. 13).

The dam bar 22 is a metal member for connecting the leads 3. In order to separate the adjacent leads 3, the dam bar 22 needs to be cut before the cap bonding step (see FIG. 42). That is, as shown in FIG. 42, the dam cut step needs to be performed after the sealing body formation step and before the cap bonding step. In the dam cut step, each dam bar 22 arranged between the adjacent leads 3 is cut. The way to cut the dam bar is not specifically limited, but the dam bar can be cut by pressing with a punch and a die (not shown). In the manufacturing methods of the semiconductor devices 10 and 50 described in the first and second embodiments, the sealant 14 is used as the dam portion, and thus the dam cut step can be omitted, which is preferable.

The semiconductor device and manufacturing method thereof of this embodiment are the same as those of the first embodiment except for the above differences. Thus, a repeated description thereof will be omitted, and except for the above differences, the aspects of the invention described in the first embodiment can be applied to this embodiment.

This embodiment has been described as a modified example of the semiconductor 10 and the manufacturing method thereof described in the first embodiment, and can also be combined with the modified example described in the second embodiment in application.

<Other Modified Examples>

The invention made by the inventors has been specifically described based on the embodiments, but the invention is not limited to the disclosed embodiments. It is apparent that various modifications and changes can be made without departing from the scope of the invention.

For example, the first to third embodiments have described the two semiconductor chips 1 and 6 mounted in one package (semiconductor device). However, the number of the semiconductor chips is not limited to two, and the invention can be applied to a semiconductor device with one semiconductor chip or a semiconductor device with three or more semiconductor chips. For example, in the semiconductor device 10 with the semiconductor chips 1 and 6 laminated thereover as shown in FIG. 4, the wire 5 gets close to the upper surface 7a of the sealing body 7. When cracks are caused at the upper surface 7a of the sealing body 7, the cracks are likely to reach the wires 5. However, the application of the technique described in the above embodiments can effectively improve the reliability of the semiconductor device.

Figure 47:
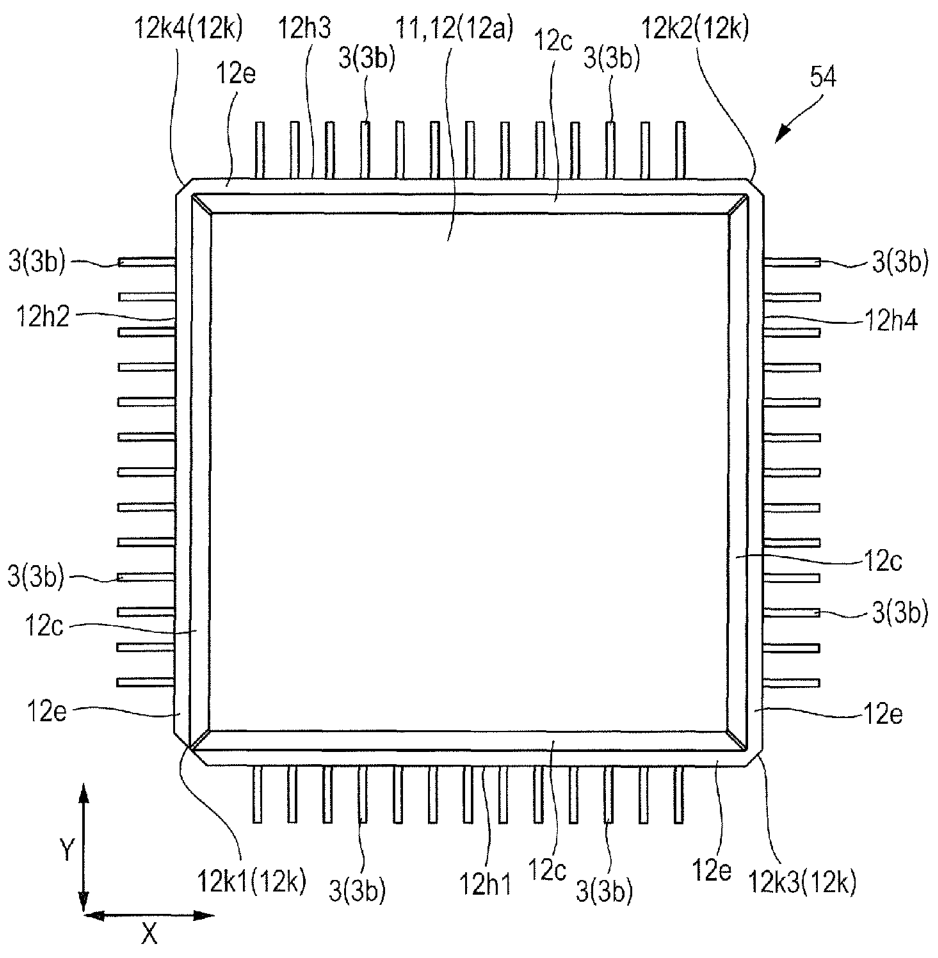
FIG. 47 is a plan view showing a modified example of FIG. 1.
Figure 48:
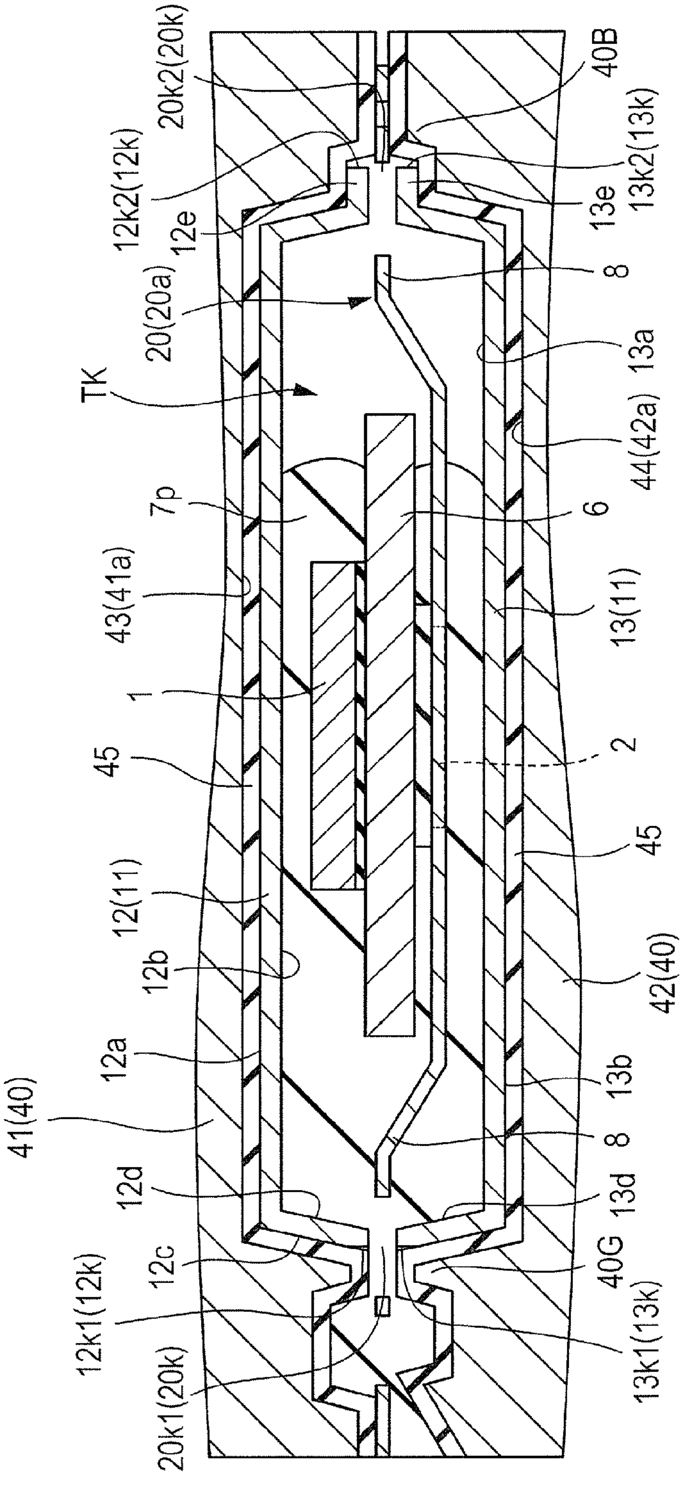
FIG. 48 is an enlarged cross-sectional view showing a modified example of FIG. 31.

For example, in the description of the above first to third embodiments, the flanges 12e and 13e are provided not only at parts along the respective sides of the upper cap 12 and the lower cap 13, but also at the corners 12k and 13k. However, in a semiconductor device 54 shown as the modified example in FIG. 47, the flange 12e is not provided at the corner used as the supply port for resin in the sealing body formation step (at the corner 12k1 shown in FIG. 47). FIG. 47 shows a plan view of a modified example of FIG. 1, and FIG. 48 shows an enlarged cross-sectional view of a modified example of FIG. 31. As shown in FIG. 48, the flanges 12e and 13e are not provided at the corners 20k1, 12k1, 13k1 where the gate 40G of the molding die 40 is arranged, which facilitates supply of the resin 7p. At other corners 20k, 12k, and 13k where the vent 40B is arranged, the flanges 12e and 13e are provided to increase the static pressure, which can reduce the amount of leakage of the resin 7p. Provision of the flanges 12e and 13e can increase the area of the bonding surface of the sealant 14, thereby improving the bonding strength between the upper cap 12 and the lower cap 13.

For example, the above modified examples can be applied in combination with the technique described in the second embodiment and/or third embodiment.

The present invention can be applied to resin sealed semiconductor devices.

What is claimed is:

1. A manufacturing method of a semiconductor device, comprising the steps of:

(a) providing a lead frame having a chip mounting portion and a plurality of leads arranged around the chip mounting portion;

(b) after the step (a), mounting a semiconductor chip over the chip mounting portion, said semiconductor chip having a front surface, a plurality of electrodes formed over the front surface, and a back surface opposite to the front surface;

(c) after the step (b), electrically connecting the leads with the electrodes of the semiconductor chip via a plurality of wires;

(d) after the step (c), arranging a lid so as to cover the semiconductor chip and the wires, and bonding the lid to the leads by a sealant; and (e) after the step (d), supplying resin into a space inside the lid with the semiconductor chip arranged therein, thereby sealing the wires and the semiconductor chip with the resin, wherein a shape in a plan view of the lid is comprised of a quadrangle having a first corner, wherein in the step (d), a gap between adjacent ones of the leads is filled with a part of the sealant, and wherein in the step (e), the resin is supplied into the space from the first corner not filled with the sealant.

2. The manufacturing method of a semiconductor device according to claim 1, wherein the lid is made of metal, and wherein in the step (d), the lid and the leads are bonded together via the sealant made of insulating material such that the lid is not brought into contact with the leads.

3. The manufacturing method of a semiconductor device according to claim 1, wherein the step (d) comprises the steps of:

(d1) providing a first lid portion including a first recessed portion and a first protrusion provided around the first recessed portion, arranging the first lid portion to cover the semiconductor chip and the wires, and then bonding the first lid portion to the leads via a first sealant; and (d2) providing a second lid portion including a second recessed portion and a second protrusion provided around the second recessed portion, arranging the second lid portion to cause the first recessed portion to be opposed to the second recessed portion, and then bonding the second lid portion to the leads via a second sealant.

4. The manufacturing method of a semiconductor device according to claim 3, wherein in the step (d2), the sealant is embedded in between adjacent ones of the leads.

5. The manufacturing method of a semiconductor device according to claim 1, wherein in the step (e), gas inside the lid is exhausted from a second corner other than the first corner of the lid.

6. The manufacturing method of a semiconductor device according to claim 1, wherein a first suspension lead is connected to the chip mounting portion of the lead frame provided in the step (a), and wherein the first suspension lead is branched into a plurality of parts between the first corner and the chip mounting portion so as to avoid the first corner.

7. The manufacturing method of a semiconductor device according to claim 1, wherein in the step (e), the resin is supplied such that the resin adheres to an inner surface of the lid.

8. The manufacturing method of a semiconductor device according to claim 1, wherein in the step (e), the resin is supplied with the lid accommodated in a cavity of a molding die, and a resin film which is softer than the molding die and the lid intervenes in between the molding die and the lid.

9. The manufacturing method of a semiconductor device according to claim 1, wherein in the step (e), the lead frame is positioned in a decompression chamber, and the resin is supplied into the lid.

10. The manufacturing method of a semiconductor device according to claim 1, wherein in the step (e), after filling an inside of the lid with the resin, a pressure higher than a pressure at which the resin is supplied is applied to the inside of the lid.

11. The manufacturing method of a semiconductor device according to claim 1, wherein in the step (e), the adjacent ones of the leads are connected together via the sealant made of the insulating material.

12. The manufacturing method of a semiconductor device according to claim 1, wherein a first lid portion formed of a flat plate in a quadrangular shape in a planar view with the chip mounting portion is previously bonded to the lead frame provided in the step (a), wherein the leads are bonded around the chip mounting portion via a first sealant, and wherein in the step (d), a second lid portion including a recessed portion and a protrusion provided around the recessed portion is provided, and the second lid portion is arranged such that a periphery of the first lid portion is superimposed over a periphery of the second lid portion, thereby bonding the second lid portion to the leads via a second sealant.

* * * * *